US007932588B2

(12) United States Patent
Uno et al.

(10) Patent No.: US 7,932,588 B2
(45) Date of Patent: *Apr. 26, 2011

(54) SEMICONDUCTOR DEVICE INCLUDING A DC-DC CONVERTER HAVING A METAL PLATE

(75) Inventors: Tomoaki Uno, Tokyo (JP); Nobuyoshi Matsuura, Tokyo (JP); Yukihiro Sato, Tokyo (JP); Keiichi Okawa, Tokyo (JP); Tetsuya Kawashima, Hitachinaka (JP); Kisho Ashida, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/695,657

(22) Filed: Jan. 28, 2010

(65) Prior Publication Data

US 2010/0127683 A1 May 27, 2010

Related U.S. Application Data

(63) Continuation of application No. 11/626,564, filed on Jan. 24, 2007, now Pat. No. 7,679,173.

(30) Foreign Application Priority Data

Mar. 28, 2006 (JP) .................................. 2006-087961

(51) Int. Cl.
*H01L 23/02* (2006.01)
*H01L 31/111* (2006.01)

(52) U.S. Cl. ......... 257/678; 257/E23.044; 257/E23.052; 257/E23.079; 257/E25.031; 257/E23.085; 257/784; 257/686; 257/723; 257/685; 257/777; 257/177

(58) Field of Classification Search .................. 257/678, 257/E23.034, E23.044, E23.052, E23.079, 257/784, E25.031, E23.085, 686, 723, 685, 777, 177

See application file for complete search history.

(56) References Cited

U.S. PATENT DOCUMENTS

| 6,316,922 | B1 | 11/2001 | Sugahara et al. | |
|---|---|---|---|---|
| 6,700,793 | B2 | 3/2004 | Takagawa et al. | |
| 7,295,453 | B2* | 11/2007 | Shiraishi et al. | 363/144 |
| 7,679,173 | B2* | 3/2010 | Uno et al. | 257/678 |
| 2005/0128706 | A1* | 6/2005 | Maly et al. | 361/699 |
| 2007/0257708 | A1* | 11/2007 | Shimokawa et al. | 327/5 |
| 2007/0278516 | A1 | 12/2007 | Hashimoto et al. | |
| 2008/0268577 | A1* | 10/2008 | Kagii et al. | 438/124 |
| 2009/0039394 | A1* | 2/2009 | Uno et al. | 257/213 |
| 2010/0127683 | A1* | 5/2010 | Uno et al. | 323/282 |

FOREIGN PATENT DOCUMENTS

JP 2001-25239 1/2001
JP 2002-217416 8/2002

* cited by examiner

*Primary Examiner* — Alexander O Williams
(74) *Attorney, Agent, or Firm* — Mattingly & Malur, P.C.

(57) ABSTRACT

The electrical characteristics of a semiconductor device are enhanced. In the package of the semiconductor device, there are encapsulated first and second semiconductor chips with a power MOS-FET formed therein and a third semiconductor chip with a control circuit for controlling their operation formed therein. The bonding pads for source electrode of the first semiconductor chip on the high side are electrically connected to a die pad through a metal plate. The bonding pad for source electrode of the second semiconductor chip on the low side is electrically connected to lead wiring through a metal plate. The metal plate includes a first portion in contact with the bonding pad of the second semiconductor chip, a second portion extended from a short side of the first portion to the lead wiring, and a third portion extended from a long side of the first portion to the lead wiring.

8 Claims, 70 Drawing Sheets

US 7,932,588 B2

SEMICONDUCTOR DEVICE INCLUDING A DC-DC CONVERTER HAVING A METAL PLATE

This is a continuation application of U.S. Ser. No. 11/626,564, filed Jan. 24, 2007, now U.S. Pat. No. 7,679,173, the contents of which are hereby incorporated by reference into this application.

CROSS-REFERENCE TO RELATED APPLICATION

The present application claims priority from Japanese patent application No. 2006-87961 filed on Mar. 28, 2006, the content of which is hereby incorporated by reference into this application.

BACKGROUND OF THE INVENTION

The present invention relates to a semiconductor device and a manufacturing method of the semiconductor device and in particular to a technique effectively applicable to a semiconductor device including a power supply circuit.

In recent years, the frequencies of power MOS-FETs (Metal Oxide Semiconductor Field Effect Transistors) used in power supply circuits have been more and more increased to accomplish the miniaturization and high-speed response of power supply circuits and the like.

With respect to CPUs and DSPs of desktop and notebook personal computers, servers, game machines, and the like, especially, there is a trend toward increase in current and frequency. To cope with this, technological development has been promoted with respect to power MOS-FETs, which construct non-isolated DC-DC converters for controlling power supplies to CPUs (Central Processing Units) and DSPs (Digital Signal Processors), so that they can accommodate large currents and high frequencies.

A typical DC-DC converter in widespread use as an example of power supply circuits is so constructed that a power MOS-FET for high-side switch and a power MOS-FET for low-side switch are connected in series. The power MOS-FET for high-side switch has a switch function for controlling the DC-DC converter and the power MOS-FET for low-side switch has a switch function for synchronous rectification. These two power MOS-FETs are alternately turned on/off in synchronization, and thereby convert power supply voltage.

For example, Japanese Unexamined Patent Publication No. 2002-217416 discloses a technique in which a power MOS-FET for high-side switch and a power MOS-FET for low-side switch are housed in one and the same package, and the efficiency of voltage conversion between the power MOS-FET for high side and the power MOS-FET for low side is thereby enhanced.

Further, for example, Japanese Unexamined Patent Publication No. 2001-25239 discloses a technique for reducing noise that poses problems in a DC-DC converter constructed of a control circuit, a driver circuit, and a power MOS-FET packaged in one chip, by a resistor and a capacitor.

SUMMARY OF THE INVENTION

The present inventors investigated the configuration of the above DC-DC converter. The following is a description of the configuration that is not publicly known but was investigated by the present inventors. The outline of the configuration is as follows:

In the technique investigated by the present inventors, members that construct a DC-DC converter are sealed in one and the same package. That is, a semiconductor chip in which a power MOS-FET for high-side switch, a semiconductor chip in which a power MOS-FET for low-side switch, and a semiconductor chip in which a control circuit for controlling the operation of these power MOS-FETs are sealed in one and the same package.

The source electrode of the semiconductor chip in which the power MOS-FET for high-side switch is formed and a die pad connected to the drain electrode of the semiconductor chip in which the power MOS-FET for low-side switch is formed are electrically connected with each other through multiple bonding wires. The source electrode of the semiconductor chip in which the power MOS-FET for low-side switch is formed and a lead for GND power supply and electrically connected with each other through multiple bonding wires.

However, the present inventors found a problem in the semiconductor device having the above-mentioned configuration. Since the semiconductor device uses multiple bonding wires for connection, as mentioned above, conduction loss associated with package resistance and the spreading resistance of metal (aluminum) that forms the source electrode is increased.

Consequently, an object of the invention is to provide a technology that makes it possible to enhance the electrical characteristics of a semiconductor device.

The above and further objects and novel features of the invention will be apparent from the description in this specification and the accompanying drawings.

The following is a brief description of the gist of the representative elements of the invention laid open in this application.

The invention is a semiconductor device in which first, second, and third semiconductor chips are housed in one and the same sealing body. This semiconductor device is so constructed that the source electrode of the first semiconductor chip and the drain electrode of the second semiconductor chip are connected with each other through a first metal plate, and the source electrode of the second semiconductor chip and an external terminal are electrically connected with each other through a second metal plate.

The second metal plate integrally includes: a first portion connected to the source electrode of the second semiconductor chip; a second portion that extends astride one of two sides intersecting with one corner of the second semiconductor chip in-between; and a third portion that is separated from the second portion and extends astride the other of the two sides.

The following is a brief description of the gist of effects brought about by the representative elements of the invention laid open in this application.

The second metal plate integrally includes: the first portion connected to the source electrode of the second semiconductor chip; the second portion that extends astride one of the two sides intersecting with one corner of the second semiconductor chip in-between; and the third portion that is separated from the second portion and extends astride the other of the two sides. Loss in the semiconductor device can be thereby reduced, and thus the electrical characteristics of the semiconductor device can be enhanced.

BRIEF DESCRIPTION OF THE DRAWINGS

FIG. 51 is a side view of a substantial part of the metal plate in FIG. 48 and the like;

DETAILED DESCRIPTION OF THE PREFERRED EMBODIMENTS

In the following description, each embodiment will be divided into multiple sections or embodiments if necessary for the sake of convenience. Unless explicitly stated otherwise, they are not unrelated to one another, and they are in such a relation that one is a modification, details, supplementary explanation, or the like of part or all of the other. When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies, and the number may be above or below that specific number. In the following description of embodiments, needless to add, their constituent elements (including elemental steps and the like)

are not always indispensable unless explicitly stated otherwise or they are obviously indispensable in principle. Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges. In every drawing for explaining embodiments of the invention, members having the same function will be marked with the same numerals or codes, and the repetitive description thereof will be omitted as much as possible. Hereafter, detailed description will be given to embodiments of the invention with reference to the drawings.

First Embodiment

Figure 1:
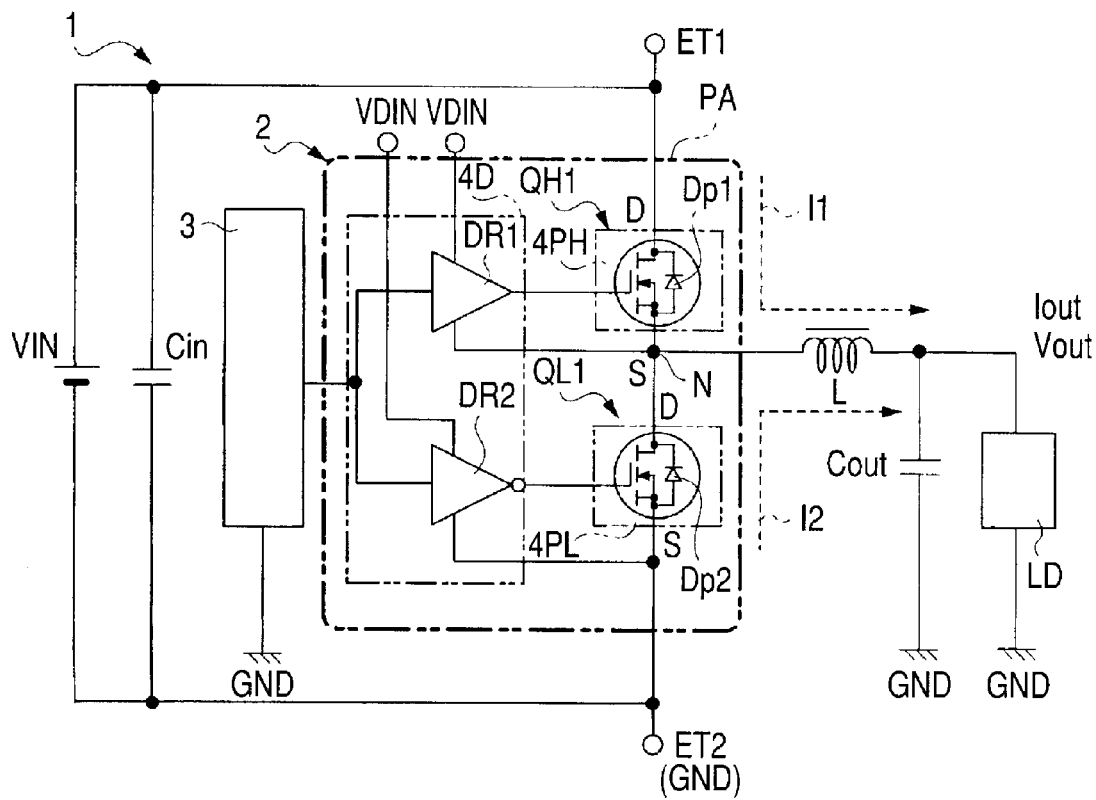
FIG. 1 is a circuit diagram of an example of a non-isolated DC-DC converter including a semiconductor device of an embodiment of the invention.
Figure 2:
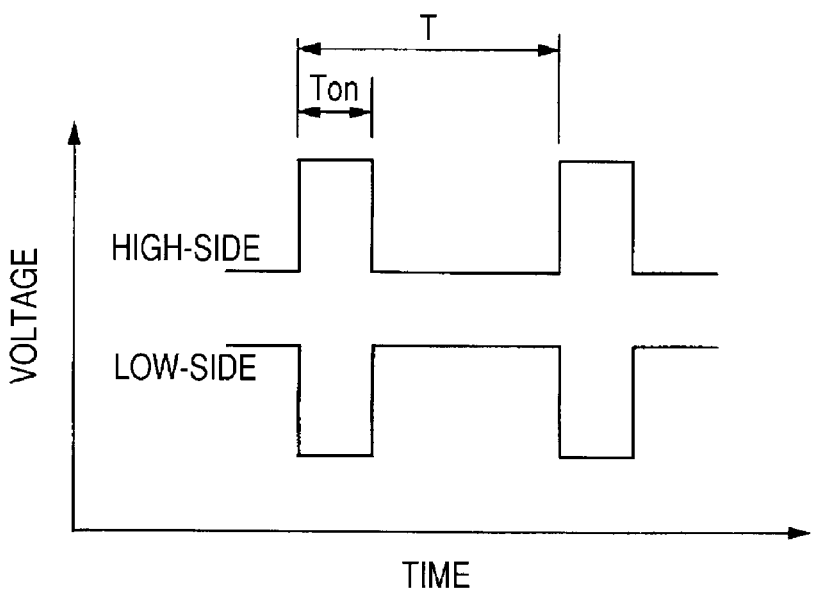
FIG. 2 is a waveform chart illustrating the basic operation of the non-isolated DC-DC converter in FIG. 1.

FIG. 1 is a circuit diagram of an example of a non-isolated DC-DC converter 1 including a semiconductor device of the first embodiment; and FIG. 2 is a waveform chart of the basic operation of the non-isolated DC-DC converter 1 in FIG. 1.

This non-isolated DC-DC converter 1 is used, for example, in the power supply circuit of electronic equipment, such as desktop personal computer, notebook personal computer, server, and game machine. It includes a semiconductor device 2, a control circuit 3, an input capacitor Cin, an output capacitor Cout, and a coil L. Code VIN denotes input power supply; GND denotes reference potential (e.g., ground potential of 0V); Iout denotes output current; and Vout denotes output voltage.

The semiconductor device 2 includes two driver circuits DR1 and DR2 and two power MOS-FETs (Metal Oxide Semiconductor Field Effect Transistors: hereafter, simply referred to as power MOSs) QH1 and QL1. The driver circuits DR1 and DR2 and power MOS-FETs QH1 and QL1 are sealed (housed) in one and the same package PA.

The driver circuits DR1 and DR2 are circuits that respectively control the potential at the gate terminals of the power MOSs QH1 and QL1 according to a pulse width modulation (PWM) signal supplied from the control circuit 3 and thereby respectively control the operations of the power MOSs QH1 and QL1. The output of one driver circuit DR1 is electrically connected to the gate terminal of the power MOS QH1, and the output of the other driver circuit DR2 is electrically connected to the gate terminal of the power MOS QL1. The two driver circuits DR1 and DR2 are formed in one and the same semiconductor chip 4D. Code VDIN denotes the input power supply of the driver circuits DR1 and DR2.

The power MOSs QH1 and QL1 are connected in series between a terminal (first power supply terminal) ET1 for supplying the high potential (first power supply potential) of input power supply VIN and a terminal (second power supply terminal) ET2 for supplying reference potential (second power supply potential) GND. That is, the power MOS QH1 has its source-drain path connected in series between the terminal ET1 for supplying the high potential of input power supply VIN and an output node (output terminal) N; and the power MOS QL1 has its source-drain path connected in series between the output node N and the terminal ET2 for supplying reference potential GND. Code Dp1 denotes the parasitic diode (internal diode) of the power MOS QH1, and Dp2 denotes the parasitic diode (internal diode) of the power MOS QL1. Code D denotes the drains of the power MOSs QH1 and QL1, and S denotes the sources of the power MOSs QH1 and QL1.

The power MOS (first field effect transistor, power transistor) QH1 is a field effect transistor for high-side switch (high-potential side: first operating voltage; hereafter, simply referred to as high side), and has a switch function for storing energy in the coil L. The coil L is an element for supplying power to the output of the non-isolated DC-DC converter 1 (the input of load LD).

The power MOS QH1 for high side is formed in a semiconductor chip 4PH separate from the semiconductor chip 4D. The power MOS-FET QH1 is formed of, for example, an n-channel field effect transistor. A channel of the field effect transistor is formed in the direction of the thickness of the semiconductor chip 4PH. Thus, a channel width per unit area can be increased and an on-resistance can be reduced as compared with a field effect transistor whose channel is formed along the main surface of the semiconductor chip 4PH (the surface orthogonal to the direction of the thickness of the semiconductor chip 4PH). Therefore, device miniaturization can be accomplished, and packaging can be reduced in size.

The power MOS (second field effect transistor, power transistor) QL1 is a field effect transistor for low-side switch (low-potential side: second operating voltage; hereafter, simply referred to as low side), and has a function of reducing the resistance of the transistor in synchronization with a frequency from the control circuit 3 when carrying out rectification. That is, the power MOS QL1 is a transistor for rectification of the non-isolated DC-DC converter 1.

The power MOS QL1 for low side is formed in a semiconductor chip 4PL separate from the semiconductor chips 4D and 4PH. The power MOS QL1 is formed of, for example, an n-channel power MOS, and has its channel formed in the direction of the thickness of the semiconductor chip 4PL similarly with the power MOS QH1. The reason why the power MOS whose channel is formed in the direction of the thickness of the semiconductor chip 4PL is used is as follows: As indicated by the waveform of the basic operation of the non-isolated DC-DC converter 1 in FIG. 2, the on-time (time for which voltage is applied) of the power MOS QL1 for low side is longer than the on-time of the power MOS QH1 for high side, and its loss due to on-resistance seems to be larger than switching loss. For this reason, use of a field effect transistor whose channel is formed in the direction of the thickness of the semiconductor chip 4PL makes it possible to increase a channel width per unit area as compared with cases where a field effect transistor whose channel is formed along the main surface of the semiconductor chip 4PL is used. That is, an on-resistance can be reduced by forming the MOS QL1 for low side of a field effect transistor whose channel is formed in the direction of the thickness of the semiconductor chip 4PL. Therefore, the voltage conversion efficiency can be enhanced even when a current passed through the non-isolated DC-DC converter 1 is increased. In FIG. 2, code Ton denotes the pulse width of the power MOS QH1 for high side at on-time, and, T denotes a pulse period.

The control circuit 3 is a circuit that controls the operations of the power MOSs QH1 and QL1, and is constructed of, for example, a PWM (Pulse Width Modulation) circuit. This PWM circuit compares a command signal with the amplitude of a triangular wave and outputs a PWM signal (control signal). According to this PWM signal, the output voltage of the power MOSs QH1 and QL1 (i.e., the non-isolated DC-DC converter 1) is controlled. (That is, the width of switch-on of voltage (on-time) of the power MOSs QH1 and QL1 is controlled according to the PWM signal.)

The output of the control circuit 3 is electrically connected to the inputs of the driver circuits DR1 and DR2. The respective outputs of the driver circuits DR1 and DR2 are respectively electrically connected to the gate terminal of the power MOS QH1 and the gate terminal of the power MOS QL1.

The input capacitor Cin is a power supply that temporarily stores energy (electric charges) supplied from input power supply VIN and supplies the stored energy to the main circuit of the non-isolated DC-DC converter 1, and is electrically connected in parallel with input power supply VIN. The output capacitor Cout is electrically connected between output wiring that connects the coil L and the load LD and the terminal for supplying reference potential GND.

The wiring of the non-isolated DC-DC converter 1 that connects the source of the power MOS QH1 and the drain of the power MOS QL1 is provided with the above-mentioned output node N for externally supplying power supply potential for output. The output node N is electrically connected to the coil L through the output wiring, and is further electrically connected to the load LD through the output wiring. Examples of the load LD include hard disk drive HDD, ASIC (Application Specific Integrated Circuit), FPGA (Field Programmable Gate Array), expansion card (PCI CARD), memory (DDR memory, DRAM (Dynamic RAM), flash memory, etc.), CPU (Central Processing Unit), and the like.

In this non-isolated DC-DC converter 1, the power MOSs QH1 and QL1 are alternately turned on/off in synchronization, and power supply voltage is thereby converted. When the power MOS QH1 for high side is on, a current (first current) I1 flows from the terminal ET1 to the output node N by way of the power MOS QH1. When the power MOS QH1 for high side is off, a current I2 is passed by the counterelectromotive voltage of the coil L. Voltage drop can be reduced by turning on the power MOS QL1 for low side when the current I2 is flowing.

Figure 3:
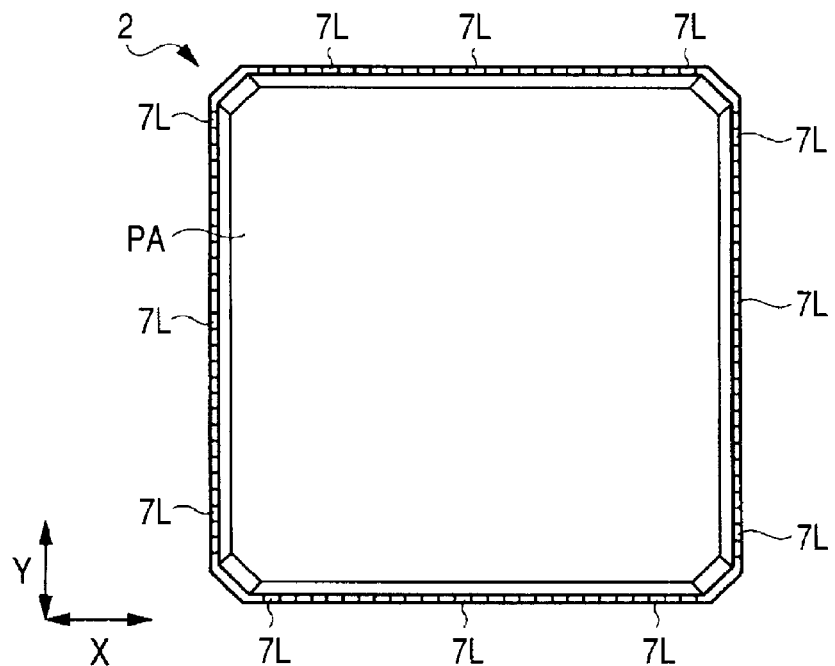
FIG. 3 is an overall plan view illustrating the main surface side of a package that forms the appearance of the semiconductor device in FIG. 1.
Figure 4:
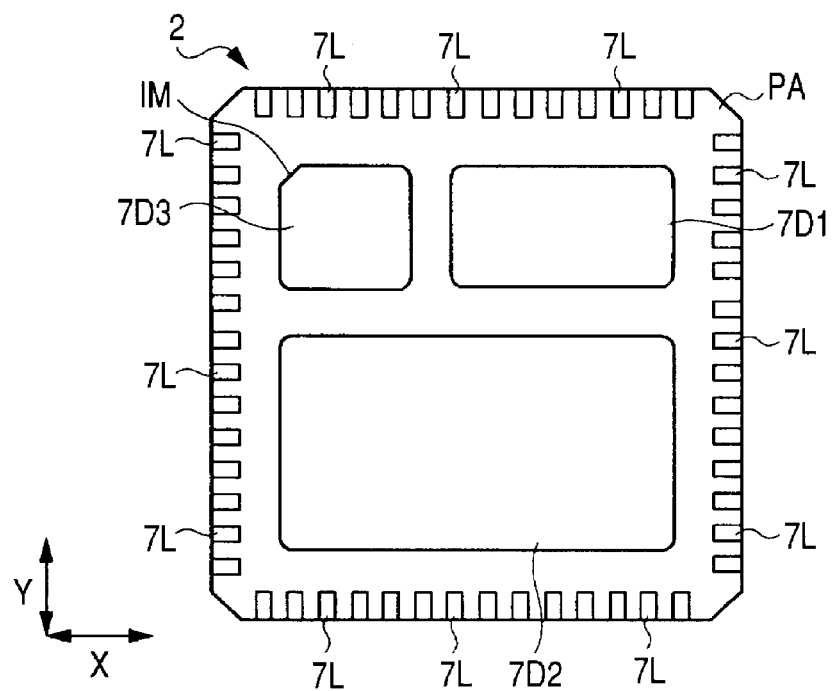
FIG. 4 is an overall plan view illustrating the back surface side of the package in FIG. 3.
Figure 5:
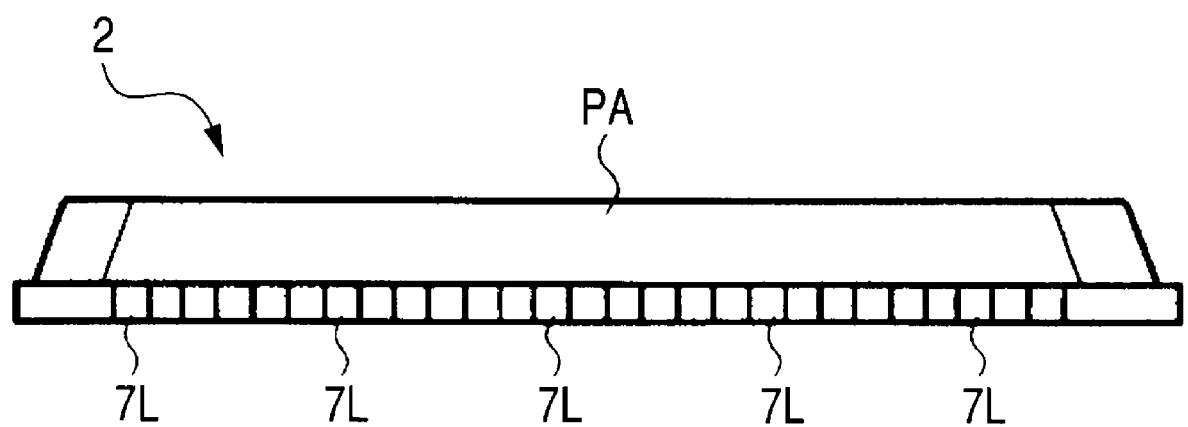
FIG. 5 is a side view of the package in FIG. 3 and FIG. 4.

FIG. 3 is an overall plan view of the main surface side of the package PA that forms the appearance of the semiconductor device 2 in FIG. 1; FIG. 4 is an overall plan view of the back surface side of the package PA in FIG. 3; and FIG. 5 is a side view of the package PA in FIG. 3 and FIG. 4. Code X denotes a first direction; and Y denotes a second direction orthogonal to the first direction X.

The semiconductor device 2 of the first embodiment includes, for example, a QFN (Quad Flat Non-leaded package)-type surface mount package (sealing body) PA. That is, the appearance of the package PA is in the shape of thin plate encircled with a main surface (first main surface) and a back surface (second main surface) positioned opposite to each other along the direction of thickness and side faces intersecting these surfaces. The planar shape of the main surface and back surface of the package PA is, for example, octagonal.

The material of the package PA is, for example, epoxy resin. To reduce stress or for some other like purpose, however, it may be formed of, for example, biphenylic thermosetting resin with phenylic hardening agent, silicone rubber, filler, and the like added thereto.

On the side faces of and the periphery of the back surface of the package PA, there are exposed multiple leads (external terminals) 7L along the periphery of the package PA. The leads 7L are so formed that they are not largely protruded outward from the package PA.

On the back surface of the package PA, there are exposed the back surfaces of three die pads (first, second, and third chip mounting portions) 7D1, 7D2, and 7D3 in substantially rectangular planar shape. Of these die pads, the die pad 7D2 is largest in area of exposure, and the die pad 7D1 is second largest in area of exposure. At one corner of the smallest die pad 7D3, there is formed a taper IM (Index Mark) for positioning.

However, the configuration of the package PA is not limited to the QFN configuration, and it can be modified in various manners. For example, another flat package configuration, such as the QFP (Quad Flat Package) configuration or the SOP (Small Out-line Package) configuration, may be adopted. In case of the QFP configuration, multiple leads 7L are exposed so that they are largely protruded outward from the four sides (the side faces and the periphery of the back surface) of the package PA. In case of the SOP configuration, multiple leads 7L are exposed so that they are largely protruded outward from two sides (side faces and the periphery of the back surface) of the package PA.

Figure 6:
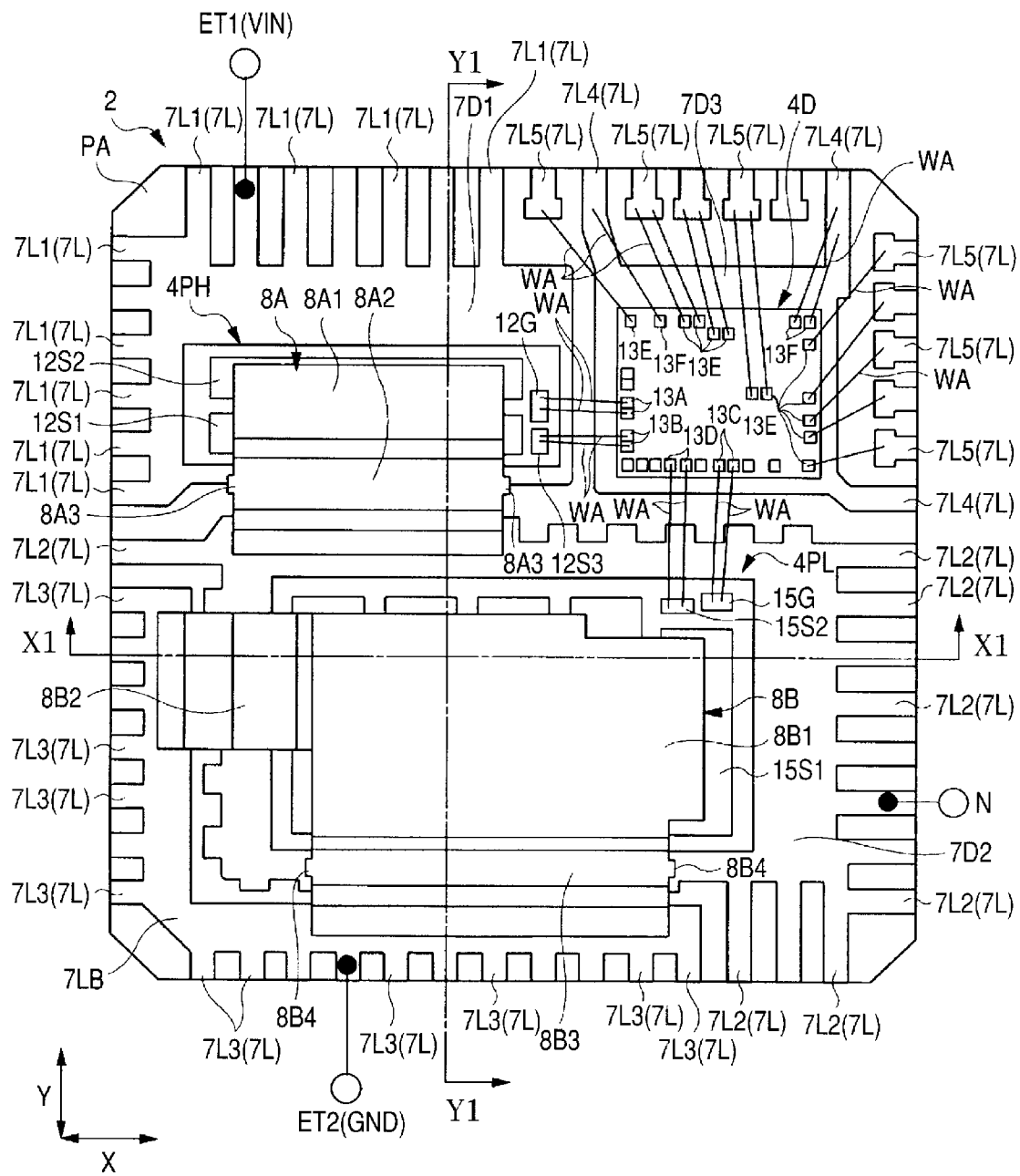
FIG. 6 is an overall plan view showing the interior of the package in FIG. 1 in a see-through manner.
Figure 7:
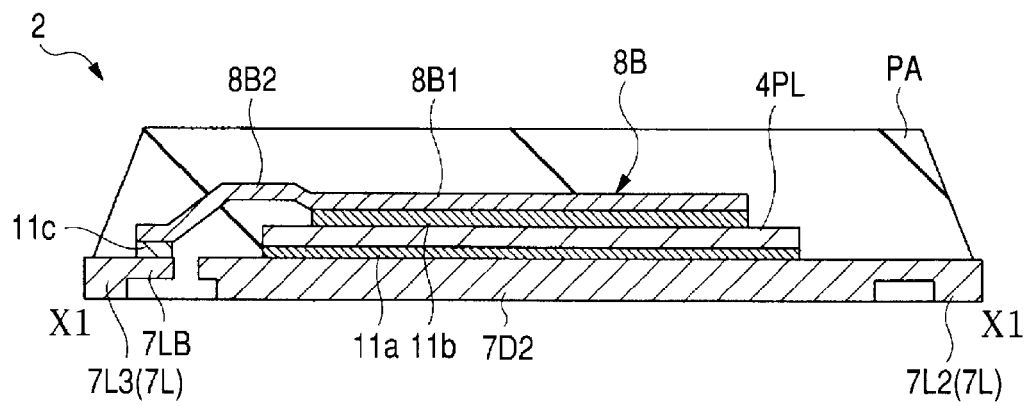
FIG. 7 is a sectional view taken along line X1-X1 of FIG. 6.
Figure 8:
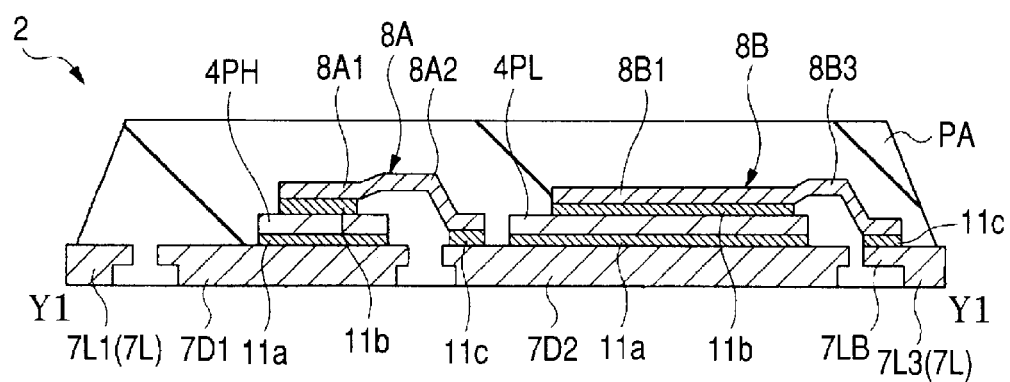
FIG. 8 is a sectional view taken along line Y1-Y1 of FIG. 6.
Figure 9:
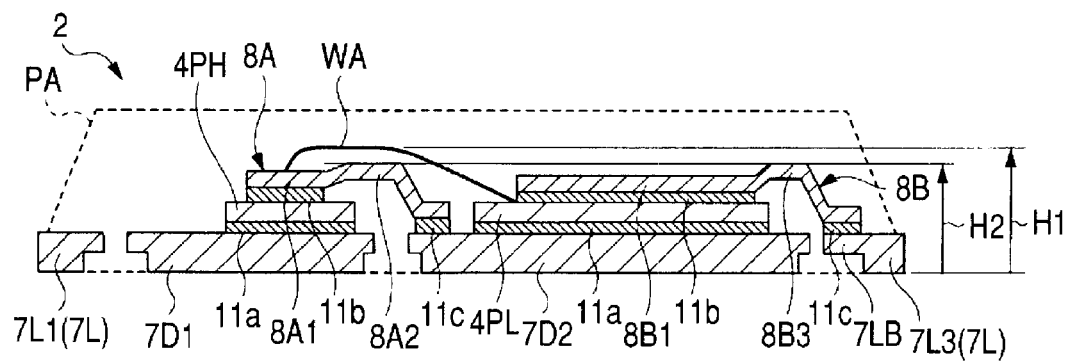
FIG. 9 is an explanatory drawing of the internal configuration of the package in FIG. 1.
Figure 10:
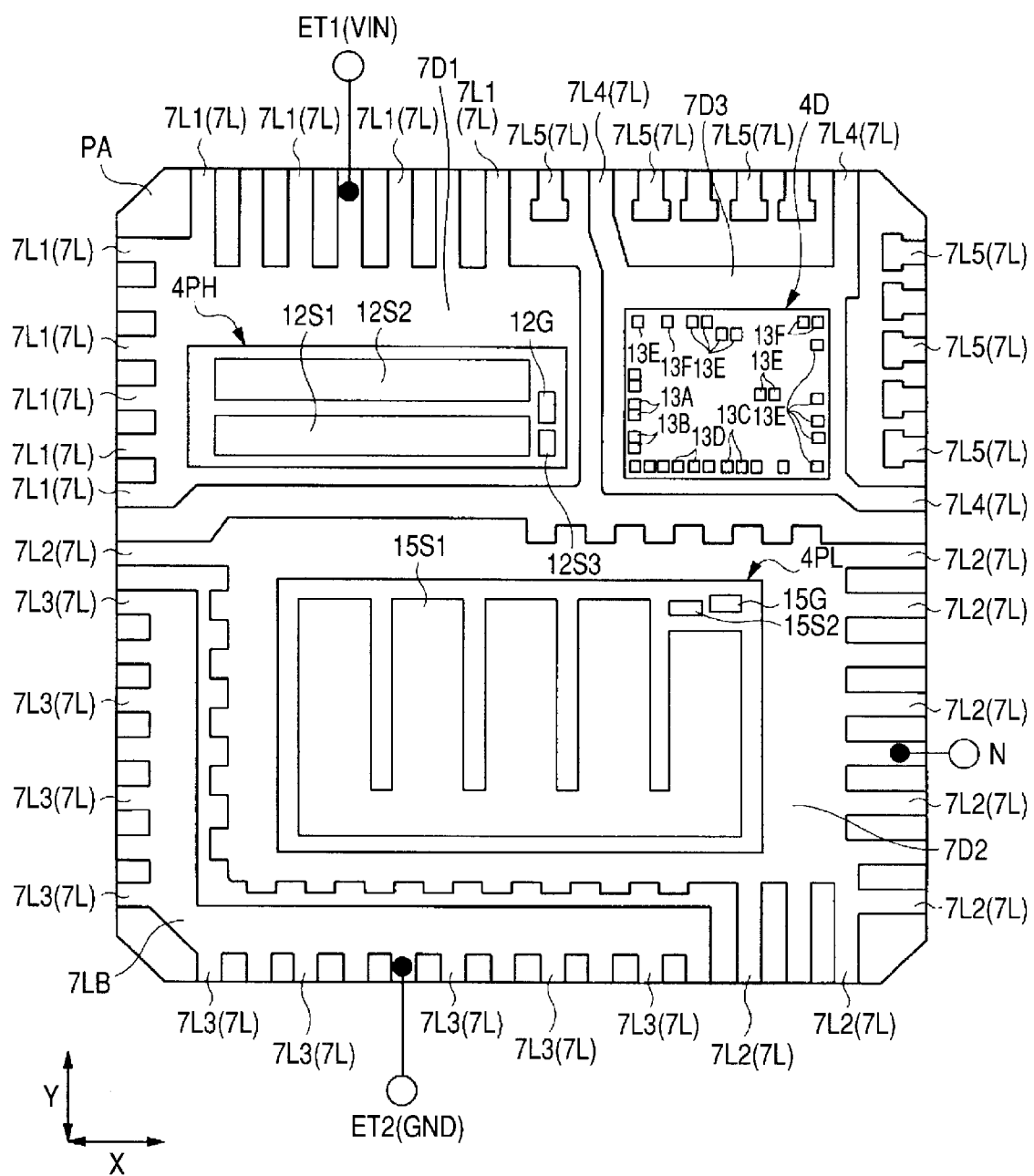
FIG. 10 is an overall plan view showing the interior of the package in FIG. 6 with metal plates removed in a see-through manner.
Figure 11:
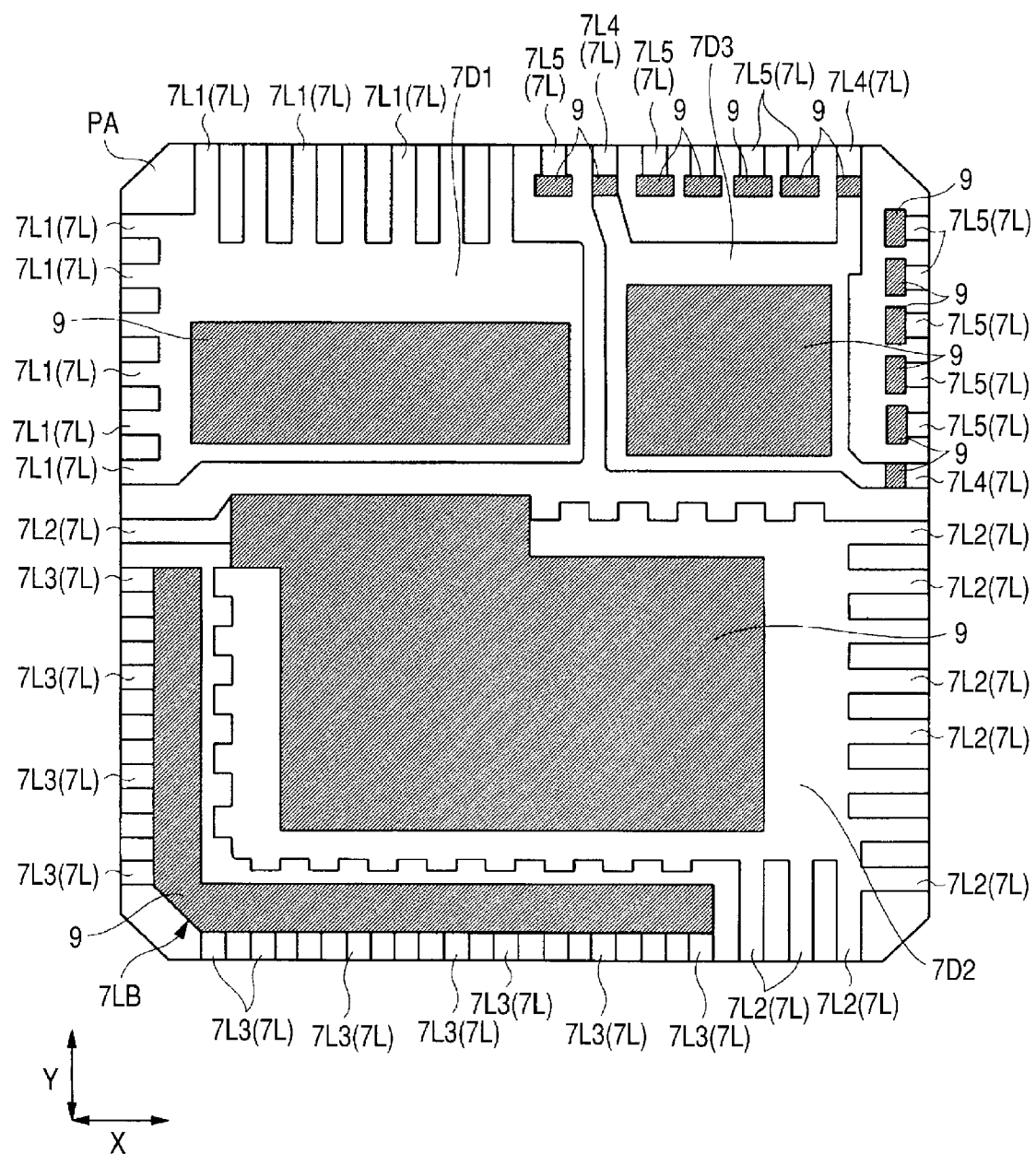
FIG. 11 is an overall plan view showing the interior of the package in FIG. 6 with metal plates and semiconductor chips removed in a see-through manner.

FIG. 6 is an overall plan view showing the interior of the package PA in FIG. 1 in a see-through manner; FIG. 7 is a sectional view taken along line X1-X1 of FIG. 6; FIG. 8 is a sectional view taken along line Y1-Y1 of FIG. 6; FIG. 9 is an explanatory drawing of the internal configuration of the package PA in FIG. 1; FIG. 10 is an overall plan view showing the interior of the package PA in FIG. 6 with metal plates removed in a see-through manner; and FIG. 11 is an overall plan view showing the interior of the package PA in FIG. 6 with metal plates and semiconductor chips removed in a see-through manner.

In the package PA, there are sealed part of three die pads (tabs, chip mounting portions) 7D1, 7D2, and 7D3, the above-mentioned semiconductor chips 4PH, 4PL, and 4D mounted over the respective main surfaces (first main surfaces) of the die pads 7D1 to 7D3, two metal plates 8A and 8B, bonding wires (hereafter, simply referred to as wires) WA, part of the above-mentioned multiple leads 7L, and lead wiring (wiring portion) 7LB.

The die pads 7D1 to 7D3, leads 7L, and lead wiring 7LB are formed with metal, such as 42 alloy, used as the principal material. As another material of the die pads 7D1 to 7D3, leads 7L, and lead wiring 7LB, for example, copper (Cu) or copper whose surface is plated with nickel (Ni), palladium (Pd), and gold (Au) in this order may be used.

The die pads 7D1 to 7D3 are adjacently disposed in such a manner that they are separated from one another with predetermined distances in-between. The die pads 7D1 to 7D3 are so disposed that their respective center is off the center of the package PA. Of these die pads, the die pad 7D2 is largest in overall area, and the die pad 7D1 is second largest in overall area. The die pads 7D1 and 7D2 are so disposed that their long sides are in parallel with each other. The die pad 7D3 is so disposed that one side is positioned alongside a short side of the die pad 7D1 and another side of the die pad 7D3 intersecting the above one side is positioned alongside a long side of the die pad 7D2.

Part of the back surfaces (second main surfaces) of the die pads 7D1 to 7D3 is exposed in the back surface of the package PA as mentioned above. Heat produced when the semiconductor chips 4PH, 4PL, and 4D operate is externally radiated mainly from the back surfaces (second main surfaces) of the semiconductor chips 4PH, 4PL, and 4D through the die pads 7D1 to 7D3. For this reason, the die pads 7D1 to 7D3 are so formed that they are larger than the areas of the respective semiconductor chips 4PH, 4PL, and 4D. Thus, heat radiation characteristics can be enhanced.

In regions where a semiconductor chip 4D, 4PH, or 4PL is brought into contact, regions where a wire WA is brought into contact, and regions where a metal plate 8A or 8B is brought into contact (the hatched areas in FIG. 11) on the main surfaces of the die pads 7D1 to 7D3, leads 7L, and lead wiring 7LB, there is formed a plating layer 9 composed of, for example, silver (Ag) or the like. This makes it possible to suppress solder for connecting the semiconductor chips 4D, 4PH, and 4PL and metal plates 8A and 8B and the die pads 7D1 to 7D3 and lead wiring 7LB from spreading in the die pads 7D1 to 7D3 and the lead wiring 7LB. Thus, the adhesion can be enhanced between the semiconductor chips 4D, 4PH, and 4PL and metal plates 8A and 8B and the die pads 7D1 to 7D3 and lead wiring 7LB.

Further, the stability of contact bonding between the wires WA and the leads 7L can be enhanced. The plating layer 9 need not be formed over the main surfaces of the die pads 7D1 to 7D3, lead wiring 7LB or leads 7L in some cases. The above-mentioned plating layer 9 may be formed only in the areas of contact between the leads 7L and the wires WA.

The total thickness of part of the die pads 7D1 to 7D3, lead wiring 7LB, and leads 7L on the back surface side is relatively reduced. For this reason, the material for sealing the package PA gets into the thinned portions of the die pads 7D1 to 7D3, lead wiring 7LB, and leads 7L on the back surface side. This makes it possible to enhance the adhesion between the die pads 7D1 to 7D3, lead wiring 7LB, and leads 7L and the sealing material for the package PA. As a result, it is possible to reduce or eliminate peeling or deformation failure of the die pads 7D1 to 7D3, lead wiring 7LB, and leads 7L. On the periphery of the die pad 7D2 largest in area, especially, a concave-convex pattern is formed in its portion positioned opposite to the lead wiring 7LB and its portion positioned opposite to the two die pads 7D1 and 7D3. This makes it possible to enhance the adhesion between the die pad 7D2 and the sealing material for the package PA; therefore, it is possible to reduce or eliminate peeling and deformation failure of the die pad 7D2 largest in area.

The die pad 7D1 is formed in rectangular planar shape so that its length in the first direction X is longer than its length in the second direction Y. On two sides of the die pad 7D1 intersecting each other, there are integrally connected the above-mentioned multiple leads 7L1 (7L) along the two sides. These multiple leads 7L1 are electrically connected with the above-mentioned terminal ET1, and are supplied with the above-mentioned high-potential input power supply VIN.

Over the main surface (first main surface) of the die pad 7D1, there is mounted the above-mentioned semiconductor chip (first semiconductor chip) 4PH for power transistor with its main surface (first main surface) facing upward and its back surface (second main surface) facing toward the die pad 7D1.

The semiconductor chip 4PH is formed in oblong planar shape and is longer and thinner than the above-mentioned semiconductor chip (third semiconductor chip) 4D. The semiconductor chip 4PH is so disposed that its long sides are positioned in the direction of the length of the die pad 7D1. The planar area of the semiconductor chip 4PH is larger than the planar area of the semiconductor chip 4D. The sum total of the lengths of the long sides and short sides of the semiconductor chip 4PH is larger than the sum total of the lengths of the long sides and short sides of the above-mentioned semiconductor chip 4D.

The electrode on the back surface of the semiconductor chip 4PH is joined with and electrically connected to the die pad 7D1 through a conductive bonding layer 11a. The electrode on the back surface of the semiconductor chip 4PH is electrically connected to the drain D of the above-mentioned power MOS QH1 for high side. The bonding layer 11a is composed of, for example, lead (Pb)-tin (Sn) solder or silver (Ag) paste.

Over the main surface (first main surface) of the semiconductor chip 4PH, there are disposed a bonding pad (hereafter, simply referred to as pad) 12G for gate electrode and pads 12S1, 12S2, and 12S3 for source electrode.

The pad 12G for gate electrode is electrically connected to the gate electrode of the above-mentioned power MOS QH1 for high side. This pad 12G for gate electrode is disposed at one end of the semiconductor chip 4PH in the direction of the length of the semiconductor chip 4PH. The semiconductor chip 4PH is disposed with the pad 12G for gate electrode facing toward the semiconductor chip 4D. The pad 12G for gate electrode is electrically connected with pads 13A on the main surface of the semiconductor chip 4D, described later, through multiple wires WA. The wires WA are formed of, for example, gold (Au).

The pads 12S1, 12S2, and 12S3 for source electrode are electrically connected to the source S of the above-mentioned power MOS QH1 for high side. The pads (first source electrode regions) 12S1 and 12S2 for source electrode are larger than the pad 12G for gate electrode and the pad 12S3 for source electrode, and are formed in the shape of oblong extended in the direction of the length of the semiconductor chip 4PH (first direction X). The pad (second source electrode region) 12S3 for source electrode is disposed at the one end of the semiconductor chip 4PH where the pad 12G for gate electrode is disposed, in the direction of the length of the semiconductor chip 4PH. The relatively large pads 12S1 and 12S2 are separated from each other by a protective film (insulating film) as the uppermost layer of the semiconductor chip 4PH; however, they are integrally formed and electrically connected to each other under the protective film as described later. The relatively large pads 12S1 and 12S2 and the relatively small pad 12S3 are separated from each other by a protective film (insulating film) as the uppermost layer of the semiconductor chip 4PH; however, they are integrally formed and electrically connected to each other under the protective film as described later.

The pads 12S1, 12S2, and 12S3 for source electrode (i.e., the source S of the above-mentioned power MOS QH1 for high side) are electrically connected to the die pad 7D2 through the above-mentioned metal plate 8A. This makes it possible to reduce the aluminum spreading resistance in the semiconductor chip 4PH and the on-resistance of the power MOS QH1 for high side as compared with cases where the pads 12S1, 12S2, and 12S3 for source electrode and the die pad 7D2 are connected with each other through wires. For this reason, the package resistance can be reduced, and the conduction loss can be reduced as well.

This metal plate 8A is formed of a metal high in electrical conductivity and thermal conductivity, such as copper (Cu) or aluminum (Al). Use of the metal plate 8A formed of copper or aluminum more inexpensive than gold instead of wires formed of gold (Au) makes it possible to reduce the cost of the semiconductor device 2. The dimensions of the metal plate 8A in the first direction X and the second direction Y are larger than the diameter of the wire WA. The metal plate 8A integrally includes a first portion 8A1 and a second portion 8A2 described below.

The first portion 8A1 is a rectangular portion joined with and electrically connected to the pads 12S1 and 12S2 for source electrode through a conductive bonding layer 11b. In a sectional view, the first portion 8A1 is formed flat along the main surface of the semiconductor chip 4PH as illustrated in FIG. 8 and FIG. 9.

The second portion 8A2 is extended from a long side of the first portion 8A1 along the second direction Y intersecting that long side. It is extended to a position where it overlaps part of the die pad 7D2 astride alongside of the semiconductor chip 4PH. The back surface of the tip of the second portion 8A2 in the second direction Y is joined with and electrically connected with the die pad 7D2 through a conductive bonding layer 11c.

Further, the second portion 8A2 is extended from one corner to another of the first portion 8A1 in the direction of the length of the first portion 8A1 (first direction X). In a sectional view, the height of the second portion 8A2 is higher than the height of the first portion 8A1 between the semiconductor chip 4PH and the die pad 7D2 so that it gets away from the main surface of the semiconductor chip 4PH as illustrated in FIG. 8 and FIG. 9. This makes it possible to make the material of the bonding layer 11b less prone to leak toward a side face of the semiconductor chip 4PH. Therefore, faulty electrical continuity between the main surface (source S) and the back surface (drain D) of the semiconductor chip 4PH caused by the material of the bonding layer 11b can be reduced.

Height cited here is defined as the distance from the back surfaces of the die pads 7D1 to 7D3 to a position away from the back surfaces in the direction of the thickness of the package PA. (The direction of the thickness of the package PA is equivalent to the direction perpendicularly intersecting the main surface of the semiconductor chip 4PH.) The bonding layers 11b and 11c are formed of the same material as of the bonding layer 11a.

This metal plate 8A is so disposed that it covers part of the main surface of the semiconductor chip 4PH that makes a heat radiation source. Thus, the semiconductor chip 4PH is sandwiched between the metal plate 8A and the die pad 7D1. That is, heat produced at the semiconductor chip 4PH is radiated not only from the back surface of the semiconductor chip 4PH through the die pad 7D1 but also from the main surface of the semiconductor chip 4PH through the metal plate 8A. As a result, the capability to radiate heat produced at the semiconductor chip 4PH can be enhanced.

However, the area of the first portion 8A1 of the metal plate 8A is smaller than the area of the main surface of the semiconductor chip 4PH or the total area of the region of disposition of the pads 12S1 and 12S2 for source electrode. The metal plate 8A is so disposed that its first portion 8A1 fits into the main surface of the semiconductor chip 4PH and is not protruded outward from the semiconductor chip 4PH.

This is because the present inventors found the following for the first time: when the area of the above-mentioned first portion 8A1 of the metal plate 8A is larger than the area of the main surface of the semiconductor chip 4PH or the total area of the region of disposition of the pads 12S1 and 12S2 for source electrode, the problem describe below arises.

When the area of the first portion 8A1 of the metal plate 8A is larger than the area of the main surface of the semiconductor chip 4PH or the like and the first portion 8A1 is protruded outward from the semiconductor chip 4PH, the following takes place: part of the material of the bonding layer 11b on the back surface of the metal plate 8A leaks toward a side face of the semiconductor chip 4PH and eventually arrives at the back surface of the semiconductor chip. As a result, the main surface (source S) and the back surface (drain D) of the semiconductor chip 4PH are prone to be electrically connected to each other by the material of the bonding layer 11b.

To cope with this, the first embodiment is so constructed that the area of the first portion 8A1 of the metal plate 8A is smaller than the area of the main surface of the semiconductor chip 4PH or the area of the region of disposition of the pads 12S1 and 12S2 for source electrode. This makes it possible to prevent the material of the bonding layer 11b from leaking toward a side face of the semiconductor chip 4PH. Therefore, the faulty electrical continuity between the main surface (source S) and the back surface (drain D) of the semiconductor chip 4PH caused by the material of the bonding layer 11b can be reduced.

The metal plate 8A is so constructed that the four corners of the semiconductor chip 4PH are not covered therewith. That is, the metal plate 8A is not disposed directly above the four corners of the semiconductor chip 4PH, and the four corners of the semiconductor chip 4PH are exposed from the metal plate 8A. Thus, in appearance inspection conducted after the metal plate 8A is joined, the state of the bonding layer 11 that connects the metal plate 8A and the semiconductor chip 4PH can be observed at the four corners of the semiconductor chip 4PH. As a result, the reliability and yield of the semiconductor device 2 can be enhanced. This will be described later.

The metal plate 8A is so disposed that the uppermost portion (the portion higher than the first portion 8A1) of the second portion 8A2 is positioned between the semiconductor chip 4PH and the die pad 7D2. It is so disposed that especially, the hanging portions 8A3 formed on side faces of the uppermost portion are positioned between the semiconductor chip 4PH and the die pad 7D2. The hanging portions 8A3 are portions that connect and support the metal plate frame and each metal plate 8A.

This is because the present inventors found the following for the first time: when a hanging portion 8A3 is positioned directly above the pad 12S1 or 12S2 of the semiconductor chip 4PH or the die pad 7D2, the problem described below arises.

Chippings (burrs) may be left on a cut surface of the hanging portion 8A3 in some cases. When a hanging portion 8A3 is positioned directly above the pad 12S1 or 12S2 of the semiconductor chip 4PH or the die pad 7D2, the following problems become prone to arise: the chippings can hit on the pads 12S1 and 12S2 and damage the pads 12S1 and 12S2; and the chippings can get into between the metal plate 8A and the die pad 7D2, and the metal plate 8A can be thereby tilted.

To cope with this, the first embodiment is constructed as mentioned above. Thus, even when chippings are left on a cut surface of a hanging portion 8A3, it is possible to reduce or prevent damage to the pads 12S1 and 12S2 and the occurrence of tilting of the metal plate 8A relative to the die pad 7D2. This is because the positions of the hanging portions 8A3 become farther away from the pads 12S1 and 12S2 and the die pad 7D2.

The pads 12S1, 12S2, and 12S3 for source electrode (i.e., the source S of the power MOS QH1 for high side) are electrically connected to pads 13B over the main surface of the semiconductor chip 4D through multiple wires WA. That is, one ends of the wires WA are joined with the pad 12S3 for source electrode, and the other ends of the wires WA are joined with the pads 13B. As illustrated in FIG. 9, the height H1 of the uppermost portions of the wires WA is higher than the height H2 of the uppermost portion of the metal plate 8A. However, the height of the uppermost portions of the wires WA may be lower than the height of the uppermost portion of the metal plate 8A.

The above-mentioned die pad 7D2 is formed in rectangular planar shape so that its length in the first direction X is longer than its length in the second direction Y. The die pad 7D2 is integrally connected with above-mentioned multiple leads 7L2(7L). The multiple leads 7L2 are electrically connected with the above-mentioned output node N.

Over the main surface (first main surface) of the die pad 7D2, there is mounted the above-mentioned semiconductor chip (second semiconductor chip) 4PL for power transistor with its main surface (first main surface) facing upward and its back surface (second main surface) facing toward the die pad 7D2.

The semiconductor chip 4PL is formed in oblong planar shape and is so disposed that the long sides of the semiconductor chip 4PL are positioned along the direction of the length of the die pad 7D2. The planar area of the semiconductor chip 4PL is larger than the planar area of each of the semiconductor chip 4PH and the semiconductor chip 4D. The long sides and the short sides of the semiconductor chip 4PL are respectively longer than the long sides and the short sides of the semiconductor chip 4PH.

The electrode on the back surface of the semiconductor chip 4PL is joined with and electrically connected to the die pad 7D2 through the conductive bonding layer 11a. The electrode on the back surface of the semiconductor chip 4PL is electrically connected to the drain D of the power MOS QL1 for low side.

Over the main surface (first main surface) of the semiconductor chip 4PL, there are disposed a bonding pad (hereafter, simply referred to as pad) 15G for gate electrode and pad 15S1 and 15S2 for source electrode.

The pad 15G for gate electrode is electrically connected to the gate electrode of the power MOS QL1 for low side. This pad 15G for gate electrode is disposed in proximity to a corner at one end of the semiconductor chip 4PL in the direction of the length of the semiconductor chip 4PL. In the semiconductor chip 4PL, the pad 15G for gate electrode is disposed so that it faces toward the semiconductor chip 4D. The pad 15G for gate electrode is electrically connected with pads 13C on the main surface of the semiconductor chip 4D through multiple wires WA.

The pads 15S1 and 15S2 for source electrode are electrically connected to the source S of the above-mentioned power MOS QL1 for low side. The pad 15S1 for source electrode (third source electrode region) is larger than the pad 15G for gate electrode and the pad 15S2 for source electrode. It is formed in comb-like planar shape so that multiple oblong portions extended in the direction of the short sides of the semiconductor chip 4PL (second direction Y) and an oblong portion extended in the direction of the long sides of the semiconductor chip 4PL (first direction X) are integrated with each other. The pad 15S2 for source electrode (fourth source electrode region) is disposed in proximity to a corner at one end of the semiconductor chip 4PL, where the pad 15G for gate electrode is disposed, in the direction of the length of the semiconductor chip 4PL. The relatively large pad 15S1 and the relatively small pad 15S2 are separated from each other by a protective film (insulating film) as the uppermost layer of the semiconductor chip 4PL; however, they are integrally formed and electrically connected to each other under the protective film as described later.

The pads 15S1 and 15S2 for source electrode (i.e., the source S of the power MOS QL1 for low side) are electrically connected with the lead wiring 7LB through the above-mentioned metal plate 8B. This makes it possible to reduce the aluminum spreading resistance in the semiconductor chip 4PL and the on-resistance of the power MOS QL1 for low side as compared with cases where the pads 15S1 and 15S2 for source electrode and the lead wiring 7LB are connected with each other through wires. For this reason, the package resistance can be reduced, and the conduction loss can be reduces as well. Aluminum spreading resistance will be described later.

This metal plate 8B is formed of a metal high in electrical conductivity and thermal conductivity, such as copper (Cu) or aluminum (Al). Use of the metal plate 8B formed of copper or aluminum of low cost instead of wires formed of gold (Au) makes it possible to reduce the cost of the semiconductor device 2. The dimensions of the metal plate 8B in the first direction X and the second direction Y are larger than the diameter of the wire WA. The planar area of the metal plate 8B is larger than the planar area of the above-mentioned metal plate 8A. The metal plate 8B integrally includes a first portion 8B1, a second portion 8B2, and a third portion 8B3 described below.

The first portion 8B1 is a rectangular portion joined with and electrically connected to the pads 15S1 and 15S2 for source electrode through the conductive bonding layer 11b. In a sectional view, the first portion 8B1 is formed flat along the main surface of the semiconductor chip 4PL as illustrated in FIG. 7.

The second portion 8B2 and the third portion 8B3 are provided so as to respectively connect the first portion 8B1 and the lead wiring 7LB.

The second portion 8B2 is extended from a short side of the first portion 8B1 along the first direction X intersecting (orthogonal to) that short side. It is continuously extended to a position where it overlaps part of the lead wiring 7LB astride a short side of the semiconductor chip 4PL. The back surface of the tip of the second portion 8B2 in the first direction X is joined with and electrically connected with the lead wiring 7LB through the conductive bonding layer 11c.

Further, the second portion 8B2 is continuously extended from one corner positioned between the long side where the third portion 8B3 is not formed of the long sides of the first portion 8B1 and a short side of the first portion 8B1 to some midpoint on that short side along the short side of the first portion 8B1. That is, the second portion 8B2 is not extended from one corner to the other corner on a short side of the first portion 8B1. Thus, the corner of the semiconductor chip 4PL, positioned between the second portion 8B2 and the third portion 8B3 is not covered with the second portion 8B2 and is exposed.

In a sectional view, the height of the second portion 8B2 is higher than the height of the first portion 8B1 between the semiconductor chip 4PL and the lead wiring 7LB so that it gets away from the main surface of the semiconductor chip 4PL as illustrated in FIG. 7, FIG. 8, and FIG. 9. This makes it possible to prevent the material of the bonding layer 11b from leaking toward a side face of the semiconductor chip 4PL. Therefore, faulty electrical continuity between the main surface (source S) and the back surface (drain D) of the semiconductor chip 4PL caused by the material of the bonding layer 11b can be reduced.

The above-mentioned third portion 8B3 is extended from a long side of the first portion 8B1 in the second direction Y intersecting that long side. It is continuously extended to a position where it overlaps part of the lead wiring 7LB astride the long side intersecting a short side of the semiconductor chip 4PL. The back surface of the tip of the third portion 8B3 in the second direction Y is joined with and electrically connected with the lead wiring 7LB through the conductive bonding layer 11c. The third portion 8B3 is extended from one corner to the vicinity of the other corner of the first portion 8B1 in the direction of the length of the first portion 8B1 (first direction X).

In a sectional view, the third portion 8B3 includes a portion whose height is higher than the height of the first portion 8B1 between the semiconductor chip 4PL and the lead wiring 7LB so that it gets away from the main surface of the semiconductor chip 4PL as illustrated in FIG. 8 and FIG. 9. This makes it possible to prevent the material of the bonding layer 11b from leaking toward a side face of the semiconductor chip 4PL.

Therefore, faulty electrical continuity between the main surface (source S) and the back surface (drain D) of the semiconductor chip 4PL caused by the material of the bonding layer 11b can be reduced.

Height cited here is also defined as the distance from the back surfaces of the die pads 7D1 to 7D3 to a position away from the back surfaces in the direction of the thickness of the package PA. (The direction of the thickness of the package PA is equivalent to the direction perpendicularly intersecting the main surface of the semiconductor chip 4PL.)

The metal plate 8B is so disposed that it covers part of the main surface of the semiconductor chip 4PL that makes a heat radiation source. Thus, the semiconductor chip 4PL is sandwiched between the metal plate 8B and the die pad 7D2. That is, heat produced at the semiconductor chip 4PL is radiated not only from the back surface of the semiconductor chip 4PL through the die pad 7D2 but also from the main surface of the semiconductor chip 4PL through the metal plate 8B. As a result, the capability to radiate heat produced at the semiconductor chip 4PL can be enhanced.

However, the area of the first portion 8B1 of the metal plate 8B is smaller than the area of the main surface of the semiconductor chip 4PL or the area of the region of disposition of the pad 15S1 for source electrode for the same reason as the foregoing. This makes it possible to prevent the material of the bonding layer 11b from leaking toward a side face of the semiconductor chip 4PL. Therefore, faulty electrical continuity between the main surface (source S) and the back surface (drain D) of the semiconductor chip 4PL caused by the material of the bonding layer 11b can be reduced.

The metal plate 8B is so constructed that the four corners of the semiconductor chip 4PL are not covered therewith. That is, the metal plate 8B is not disposed directly above the four corners of the semiconductor chip 4PL, and the four corners of the semiconductor chip 4PH are exposed from the metal plate 8B. Thus, in appearance inspection conducted after the metal plate 8B is joined, the sate of the bonding layer 11b that connects the metal plate 8B and the semiconductor chip 4PL can be observed at the four corners of the semiconductor chip 4PL. As a result, the reliability and yield of the semiconductor device 2 can be enhanced. This will be described later.

The metal plate 8B is so disposed that the uppermost portion (the portion higher than the first portion 8B1) of the third portion 8B3 is positioned between the semiconductor chip 4PL and the lead wiring 7LB. It is so disposed that especially, the hanging portions 8B4 formed on side faces of the uppermost portion are positioned between the semiconductor chip 4PL and the lead wiring 7LB for the same reason as the foregoing. The hanging portions 8B4 are portions that connect and support the metal plate frame and each metal plate 8B. Thus, even when chippings are left on a cut surface of a hanging portion 8B4, it is possible to reduce or prevent damage to the pad 15S1 and the occurrence of tilting of the metal plate 8B relative to the lead wiring 7LB caused by the chippings. This is because the positions of the hanging portions 8B4 become farther away from the pad 15S1 and the lead wiring 7LB.

The above-mentioned pads 15S1 and 15S2 for source electrode (i.e., the source S of the power MOS QL1 for low side) are electrically connected with pads 13D on the main surface of the semiconductor chip 4D through multiple wires WA. That is, one ends of the wires WA are joined with the pad 15S2 for source electrode, and the other ends of the wires WA are joined with the pads 13D. As illustrated in FIG. 9, the height H1 of the uppermost portions of the wires WA is also higher than the height H2 of the uppermost portion of the metal plate 8B. However, the height of the uppermost portions of the wires WA may be lower than the height of the uppermost portion of the metal plate 8B. The individual portions of the metal plates 8A and 8B are identical in height in terms of design.

The above-mentioned lead wiring 7LB is disposed in proximity to one corner of the die pad 7D2 so that it adjoins the die pad 7D2 at a distance therefrom. The planar shape of the lead wiring 7LB is the shape of L extended along a short side and a long side of the die pad 7D2 that intersect each other with a corner in-between. This makes it possible to shorten the current path of the main circuit and thus reduce the inductance. Therefore, the electrical characteristics of the semiconductor device 2 can be enhanced.

The lead wiring 7LB is integrally connected with multiple leads 7L3. The multiple leads 7L3 are electrically connected with the terminal ET2, and are supplied with the above-mentioned reference potential GND. Since multiple leads 7L3 are connected to the lead wiring 7LB in a lump, as mentioned above, the volume can be increased than in cases where multiple leads 7L3 are divided. This makes it possible to reduce the wiring resistance and strengthen the reference potential GND. In such a construction, consideration is given to that increase in on-resistance on the source side of the power MOS QL1 for low side has great influence on increase in switching loss. That is, with the above-mentioned construction, the on-resistance on the source side of the power MOS QL1 can be reduced, and thus the conduction loss in the power MOS QL1 can be reduced. Therefore, the voltage conversion efficiency of the non-isolated DC-DC converter 1 can be enhanced. Further, since the reference potential GND can be strengthened, the stability of operation of the non-isolated DC-DC converter 1 can be enhanced.

The above-mentioned die pad 7D3 is formed in substantially rectangular planar shape. The die pad 7D3 is integrally connected with multiple leads 7L4. Over the main surface (first main surface) of this die pad 7D3, there is mounted the semiconductor chip 4D with the above-mentioned driver circuits DR1 and DR2 formed therein with its main surface (first main surface) facing upward and its back surface (second main surface) facing toward the die pad 7D3.

This semiconductor chip 4D is also formed in rectangular planar shape. The three semiconductor chips 4PH, 4PL, and 4D are disposed so that the center of each of them is off the center of the package PA. The pads 13A to 13D on the main surface of the semiconductor chip 4D, connected with the above-mentioned power MOSs QH1 and QL1, are disposed along the two sides of the semiconductor chip 4D that respective adjoin the semiconductor chips 4PH and 4PL over the main surface of the semiconductor chip 4D. Thus, the length of the wires WA can be further reduced, and the parasitic inductance produced in wiring paths can be further reduced.

The semiconductor chip 4D is so disposed that the distance between the semiconductor chip 4D and the semiconductor chip 4PH is shorter than the distance between the semiconductor chip 4D and the semiconductor chip 4PL. The wires WA are so formed that the following is implemented: the length of the wires WA that electrically connect the semiconductor chip 4D and the semiconductor chip 4PH (the source and gate of the power MOS QH1) is shorter than the length of the wires WA that electrically connect the semiconductor chip 4D and the semiconductor chip 4PL (the source and gate of the power MOS QL1). This makes it possible to reduce the switching loss in the semiconductor chip 4PH.

Over the main surface of the semiconductor chip 4D, there are disposed pads 13E for the respective signal input or signal output electrodes of the driver circuits DR1 and DR2 and pads 13F for reference potential GND electrode, in addition to the pads 13A to 13D. The pads 13E are electrically connected with leads 7L5(7L) through multiple wires WA. The pads 13F are electrically connected with the above-mentioned leads 7L4(7L) through multiple wires WA.

The above-mentioned differences in planar area between the semiconductor chips 4D, 4PH, and 4PL are for the following reason: the semiconductor chip 4D having the driver circuits DR1 and DR2 is a control circuit that controls the gates of the power MOSs QH1 and QL1, and thus it is desirable that its outer size should be reduced as much as possible with the overall size of the package taken into account; meanwhile, with respect to the power MOSs QH1 and QL1, it is desirable that the on-resistance produced in the transistors should be reduced as much as possible. Reduction in on-resistance can be accomplished by increasing a channel width per unit transistor cell area. For this reason, the semiconductor chips 4PH and 4PL and the semiconductor chip 4D are so formed that the outer size of the former is larger than the outer size of the latter. As illustrated in FIG. 2, the power MOS QL1 for low side is longer in on-time than the power MOS QH1 for high side. Therefore, it is required to reduce the on-resistance of the power MOS QL1 more than the on-resistance of the power MOS QH1. For this reason, the semiconductor chip 4PL and the semiconductor chip 4PH are so formed that the outer size of the former is larger than the outer size of the latter.

Description will be given to the configuration of the semiconductor chip 4PH with the above-mentioned power MOS QH1 formed therein.

Figure 12:
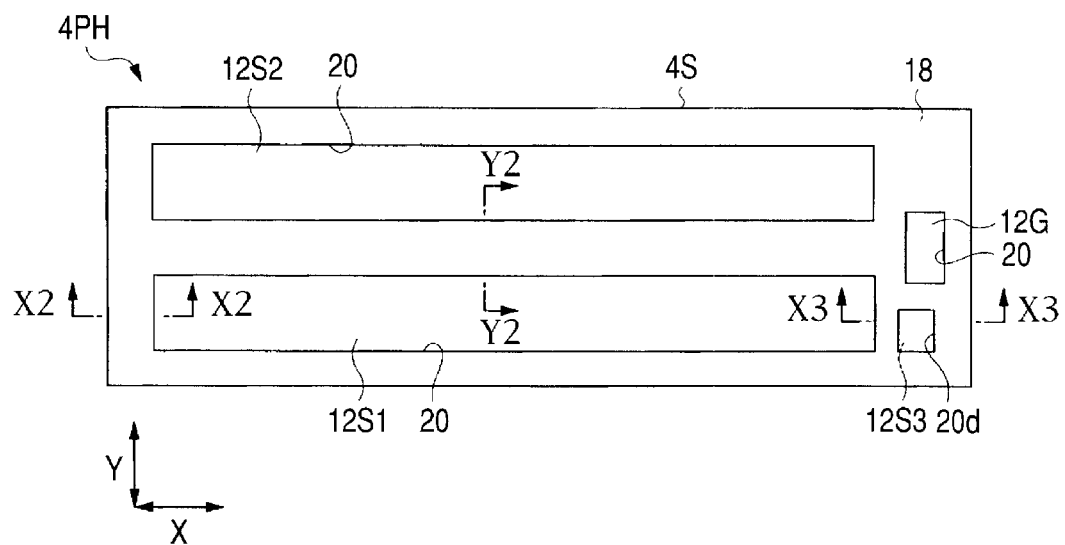
FIG. 12 is an overall plan view illustrating the uppermost layer of the semiconductor chip in FIG. 6 where a field effect transistor for high side is formed.
Figure 13:
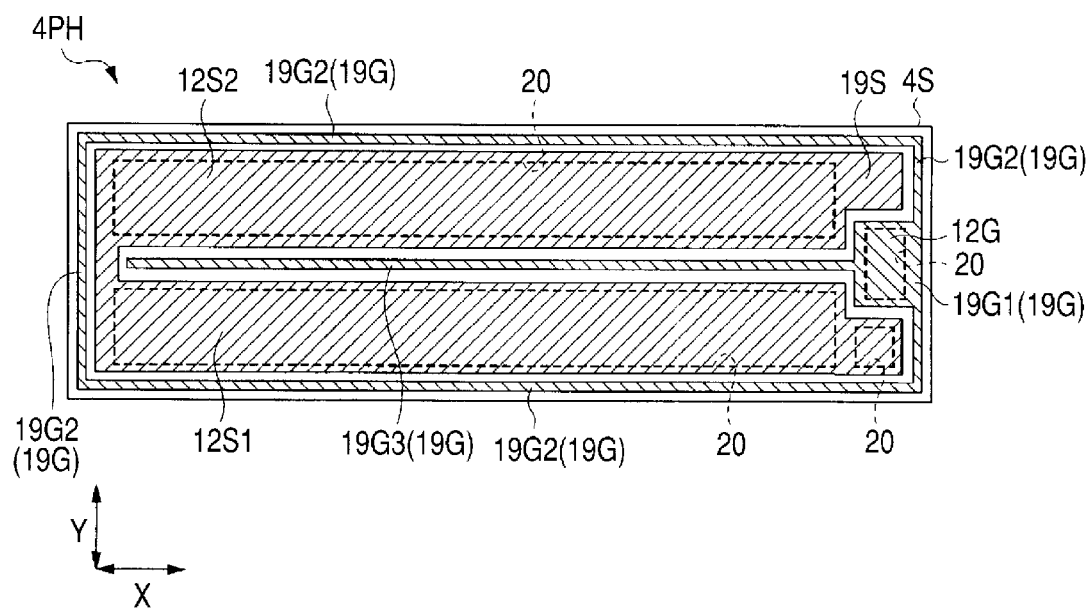
FIG. 13 is an overall plan view illustrating the uppermost wiring layer of the semiconductor chip in FIG. 12.
Figure 14:
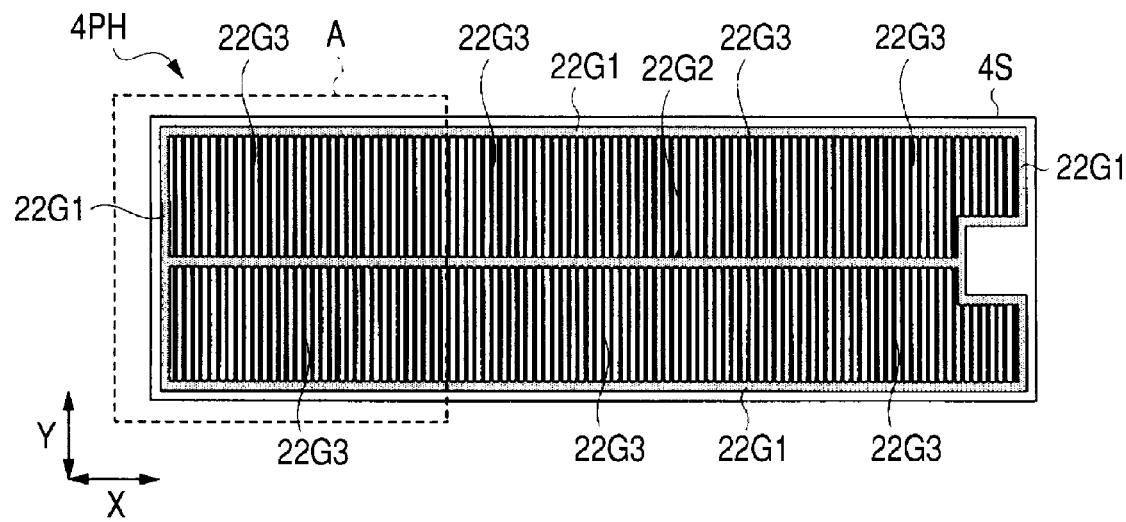
FIG. 14 is an overall plan view illustrating the gate electrode layer of the semiconductor chip in FIG. 12.
Figure 15:
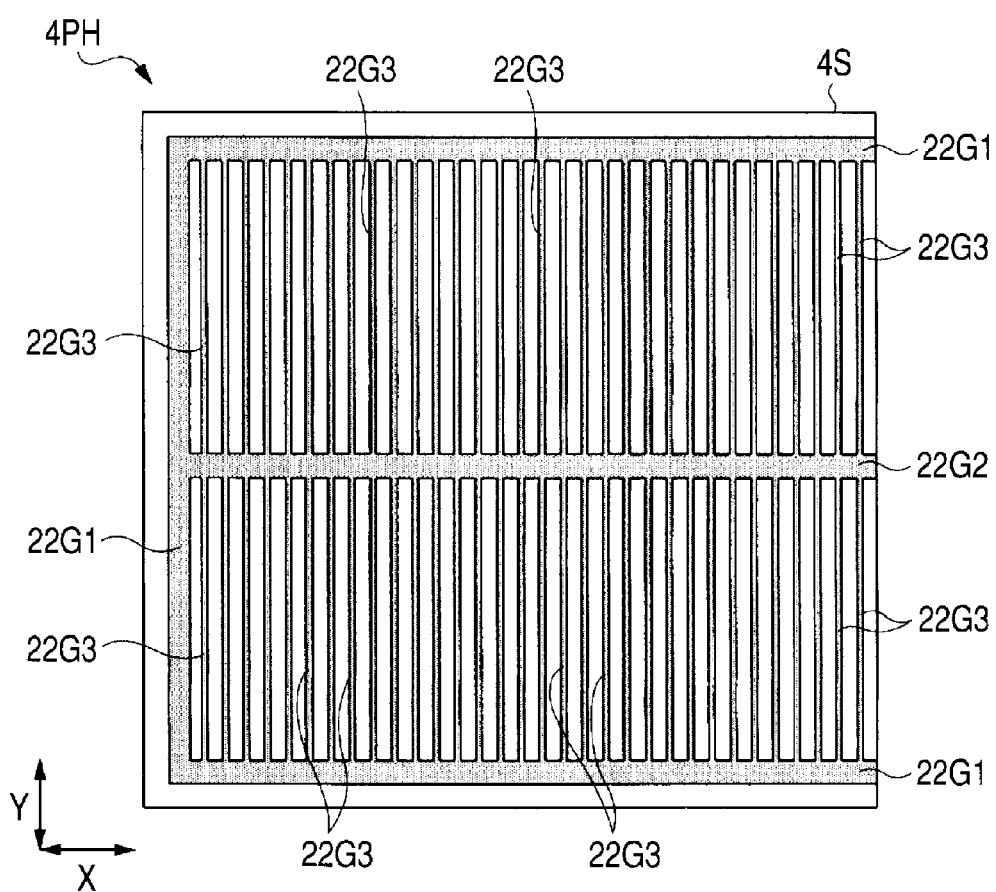
FIG. 15 is an enlarged plan view of region A of the semiconductor chip in FIG. 14.
Figure 16:
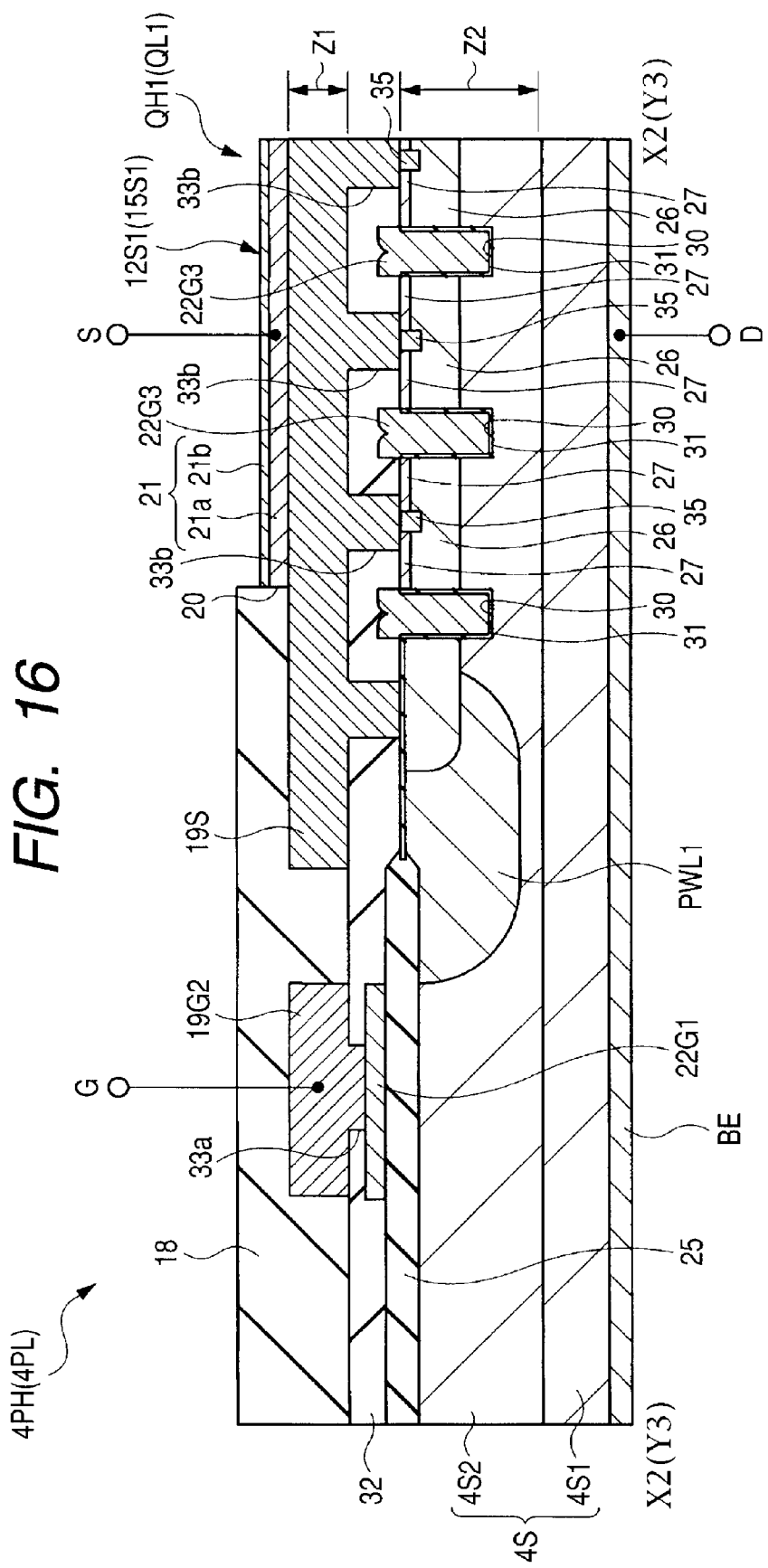
FIG. 16 is a sectional view taken along line X2-X2 of FIG. 12.
Figure 17:
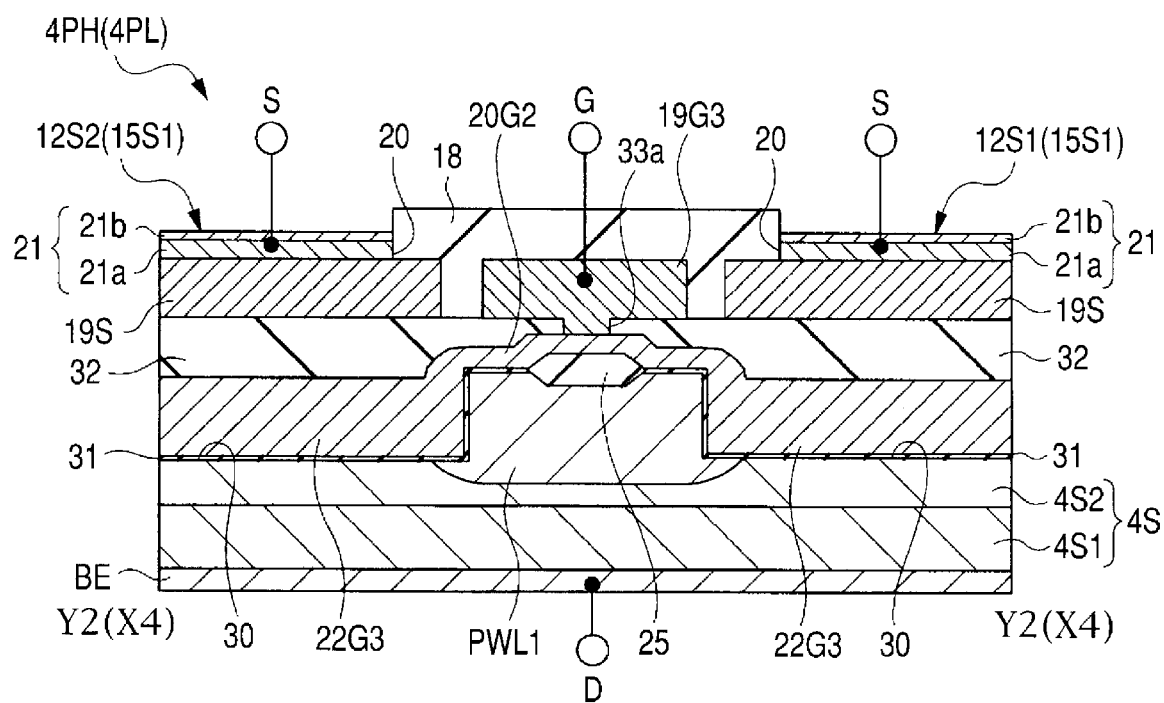
FIG. 17 is a sectional view taken along line Y2-Y2 of FIG. 12.
Figure 18:
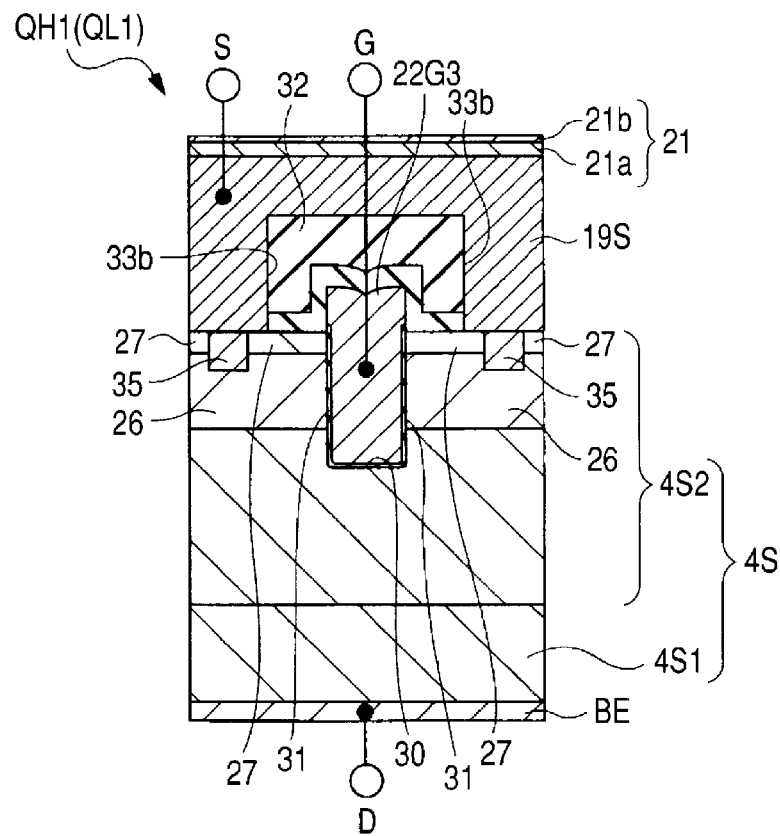
FIG. 18 is an enlarged sectional view of a unit transistor cell formed in the semiconductor chip in FIG. 16.
Figure 19:
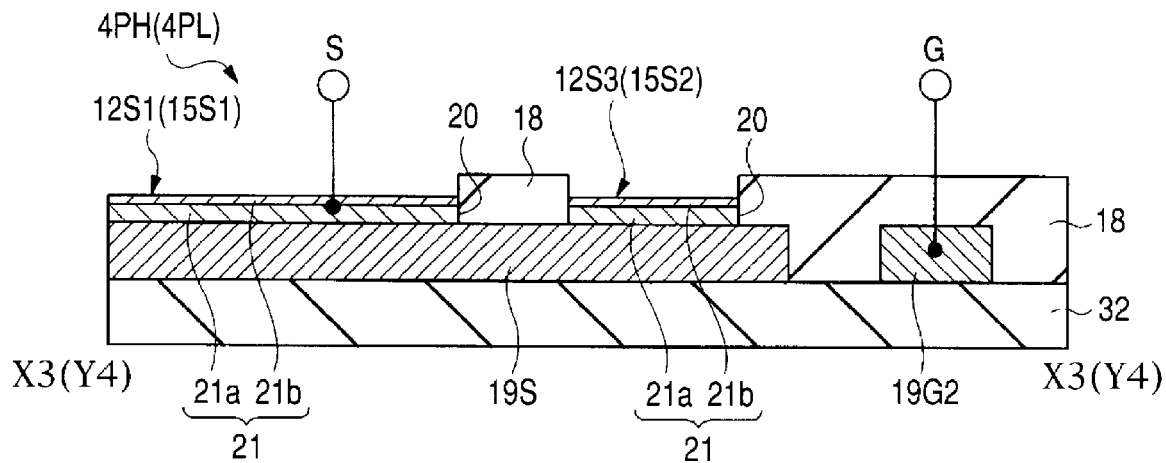
FIG. 19 is a sectional view taken along line X3-X3 of FIG. 12, illustrating the uppermost layer and the uppermost wiring layer.
Figure 20:
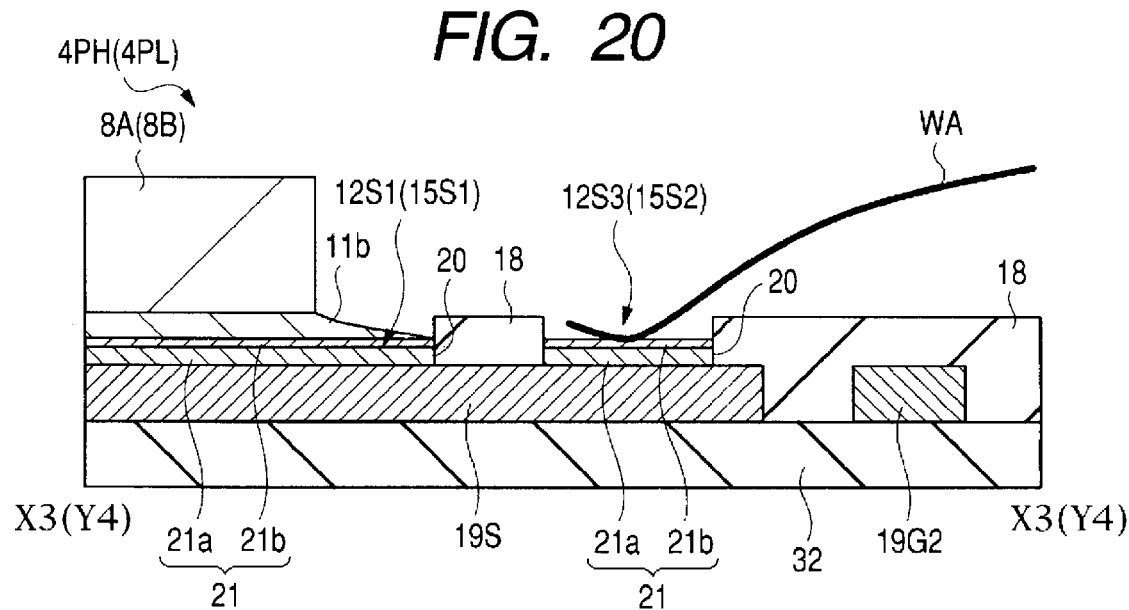
FIG. 20 is a sectional view of the uppermost layer and the uppermost wiring layer in FIG. 19 with a metal plate and a bonding wire added thereto.

FIG. 12 is an overall plan view illustrating the uppermost layer of the semiconductor chip 4PH; FIG. 13 is an overall plan view illustrating the uppermost wiring layer of the semiconductor chip 4PH; FIG. 14 is an overall plan view illustrating the gate electrode layer of the semiconductor chip 4PH; and FIG. 15 is an enlarged plan view of region A in the semiconductor chip 4PH in FIG. 14. FIG. 16 is a sectional view taken along line X2-X2 of FIG. 12; FIG. 17 is a sectional view taken along line Y2-Y2 of FIG. 12; FIG. 18 is an enlarged sectional view of a unit transistor cell in FIG. 16; FIG. 19 is a sectional view of the uppermost layer and the uppermost wiring layer of the semiconductor chip in FIG. 12, taken along line X3-X3 of FIG. 12; and FIG. 20 is a sectional view showing the uppermost layer and the uppermost wiring layer in FIG. 19 with a metal plate 8A and a wire WA added. Code G denotes the gate of the power MOS QH1 (or the power MOS QL1). In FIG. 13, the wiring in the uppermost wiring layer is hatched for making the drawing easier to understand. In FIG. 14 and FIG. 15, the gate wiring and the gate electrode are hatched for making the drawings easier to understand.

The planar shape of the semiconductor chip 4PH is, for example, the shape of rectangle whose length in the first direction X is longer than its length in the second direction Y. The semiconductor chip 4PH includes a main surface over which an element is formed (device formation surface: first main surface) and a back surface (back electrode formation surface: second main surface) positioned opposite to the device formation surface in the direction of the thickness of the semiconductor chip 4PH.

In the uppermost layer of the semiconductor chip 4PH, there is formed a protective film 18. The protective film 18 is formed, for example, of a laminated film of a silicon oxide ($SiO_2$) film and a silicon nitride ($Si_3N_4$) film or by forming an organic film such as a polyimide film over this laminated film.

In the wiring layer as the uppermost layer under this protective film 18, there are formed gate wiring 19G and source wiring 19S. The gate wiring 19G and the source wiring 19S are formed by stacking, for example, a barrier metal layer of titanium tungsten (TiW) or the like and a metal layer of aluminum (Al) or the like from below. The portions of the gate wiring 19G and the source wiring 19S other than the regions for the pads 12G and 12S1 to 12S3 are covered with the protective film 18.

In part of the protective film 18, there are formed openings 20 that expose part of the gate wiring 19G and the source wiring 19S thereunder. The portion of the gate wiring 19G exposed in one of the openings 20 is the pad 12G for gate electrode, and the portions of the source wiring 19S exposed in some of the openings 20 are the pads 12S1 to 12S3 for source electrode.

In the first embodiment, a metal layer 21 is formed over the entire surfaces of the pads 12G and 12S1 to 12S3 (the surfaces with which the metal plate 8A is brought into contact). The metal layer 21 is composed of a laminated film of a metal layer 21a formed over the gate wiring 19G and the source wiring 19S and a metal layer 21b formed thereover. The lower metal layer 21a is composed of, for example, nickel (Ni), and mainly has a function of suppressing or preventing oxidation of aluminum in the gate wiring 19G and source wiring 19S as the base. The upper metal layer 21b is composed of, for example, gold (Au), and mainly has a function of suppressing or preventing oxidation of nickel in the metal layer 21a as the base.

The metal layer 21a may be formed of titanium (Ti) in place of nickel. The metal layer 21b may be formed of vanadium in place of gold. The metal layer 21 is formed by, for example, electroless plating. In this case, the metal layers 21a and 21b react only with metal and does not react with the protective film 18; therefore, the metal layers 21a and 21b can be formed without a mask.

The reason for the provision of such a metal layer 21 is that the present inventors found for the first time that without the metal layer 21 formed, the following problem arises: when the metal layer 21 is not formed and the surface of aluminum in the gate wiring 19G and the source wiring 19S is exposed in the openings 20, the exposed surface of aluminum is oxidized. When the surfaces of the pads 12S1 and 12S2 are oxidized as mentioned above, the above-mentioned bonding layer 11b composed of solder, silver paste, or the like does not adhere to the pad 12S1 or 12S2 well. This results in degraded adhesion between the metal plate 8A and the pads 12S1 and 12S2 and an increased resistance value of the junctions between the metal plate 8A and the pads 12S1 and 12S2.

In the first embodiment, meanwhile, the metal layer 21 is formed over the surfaces of the pads 12G and 12S1 to 12S3, and as a result, it is possible to suppress or prevent oxidation in the surfaces of aluminum in the gate wiring 19G and the source wiring 19S. For this reason, the adhesion of the bonding layer 11b to the pads 12S1 and 12S2 can be enhanced, and thus the adhesion between the metal plate 8A and the pads 12S1 and 12S2 can be enhanced. Further, increase in the resistance value at the junctions between the metal plate 8A and the pads 12S1 and 12S2 can be avoided.

The metal layer 21 is not formed on the surfaces of the pads 13A to 13F on the semiconductor chip 4D. This is because the pads 13A to 13F are connected with wires WA. A more specific reason is as follows: in case of wire connection, bonding is carried out while the oxide films formed on the surfaces of the pads 13A to 13F are removed by ultrasonic vibration or the like; therefore, the metal layer 21 need not be formed.

The above-mentioned gate wiring 19G integrally includes a gate pad portion 19G1 and gate finger portions 19G2 and 19G3.

The gate pad portion 19G1 is a relatively wide region where the above-mentioned pad 12G is disposed. It is disposed in the center of the semiconductor chip 4PH in the direction of the short sides of the semiconductor chip 4PH (second direction Y) at one end of the semiconductor chip 4PH in the direction of its lengths (first direction X).

One gate finger portion 19G2 is formed in proximity to the periphery of the main surface of the semiconductor chip 4PH along the periphery. The other gate finger portion (gate wiring) 19G3 is formed in the center of the semiconductor chip 4PH in the direction of the short sides of the semiconductor chip 4PH (second direction Y) so that it is extended in the direction of the length of the semiconductor chip 4PH (first direction X). One end of the gate finger portion 19G3 is connected to the gate pad portion 19G1, and the other end is terminated in a position at a distance from the gate finger portion 19G2. Provision of such gate fingers 19G2 and 19G3 makes it possible to reduce the gate resistance of the power MOS QH1, and thus accommodate to increase in the current and frequency of the non-isolated DC-DC converter 1.

This gate wiring 19G is electrically connected to the gate wirings 22G1 and 22G2 and gate electrodes 22G3 positioned thereunder. The gate wirings 22G1 and 22G2 and the gate electrodes 22G3 are integrally formed of, for example, low-resistance polycrystalline silicon, and are electrically connected to each other.

One gate wiring 22G1 is formed in proximity to the periphery of the main surface of the semiconductor chip 4PH (directly under the gate finger portion 19G2) along the periphery. The other gate wiring 22G2 is formed in the center of the semiconductor chip 4PH in the direction of the short sides of the semiconductor chip 4PH (second direction Y) (directly under the above-mentioned gate finger portion 19G3) so that it is extended in the direction of the length of the semiconductor chip 4PH (first direction Y). Both ends of the gate wiring 22G2 in the direction of its length are connected with the gate wiring 22G1.

As illustrated in FIG. 14 and FIG. 15, the above-mentioned gate electrode 22G3 are disposed in a stripe pattern, for example. That is, the multiple gate electrodes 22G3 linearly extended in the direction of the short sides of the semiconductor chip 4PH (second direction Y) are disposed in line at desired intervals in the direction of the length of the semiconductor chip 4PH (first direction X). However, the planar shape of disposition of the gate electrodes 22G3 need not be a stripe pattern, and can be modified in various manners. For example, they may be disposed in a reticular planar pattern.

One end of each gate electrode 22G3 is connected to the gate wiring 22G2 in the center of the semiconductor chip 4PH, and the other end is connected to the gate wiring 22G1 on the periphery of the semiconductor chip 4PH. These individual gate electrodes 22G3 are members that form the gate electrode of a unit transistor cell of the power MOS QH1 for high side. The sum total of the lengths of the multiple gate electrodes 22G3 in the direction in which they are extended (the direction of the short sides of the semiconductor chip 4PH (second direction Y)) is equivalent to the gate width (channel width) of the power MOS QH1.

The above-mentioned source wiring 19S in the uppermost wiring layer of the semiconductor chip 4PH is disposed over the main surface of the semiconductor chip 4PH so that the following is implemented: it is disposed in a position encircled with the gate pad portion 19G1 and the gate finger portions 19G2 and 19G3 so that it is insulated from the gate pad portion 19G1 and the gate finger portions 19G2 and 19G3.

Though the pads 12S1 to 12S3 for source electrode are separated from one another by the protective film 18 in the uppermost layer as mentioned above, they are electrically connected to one another through the source wiring 19S. In the first embodiment, the protective film (insulating film) 18 is provided between the pad 12S1 with which the metal plate 8A is connected and the pad 12S3 with which a wire WA is connected. (Refer to, especially, FIG. 19 and FIG. 20.)

This is because the present inventors found for the first time that the following problem arises in a semiconductor device 2 in which a metal plate 8A and a wire WA exist in one and the same package PA: without the protective film 18 between the pad 12S1 with which the metal plate 8A is connected and the pad 12S3 with which a wire WA is connected, the bonding layer 11b such as solder or silver paste flows from the pad 12S1 to the pad 12S3 when the metal plate 8A is joined with the pads 12S1 and 12S2. As described later, a wire WA is connected to the pad 12S3 after the metal plate 8A is joined. In cases where the bonding layer 11b exists on the pad 12S3 when the wire WA is connected, the wire WA cannot be favorably connected.

In the first embodiment, to cope with this, the protective film 18 is provided between the pad 12S1 and the pad 12S3. Thus, when the metal plate 8A is joined with the pads 12S1 and 12S2 through the bonding layer 11b, the bonding layer 11b can be prevented from flowing to the adjacent pad 12S3 for wire WA connection, by the protective film 18. For this reason, it is possible to ensure that the bonding layer 11b does not exist on the expose surface of the pad 12S3 when a wire WA is connected; therefore, wires WA can be favorably connected to the pad 12S3. As a result, the yield and reliability of the semiconductor device 2 can be enhanced.

The semiconductor substrate (hereafter, simply referred to as substrate) 4S that constructs this semiconductor chip 4PH includes a semiconductor layer 4S1 of, for example, $n^+$-type single crystal silicon and an epitaxial layer 4S2 formed of, for example, $n^-$-type single crystal silicon, formed over the semiconductor layer. (Refer to, especially, FIG. 16 to FIG. 18.) Over the main surface of the epitaxial layer 4S2, there is formed a field insulating film 25 formed of, for example, silicon oxide ($SiO_2$ or the like). In the active region encircled with this field insulating film 25 and a p-type well PWL1 under the field insulating film, there are formed multiple unit transistor cells that construct the power MOS QH1. The power MOS QH1 is formed by connecting the multiple unit transistor cells in parallel.

Each unit transistor cell is formed of, for example, an n-channel power MOS of the trench gate structure. Adoption of the trench gate structure enables the microminiaturization of the unit transistor cell and the enhancement of the degree of integration.

The above-mentioned semiconductor layer 4S1 and epitaxial layer 4S2 have a function of the drain region of the unit transistor cell. Over the back surface of the substrate 4S (semiconductor chip 4PH), there is formed a back surface electrode BE for drain electrode. This back surface electrode BE is formed by stacking, for example, a titanium (Ti) layer, a nickel (Ni) layer, and a gold (Au) layer over the back surface of the substrate 4S in this order, and is electrically connected with the above-mentioned die pad 7D1.

A p-type semiconductor region 26 formed in the epitaxial layer 4S2 has a function of the channel formation region of the unit transistor cell. An $n^+$-type semiconductor region 27 formed above the p-type semiconductor region 26 has a function of the source region of the unit transistor cell.

In the substrate 4S, there is formed a trench 30 extended from its main surface in the direction of the thickness of the substrate 4S. The trench 30 is so formed that it penetrates the n$^+$-type semiconductor region 27 and the p-type semiconductor region 26 from the upper face of the n$^+$-type semiconductor region 27 and is terminated in the epitaxial layer 4S2 under the p-type semiconductor region. On the bottom face and side faces of the trench 30, there is formed a gate insulating film 31 composed of, for example, silicon oxide. In the trench 30, there is buried the above-mentioned gate electrode 22G3 with the gate insulating film 31 in-between. As mentioned above, these gate electrodes 22G3 are formed integrally with the gate wirings 22G1 and 22G2 and are electrically connected with them. The gate wirings 22G1 and 22G2 are electrically connected to the gate finger portions 19G2 and 19G3 through contact holes 33a formed in an insulating film 32 that covers the gate wirings.

The above-mentioned pads 12S1 to 12S3 for source electrode are electrically connected to the n$^+$-type semiconductor region 27 for source through contact holes 33b formed in the insulating film 32. The pads 12S1 to 12S3 for source electrode are electrically connected to p$^+$-type semiconductor regions 35 that are positioned at the upper part of the p-type semiconductor region 26 and are formed between the adjoining portions of the n$^+$-type semiconductor region 27. Thus, the pads 12S1 to 12S3 for source electrode are electrically connected to the p-type semiconductor region 26 for channel formation.

The operating current of such a unit transistor of the power MOS QH1 for high side flows between the epitaxial layer 4S2 for drain and the n$^+$-type semiconductor region 27 for source along the side faces of gate electrodes 22G3 (i.e., the side faces of trenches 30) in the direction of the thickness of the substrate 4S. That is, a channel is formed along the direction of the thickness of the semiconductor chip 4PH.

Description will be given to the configuration of the semiconductor chip 4PL with the above-mentioned power MOS QL1 formed therein.

Figure 21:
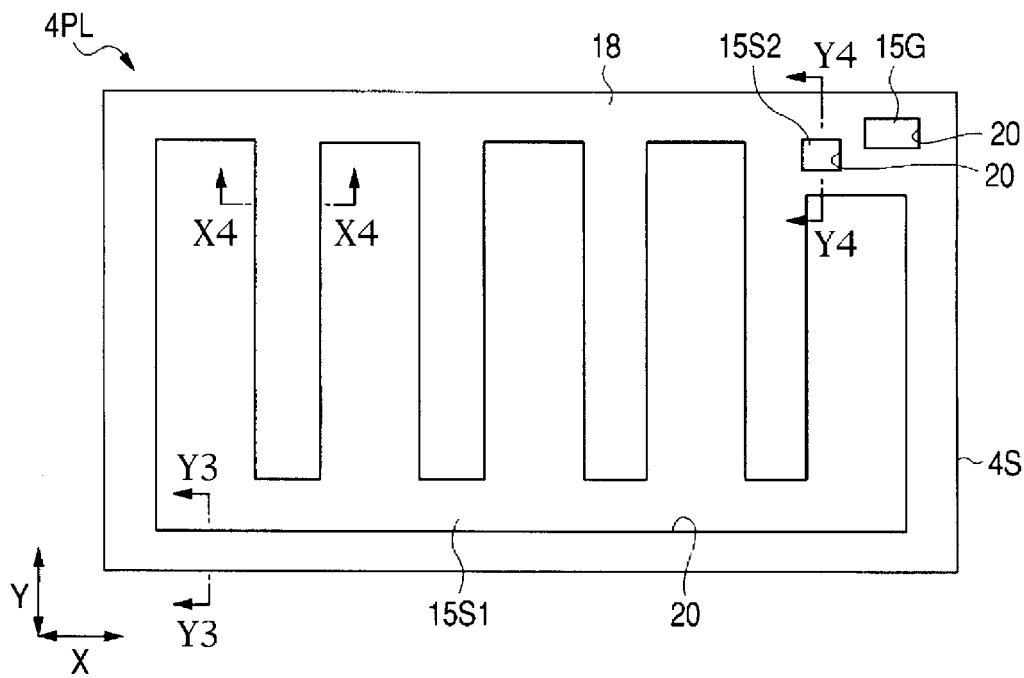
FIG. 21 is an overall plan view illustrating the uppermost layer of the semiconductor chip in FIG. 6 where a field effect transistor for low side is formed.
Figure 22:
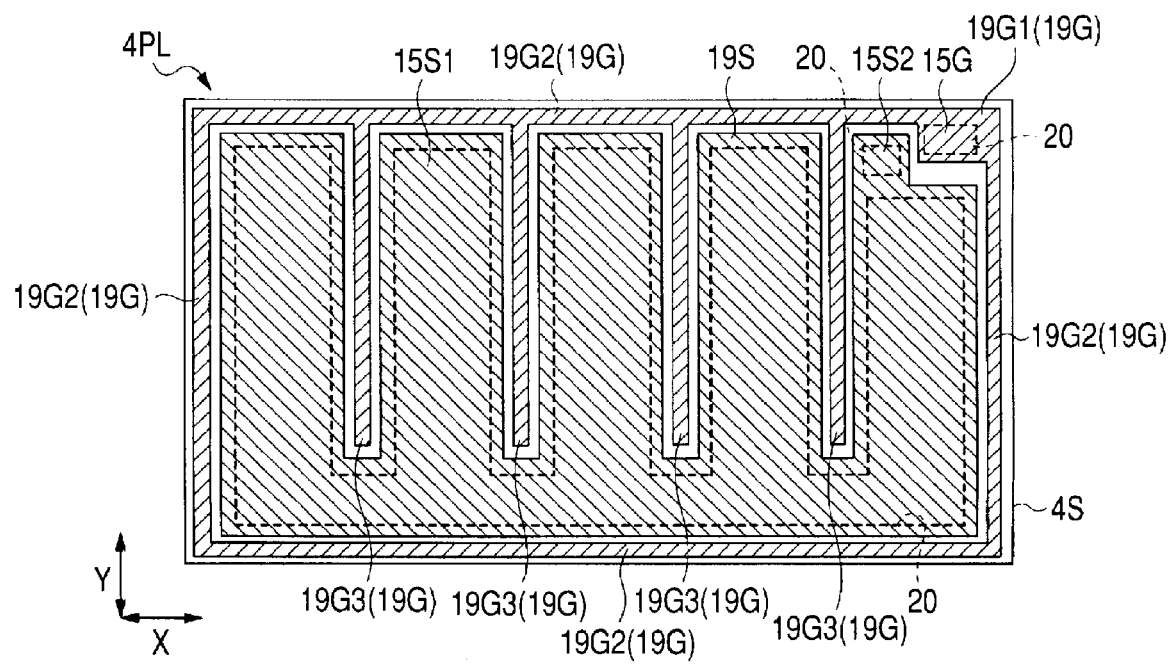
FIG. 22 is an overall plan view showing the uppermost wiring layer of the semiconductor chip in FIG. 21.
Figure 23:
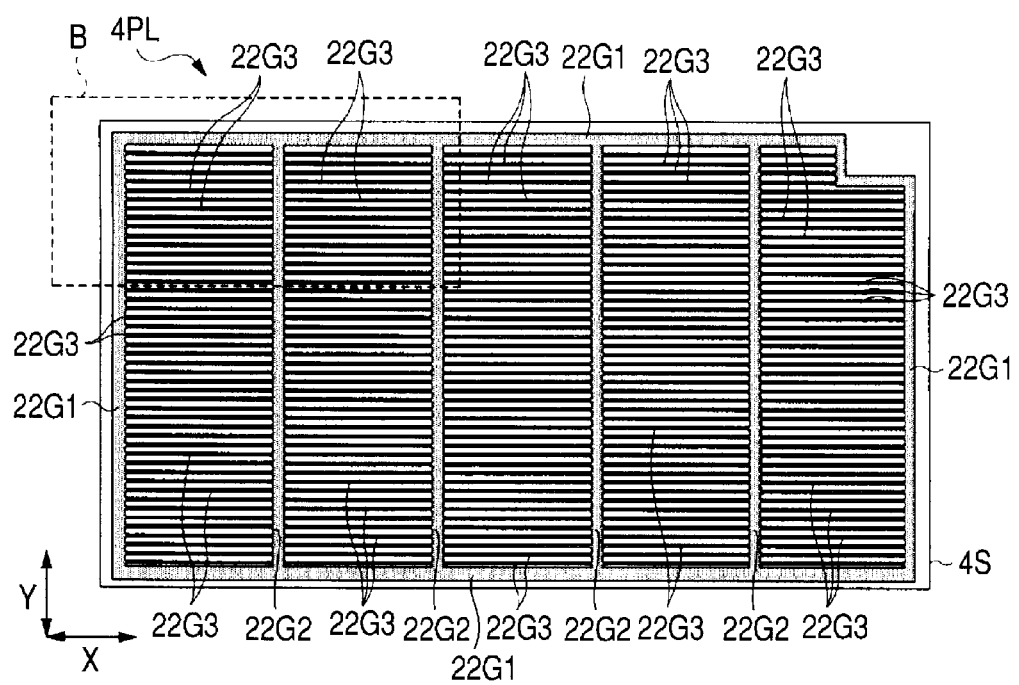
FIG. 23 is an overall plan view showing the gate electrode layer of the semiconductor chip in FIG. 21.
Figure 24:
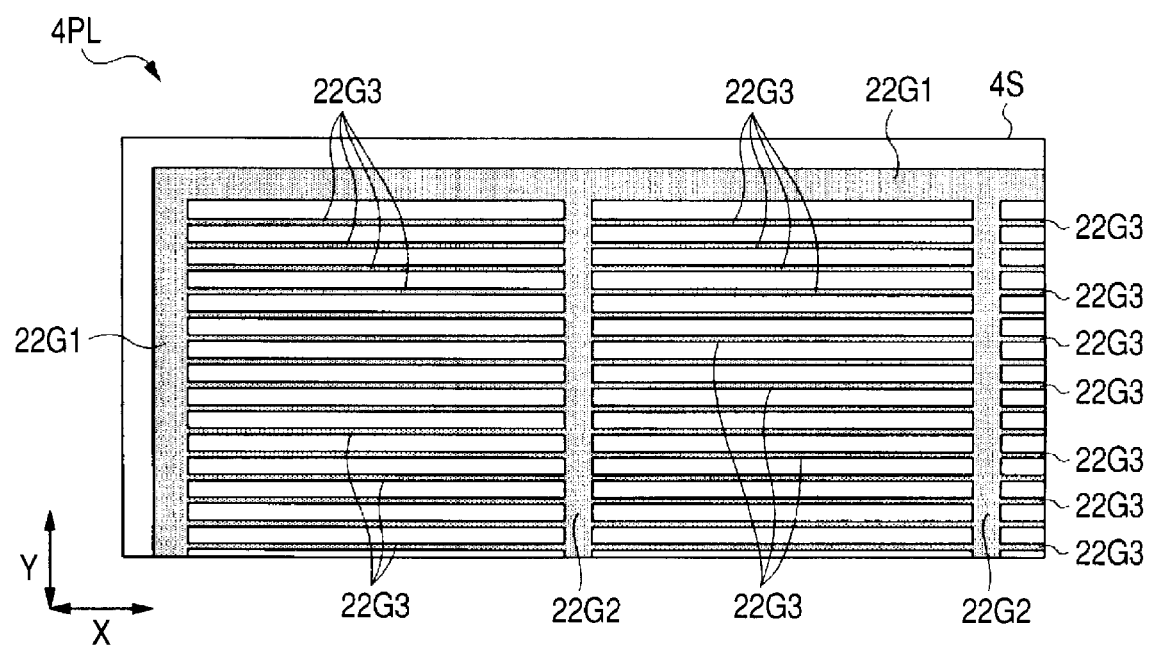
FIG. 24 is an enlarged plan view of region B of the semiconductor chip in FIG. 23.

FIG. 21 is an overall plan view illustrating the uppermost layer of the semiconductor chip 4PL; FIG. 22 is an overall plan view illustrating the uppermost wiring layer of the semiconductor chip 4PL; FIG. 23 is an overall plan view illustrating the gate electrode layer of the semiconductor chip 4PL; and FIG. 24 is an enlarged plan view of region B in the semiconductor chip 4PL illustrated in FIG. 23.

In FIG. 22, the wiring in the uppermost wiring layer is hatched for making the drawing easier to understand. In FIG. 23 and FIG. 24, gate wiring and gate electrodes are hatched for making the drawing easier to understand. The sectional configuration of the semiconductor chip 4PL is the same as that of the above-mentioned semiconductor chip 4PH with the power MOS QH1 formed therein. Therefore, the sectional configuration of the semiconductor chip 4PL will be described with reference to FIG. 16 to FIG. 20. That is, a sectional view taken along line X4-X4 of FIG. 21 is identical with FIG. 17. A sectional view taken along line Y3-Y3 of FIG. 21 is identical with FIG. 16. A sectional view taken along line Y4-Y4 of FIG. 21 is identical with FIG. 19 and FIG. 20. The sectional configuration of a unit transistor in the power MOS QL1 for low side is identical with that illustrated in FIG. 18.

The planar shape of the semiconductor chip 4PL is, for example, the shape of oblong whose length in the first direction X is longer than its length in the second direction Y. The semiconductor chip 4PL includes a main surface over which an element is formed (device formation surface: first main surface) and a back surface (back electrode formation surface: second main surface) positioned opposite to the device formation surface in the direction of the thickness of the semiconductor chip 4PL.

Also, in the uppermost layer of the semiconductor chip 4PH, there is formed the same protective film 18 as the foregoing. In part of this protective film 18, there are formed openings 20 that expose part of the gate wiring 19G and the source wiring 19S as the wiring layer in the uppermost layer thereunder. The portion of the gate wiring 19G exposed in one of the openings 20 is the pad 15G for gate electrode, and the portions of the source wiring 19S exposed in some of the openings 20 are the pads 15S1 and 15S2 for source electrode. The portions of the gate wiring 19G and the source wiring 19S other than the regions for the pads 15G, 15S1, and 15S2 are covered with the protective film 18.

Also, in the first embodiment, the above-mentioned metal layer 21 is formed over the entire surfaces of the pads 15G, 15S1, and 15S2 (the surfaces with which the metal plate 8B is brought into contact). As the result of the metal layer 21 being formed over the surfaces of the pads 15G, 15S1, and 15S2 as mentioned above, it is possible to suppress or prevent oxidation of the surface of aluminum in the gate wiring 19G and the source wiring 19S in the semiconductor chip 4PL as in the foregoing. For this reason, the adhesion of the bonding layer 11b to the pad 15S1 can be enhanced, and thus the adhesion between the metal plate 8B and the pad 15S1 can be enhanced. Further, increase in the resistance value at the junction between the metal plate 8B and the pad 15S1 can be avoided.

The above-mentioned gate wiring 19G of the semiconductor chip 4PL integrally includes a gate pad portion 19G1 and gate finger portions 19G2 and 19G3.

The gate pad portion 19G1 of the semiconductor chip 4PL is a relatively wide region where the above-mentioned pad 15G is disposed. It is disposed in proximity to a corner at which a long side and a short side of the semiconductor chip 4PL intersect each other.

The gate finger portion 19G2 of the semiconductor chip 4PL is formed in proximity to the periphery of the main surface of the semiconductor chip 4PL along the periphery. The multiple gate finger portions 19G3 of the semiconductor chip 4PL are disposed at predetermined intervals along the direction of the length of the semiconductor chip 4PL so that they divide the main surface of the semiconductor chip 4PL into multiple sections in the direction of the length of the semiconductor chip 4PL (first direction X). Each gate finger portion 19G3 is extended from part of the gate finger portion 19G2 that is extended along that of the semiconductor chip 4PL positioned on the side where the gate pad portion 19G1 is disposed, of the long sides of the semiconductor chip 4PL toward the gate finger portion 19G2 on the opposite side. The gate finger portions 19G3 are extended along the direction of the short sides of the semiconductor chip 4PL (second direction Y), and are terminated in positions at a distance from the gate finger 19G2 on the opposite side. For this reason, in the first embodiment, the semiconductor chips 4PH and 4PL are so disposed that their respective gate finger portions 19G3 intersect (are orthogonal to) each other. Provision of these gate fingers 19G2 and 19G3 makes it possible to reduce the gate resistance of the power MOS QL1 for low side, and thus accommodate to increase in the current and frequency of the non-isolated DC-DC converter 1.

This gate wiring 19G of the semiconductor chip 4PL is electrically connected to the gate wirings 22G1 and 22G2 and gate electrodes 22G3 positioned thereunder as in the foregoing. Also, in case of the semiconductor chip 4PL, the material of the gate wirings 22G1 and 22G2 and gate electrodes 22G3 is the same as mentioned above.

The gate wiring 22G1 of the semiconductor chip 4PL is formed in proximity to the periphery of the main surface of the semiconductor chip 4PL (directly under the gate finger portion 19G2). The gate wiring 22G2 is disposed directly under the gate finger portions 19G3. That is, the multiple gate wirings 22G2 are disposed at predetermined intervals along the direction of the length of the semiconductor chip 4PL so that they divide the main surface of the semiconductor chip 4PL into multiple sections in the direction of the length of the semiconductor chip 4PL (first direction X). Each of the gate wirings 22G2 has its both ends in the direction of their length (second direction Y) connected with the gate wiring 22G1.

As illustrated in FIG. 23 and FIG. 24, the gate electrodes 22G3 of the semiconductor chip 4PL are disposed in a stripe pattern, for example. That is, the multiple gate electrodes 22G3 linearly extended in the direction of the long sides of the semiconductor chip 4PL (first direction X) are disposed in line at desired intervals in the direction of the short sides of the semiconductor chip 4PL (second direction Y). Also, in this case, however, the planar shape of disposition of the gate electrodes 22G3 need not be a stripe pattern, and can be modified in various manners. For example, they may be disposed in a reticular planar shape.

The individual gate electrodes 22G3 are members that form the gate electrode of a unit transistor cell of the power MOS QL1 for low side. The sum total of the widths of the multiple gate electrodes 22G3 in the direction in which they are extended (the direction of the length of the semiconductor chip 4PL (first direction X)) is equivalent to the gate width (channel width) of the power MOS QL1.

The source wiring 19S in the uppermost wiring layer of the semiconductor chip 4PL is disposed over the main surface of the semiconductor chip 4PH so that the following is implemented: it is disposed in a position encircled with the gate pad portion 19G1 and the gate finger portions 19G2 and 19G3 so that it is insulated from the gate pad portion 19G1 and the gate finger portions 19G2 and 19G3.

Though the pads 15S1 and 15S2 for source electrode of the semiconductor chip 4PL are separated from each other by the protective film 18 in the uppermost layer as mentioned above, they are electrically connected to each other through the source wiring 19S. The protective film (insulating film) 18 is provided between the pad 15S1 with which the metal plate 8B is connected and the pad 15S2 with which a wire WA is connected for the same reason as the foregoing. (Refer to, especially, FIG. 19 and FIG. 20.) This makes it possible to, when the metal plate 8B is joined with the pad 15S1 through the bonding layer 11b, prevent the bonding layer 11b from flowing to the adjacent pad 15S2 for wire WA connection, by the protective film 18. For this reason, it is possible to ensure that the bonding layer 11b does not exist on the exposed surface of the pad 15S2 when a wire WA is connected; therefore, wires WA can be favorably connected to the pad 15S2. As a result, the yield and reliability of the semiconductor device 2 can be enhanced.

The substrate 4S that constructs this semiconductor chip 4PL includes a semiconductor layer 4S1 of, for example, $n^+$-type single crystal silicon and an epitaxial layer 4S2 formed of, for example, $n^-$-type single crystal silicon over the semiconductor layer. Over the main surface of the epitaxial layer 4S2, there is formed the same field insulating film 25 as mentioned above. In the active region encircled with this field insulating film 25 and a p-type well PWL1 under the field insulating film, there are formed multiple unit transistor cells that construct the power MOS QL1. The power MOS QL1 is formed by connecting the multiple unit transistor cells in parallel. Each unit transistor cell is formed of, for example, an n-channel power MOS of the trench gate structure. Adoption of the trench gate structure enables the microminiaturization of the unit transistor cell and the enhancement of the degree of integration.

The above-mentioned semiconductor layer 4S1 and epitaxial layer 4S2 have a function of the drain region of the unit transistor cell. Over the back surface of the substrate 4S (semiconductor chip 4PL), there is formed a back surface electrode BE for drain electrode. This back surface electrode BE is formed of, for example, gold (Au), and is electrically connected with the above-mentioned die pad 7D2.

A p-type semiconductor region 26 formed in the epitaxial layer 4S2 has a function of the channel formation region of the unit transistor cell. An $n^+$-type semiconductor region 27 formed above the p-type semiconductor region 26 has a function of the source region of the unit transistor cell.

In the substrate 4S, there is formed a trench 30 as in the foregoing. On the bottom face and side faces of the trench 30, there is formed the gate insulating film 31 as in the foregoing. In the trench 30, there is buried the above-mentioned gate electrode 22G3 of the power MOS QL1 for low side with the gate insulating film 31 in-between. As mentioned above, these gate electrodes 22G3 are formed integrally with the gate wirings 22G1 and 22G2 and are electrically connected with them. The gate wirings 22G1 and 20G2 are electrically connected to the gate finger portions 19G2 and 19G3 through contact holes 33a formed in an insulating film 32 that covers the gate wirings.

The above-mentioned pads 15S1 and 15S2 for source electrode are electrically connected to the $n^+$-type semiconductor region 27 for source through contact holes 33b formed in the insulating film 32. The pads 15S1 and 15S2 for source electrode are electrically connected to $p^+$-type semiconductor regions 35 that are positioned at the upper part of the p-type semiconductor region 26 and are formed between the adjacent portions of the $n^+$-type semiconductor region 27. Thus, the pads 15S1 and 15S2 for source electrode are electrically connected to the p-type semiconductor region 26 for channel formation.

The operating current of such a unit transistor of the power MOS QL1 for low side flows between the epitaxial layer 4S2 for drain and the $n^+$-type semiconductor region 27 for source along the side faces of the gate electrodes 22G3 (i.e., the side faces of trenches 30) in the direction of the thickness of the substrate 4S. That is, a channel is formed along the direction of the thickness of the semiconductor chip 4PL.

In cases where the semiconductor device is so constructed that the pads 12S1 and 12S2 for source electrode of the semiconductor chip 4PH and the die pad 7D2 are connected to each other through wires and the pad 15S1 for source electrode of the semiconductor chip 4PL and the lead wiring 7LB are connected to each other through wires, a problem arises. Since the above-mentioned aluminum spreading resistance is increased, reduction in the thickness of the source wiring 19S (gate wiring 19G) can be hindered.

This aluminum spreading resistance is defined as the resistance formed in the direction along the main surfaces of the semiconductor chips 4PH and 4PL in the wiring (i.e., the source wiring 19S and the gate wiring 19G) in the uppermost wiring layer formed of aluminum or the like. In a semiconductor chip 4PL in which a power MOS QL1 for low side is formed, points of wire connection must be positioned in proximity to the periphery of the semiconductor chip 4PL. As a result, the distance from a point of wire junction to a unit transistor positioned close to the center of the semiconductor chip 4PL is increased, and the aluminum spreading resistance is especially increased. The reason why the points of wire junction must be positioned in proximity to the periphery of the semiconductor chip 4PL on the side of the semiconductor chip 4PL is as follows: if a point of wire junction is positioned close to the center of the semiconductor chip 4PL, the height of a wire loop is increased, and a wire is exposed from the package PA; therefore, a wire cannot be connected in a position too far from the lead wiring 7LB.

Meanwhile, the first embodiment uses the metal plates 8A and 8B in place of wires, which makes it possible to reduce the aluminum spreading resistance. For this reason, the thickness of the wiring in the uppermost wiring layer of the semiconductor chips 4PH and 4PL (i.e., the source wiring 19S and the gate wiring 19G) can be reduced.

The thickness of the source wiring 19S and gate wiring 19G of the semiconductor chips 4PH and 4PL is required to be sufficient to conceal a step in the gate wirings 22G1 and 22G2 gate electrodes 22G3 as a base. (The thickness of the source wiring 19S and gate wiring 19G must be equivalent to, for example, the thickness (approximately, 1 µm) of the insulating film 32 as a base.) In the first embodiment, the thickness Z1 of the source wiring 19S and the gate wiring 19G can be made thinner than the thickness Z2 of the above-mentioned epitaxial layer 4S2. The thickness Z2 of the epitaxial layer 4S2 is, for example, 4 µm or so.

Since the thickness of the gate wiring 19G and source wiring 19S of the semiconductor chips 4PH and 4PL can be reduced, as mentioned above, the steps of processing the gate wiring 19G and source wiring 19S of the semiconductor chips 4PH and 4PL can be facilitated; therefore, the cost of the semiconductor device 2 can be reduced. As described later, the degree of freedom in the disposition of the gate finger portions 19G3 of the semiconductor chip 4PL with the power MOS QL1 for low side formed therein can be enhanced. Therefore, the electrical characteristics of the semiconductor device 2 can be enhanced.

Description will be given to the effect of the above-mentioned semiconductor device 2.

Figure 25:
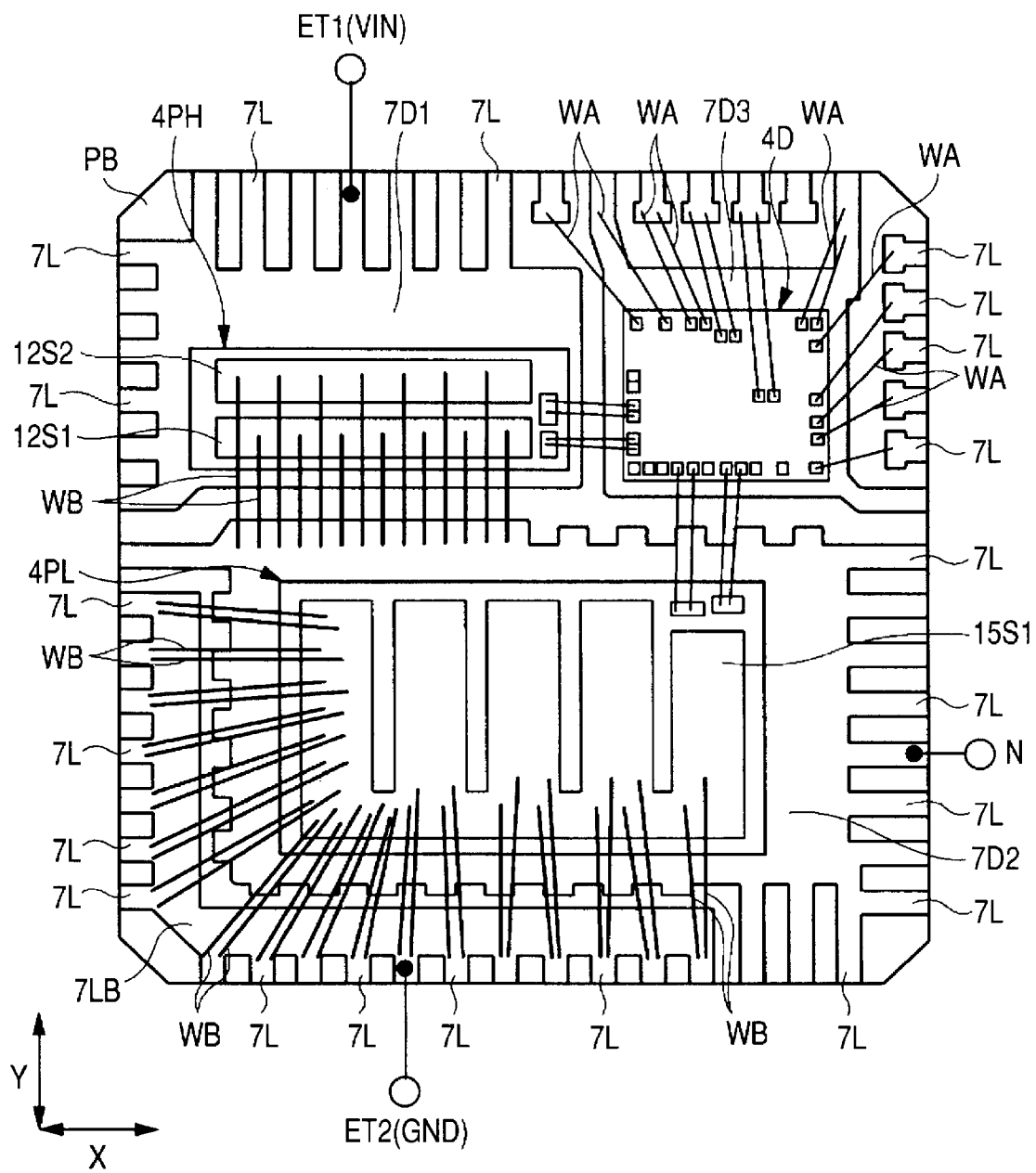
FIG. 25 is an overall plan view of a semiconductor device investigated by the present inventors.

FIG. 25 is an overall plan view of a semiconductor device the present inventors investigated. FIG. 25 also shows the interior of a package PB in a see-through manner. In this semiconductor device, the pads 12S1 and 12S2 for source electrode on a semiconductor chip 4PH and a die pad 7D2 are electrically connected with each other through multiple wires WB, and the pad 15s1 for source electrode on a semiconductor chip 4PL and a lead wiring 7LB are electrically connected with each other through multiple wires WB. The other aspects of the semiconductor device are the same as the semiconductor device 2.

Figure 26:
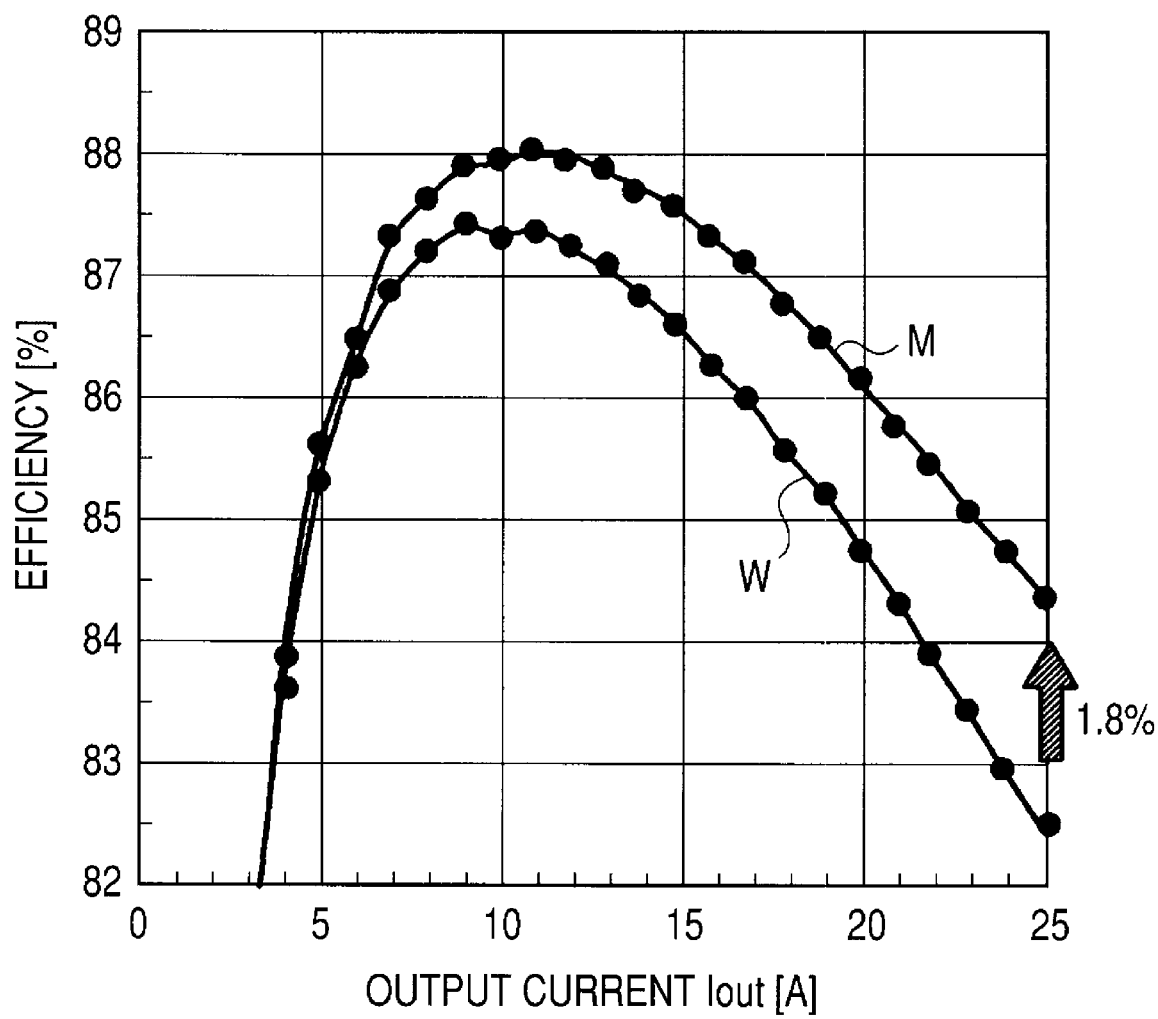
FIG. 26 is a graph chart in which a semiconductor device in an embodiment of the invention and the semiconductor device in FIG. 25 are compared with each other for voltage conversion efficiency.

FIG. 26 is a graph chart in which a semiconductor device 2 in the first embodiment and the semiconductor device in FIG. 25 are compared with each other for voltage conversion efficiency. Code M represents the result of measurement with the semiconductor device 2 in the first embodiment, and W represents the result of measurement with the semiconductor device in FIG. 25. Test conditions were as follows: input power supply VIN was 12V; output current Iout was 25 A; output voltage Vout was 1.3V; and operating frequency was 1 MHz. In the semiconductor device 2 in the first embodiment, the voltage conversion efficiency was enhanced by 1.8% or so relative to the semiconductor device in FIG. 25.

Figure 27:
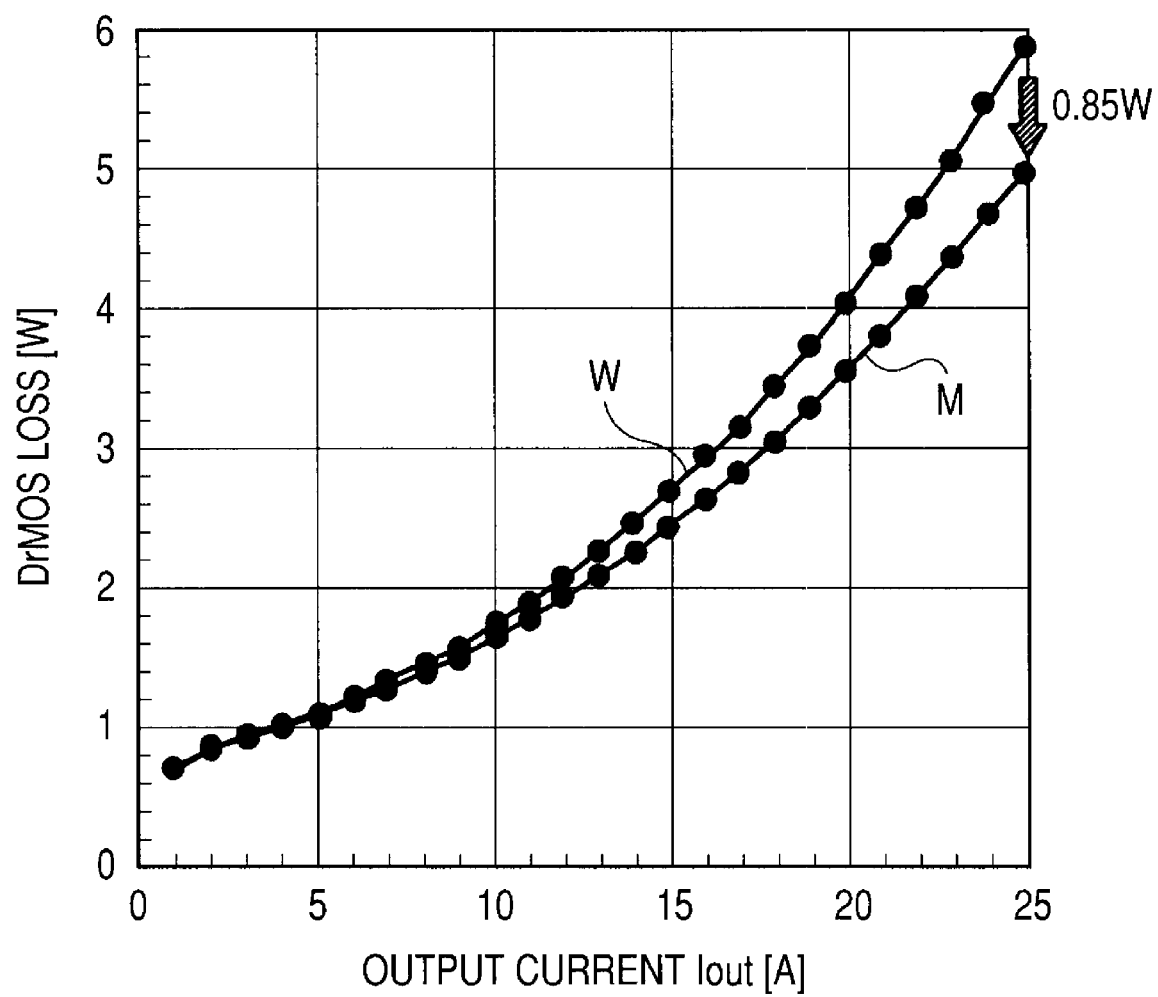
FIG. 27 is a graph chart in which a semiconductor device in an embodiment of the invention and the semiconductor device in FIG. 25 are compared with each other for loss.

FIG. 27 is a graph chart in which a semiconductor device 2 in the first embodiment and the semiconductor device in FIG. 25 are compared with each other for loss. Test conditions are the same as those for voltage conversion efficiency measurement the result of which is indicated in FIG. 26. In the semiconductor device 2 in the first embodiment, the loss was reduced by 0.85 W or so relative to the semiconductor device in FIG. 25.

Figure 28:
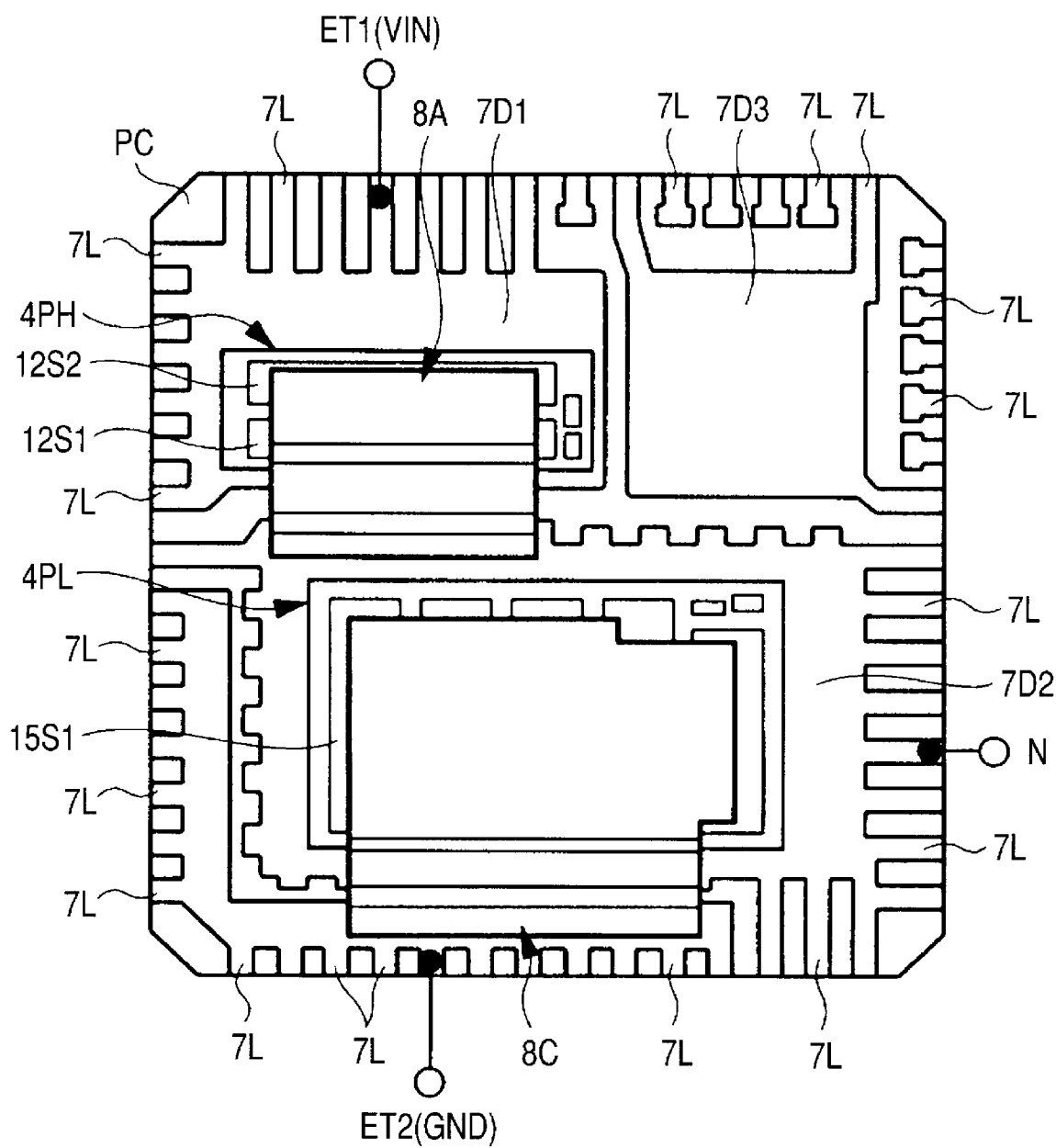
FIG. 28 is an overall plan view of another semiconductor device investigated by the present inventors.
Figure 29:
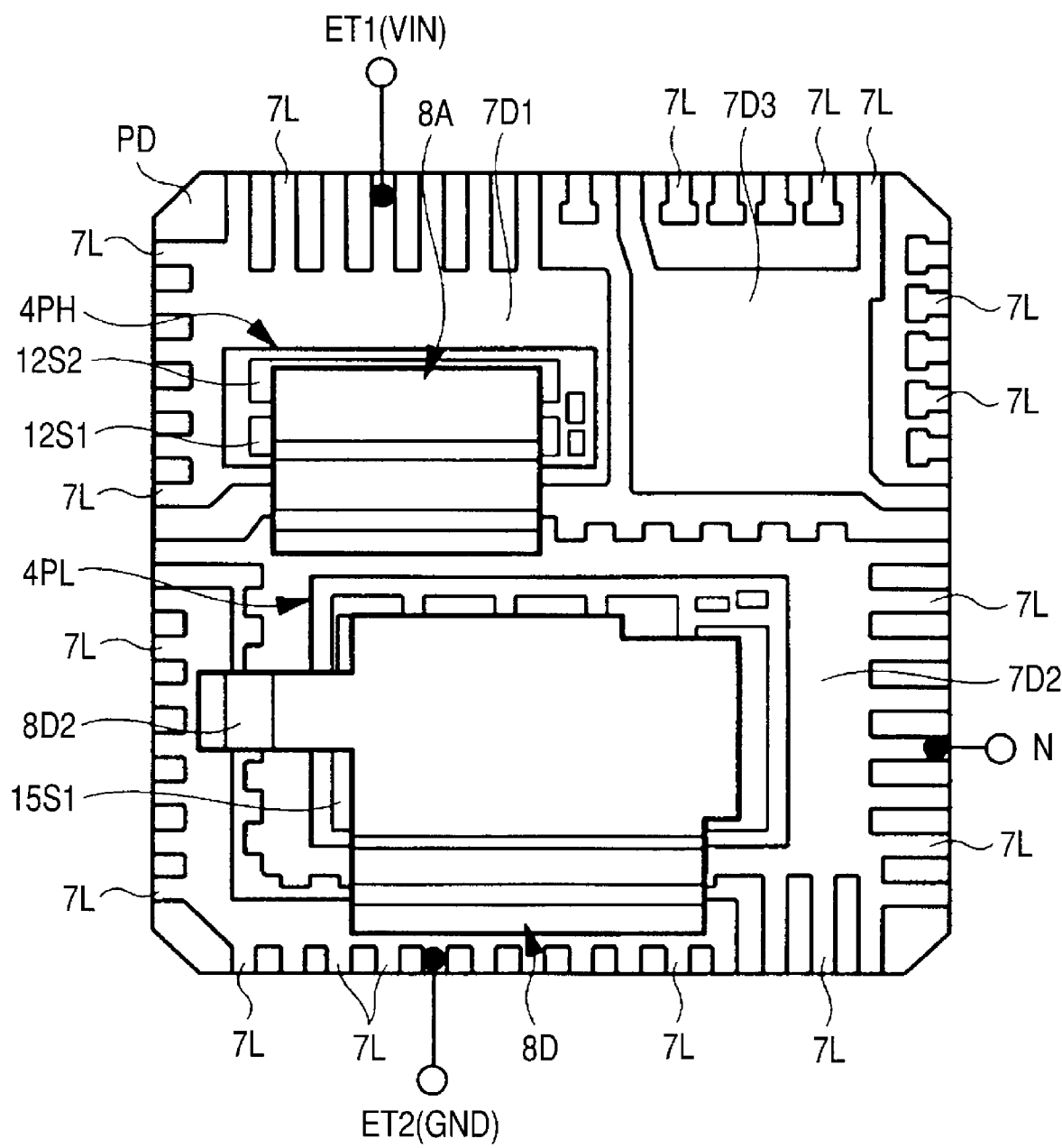
FIG. 29 is an overall plan view of another semiconductor device investigated by the present inventors.

FIG. 28 and FIG. 29 are overall plan views of other semiconductor devices the present inventors investigated. FIG. 28 and FIG. 29 also show the interior of packages PC and PD in a see-through manner. In FIG. 28 and FIG. 29, the semiconductor chip 4D is omitted.

In the semiconductor device in FIG. 2, there is not the above-mentioned second portion in the metal plate 8C attached to the semiconductor chip 4PL. As for the other respects, this semiconductor device is identical with the semiconductor device 2.

The following was found as the result of the investigation by the present inventors: in case of the semiconductor device in FIG. 28, the on-resistance can be reduced as compared with the semiconductor device in FIG. 25, and thus the conduction loss can be reduced. However, in the semiconductor device in FIG. 28, the inductance is increased and thus the switching loss is increased as compared with the semiconductor device in FIG. 25.

In the semiconductor device in FIG. 29, the second portion 8D2 is integrally provided in the metal plate 8D attached to the semiconductor chip 4PL. However, its width (its length in the direction of the short sides of the semiconductor chip 4PL) is narrower than the second portion 8B2 of the metal plate 8B of the semiconductor device 2 in the first embodiment. With respect to the other respects, this semiconductor device is identical with the semiconductor device 2.

The following was found as the result of investigation by the present inventors: in case of the semiconductor device in FIG. 29, the on-resistance and the conduction loss can be reduced as compared with the semiconductor device in FIG. 28. Further, the inductance and the switching loss can be reduced as compared with the semiconductor device in FIG. 25.

Further, the following was found as the result of investigation by the present inventors: in case of the semiconductor device 2 in the first embodiment, the on-resistance and the conduction loss can be further reduced as compared with the semiconductor device in FIG. 29. In addition, the inductance and the switching loss can be further reduced as compared with the semiconductor device in FIG. 29. Therefore, the semiconductor device 2 in this embodiment produces higher effect when the operating frequency is high.

Figure 30:
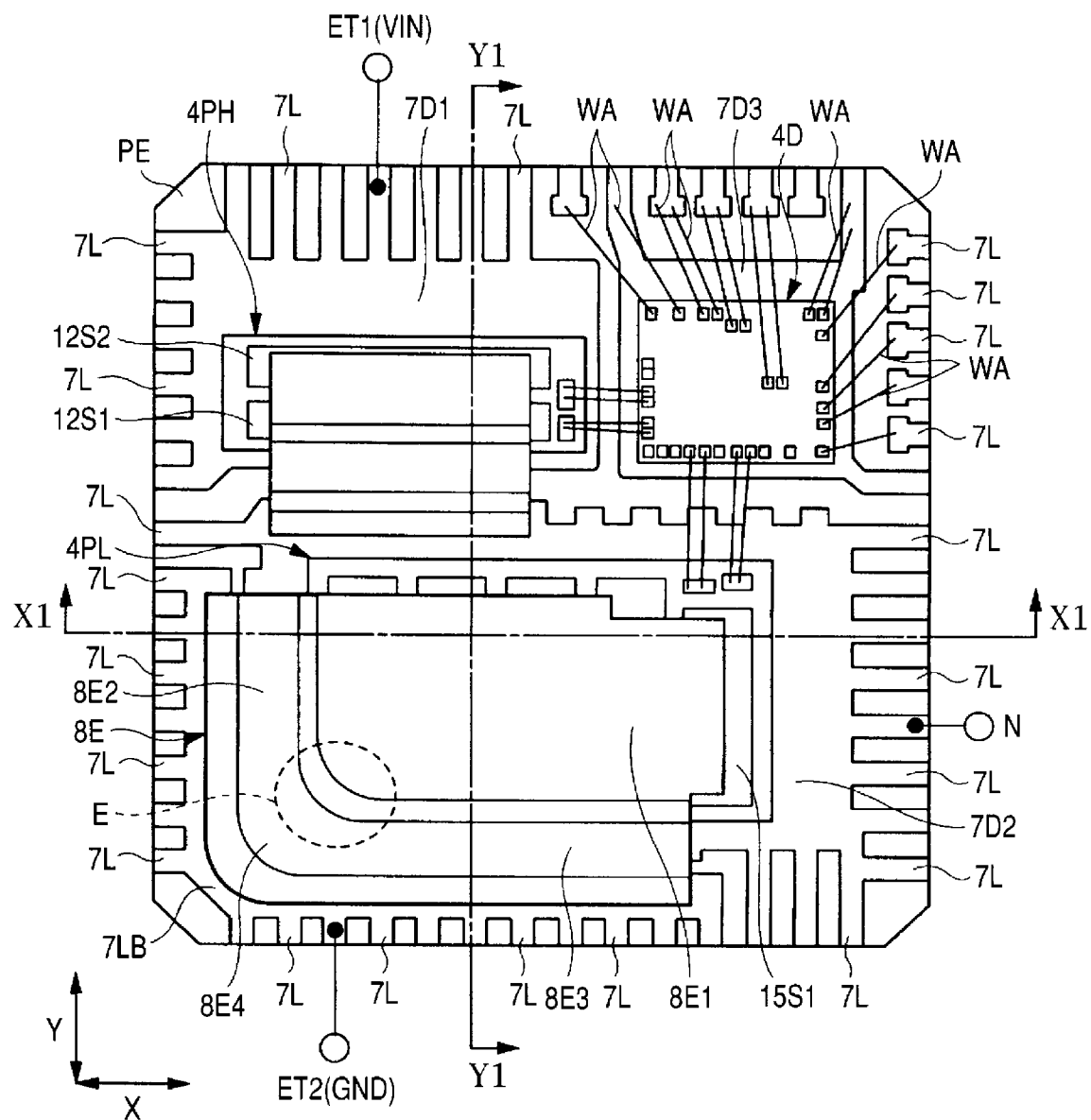
FIG. 30 is an overall plan view of further another semiconductor device investigated by the present inventors.

FIG. 30 is an overall plan view of another semiconductor device the present inventors investigated. FIG. 30 also shows the interior of a package PE in a see-through manner. A sectional view taken along line X1-X1 of FIG. 30 is identical with FIG. 7. A sectional view taken along line Y1-Y1 of FIG. 30 is identical with FIG. 8.

The metal plate 8E joined with the semiconductor chip 4PL includes a first portion 8E1, a second portion 8E2, a third portion 8E3, and a fourth portion 8E4. The first portion 8E1, second portion 8E2, and third portion 8E3 are equivalent to the first portion 8B1, second portion 8B2, and third portion 8B3 of the above-mentioned metal plate 8B. In this case, the second portion 8E2 and the third portion 8E3 are continuously linked to each other through the fourth portion 8E4 positioned between them. For this reason, one corner of the semiconductor chip 4PL is completely covered with the metal plate 8E.

The following is expected from the result of investigation described with reference to FIG. 28 and FIG. 29: with the construction in FIG. 30, the on-resistance and the conduction loss can be reduced and further the inductance and the switching loss can be reduced more than with the construction in the first embodiment. However, the present inventors found for the first time that the construction illustrated in FIG. 30 involves three problems described below.

The first problem is as follows: with the configuration of the metal plate 8E in FIG. 30, one corner (the area indicated by broken line E) of the semiconductor chip 4PL is completely concealed by the metal plate 8E. Therefore, the state of the above-mentioned bonding layer 11b cannot be inspected at this corner, and there is the possibility that short circuit failure in the semiconductor chip 4PL is overlooked. As a result, the reliability and mass productivity of the semiconductor device 2 are degraded.

In the first embodiment, meanwhile, the second portion 8B2 and the third portion 8B3 of the metal plate 8B are separated as mentioned above and illustrated in FIG. 6 and the like so that the corners of the semiconductor chip 4PL are not covered. For this reason, in the first embodiment, the state of the bonding layer 11b can be inspected at the four corners of the semiconductor chip 4PL, and thus the probability of detection of short circuit failure can be enhanced. Therefore, the reliability of the semiconductor device 2 can be enhanced. Further, the mass productivity of the semiconductor device 2 can be enhanced.

The second problem is as follows: with the configuration of the metal plate 8E in FIG. 30, a corner (fourth portion 8E4) of the metal plate 8E is continuously processed to provide irregularity. Therefore, it is difficult to ensure connectivity to the semiconductor chip 4PL and the planarity of a junction with the lead wiring 7LB.

In the first embodiment, meanwhile, the second portion 8B2 and the third portion 8B3 of the metal plate 8B are separated as mentioned above and illustrated in FIG. 6 and the like. Therefore, continuous processing for providing irregularity need not be carried out. For this reason, the connectivity between the metal plate 8B and the semiconductor chip 4PL can be enhanced. Further, the planarity of the junction of the metal plate 8B with the lead wiring 7LB can be enhanced, and the connectivity between the metal plate 8B and the lead wiring 7LB can be enhanced. Further, the mass productivity of the semiconductor device 2 can be enhanced.

The third problem is as follows: in a semiconductor device using a metal plate in place of a wire, there is a great difference in thermal expansion coefficient between the material (Cu, etc.) of the metal plate 8B and the material (Si, etc.) of the semiconductor chip 4PL. Therefore, a problem of stress produced by heat makes one of important issues. In case of the metal plate 8E in FIG. 30, the second portion 8E2 and the third portion 8E3 are continuously linked to each other through the fourth portion 8E4 in the area (corner) between them. This increases the rigidity of the metal plate, which is less prone to be deformed by temperature change. For this reason, the burden on the junction (bonding layer 11b) between the metal plate 8E and the semiconductor chip 4PL is increased. As a result, stress and strain are increased and the probability of the occurrence of premature breakdown is increased.

In the metal plate 8B in the first embodiment, meanwhile, its second portion 8B2 and third portion 8B3 are separated as mentioned above and illustrated in the FIG. 6 and the like. Therefore, the metal plate 8B is more easily deformed than the metal plate 8E illustrated in FIG. 30. For this reason, stress on the junction (bonding layer 11b) between the metal plate 8B and the semiconductor chip 4PL can be reduced, and thus the burden on the junction can be reduced. That is, since stress and strain can be reduced, the reliability and yield of the semiconductor device 2 can be enhanced.

Figure 31:
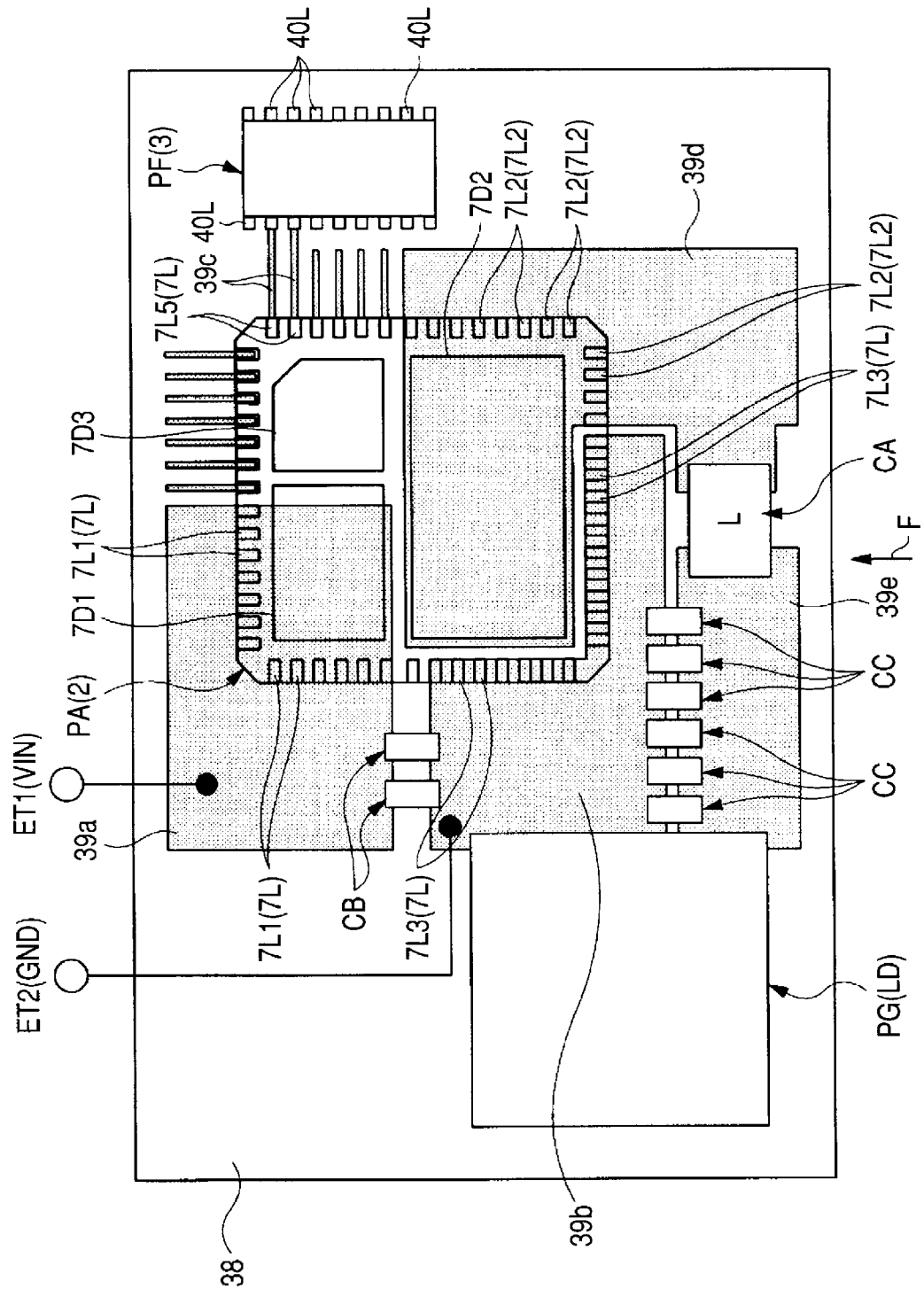
FIG. 31 is a plan view of a substantial part in an example of mounting electronic components that construct a non-isolated DC-DC converter including the semiconductor device in FIG. 3.
Figure 32:
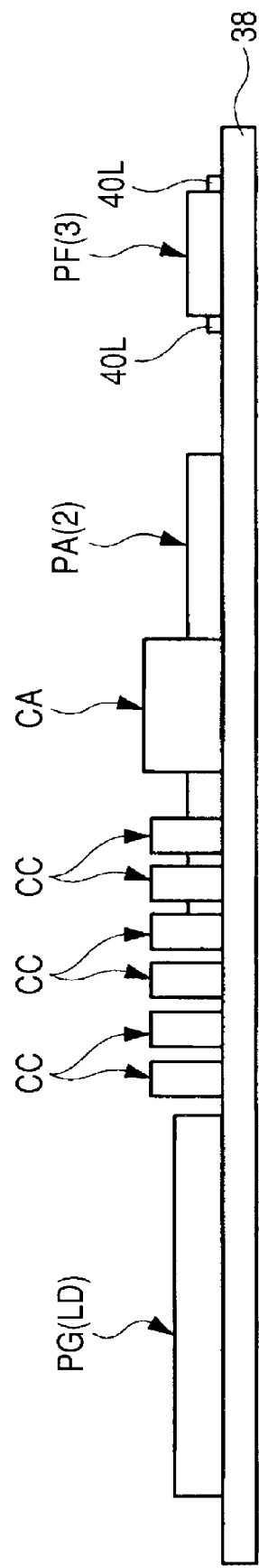
FIG. 32 is a side view showing the non-isolated DC-DC converter in FIG. 31 as viewed from the direction indicated by arrow F.

FIG. 31 is a plan view of a substantial part in an example of mounting of electronic components that construct the above-mentioned non-isolated DC-DC converter 1; and FIG. 32 is a side view of the non-isolated DC-DC converter 1 in FIG. 31 as viewed from the direction indicated by arrow F.

A wiring board 38 is composed of, for example, a printed wiring board, and over its main surface, there are mounted packages PA, PF, and PG and chip components CA, CB, and CC. In FIG. 31, the package PA is shown in a see-through manner so that the state of the wirings 39a to 39d in the wiring board 38 can be understood. In FIG. 31, the wirings 39a to 39e in the wiring board 38 are hatched for making the drawing easier to understand.

In the package PF, there is formed the above-mentioned control circuit 3, and in the package PG, there is formed the above-mentioned load LD. In the chip component CA, there is formed the above-mentioned coil L; in the chip components CB, there is formed the above-mentioned input capacitor Cin; and in the chip components CC, there is formed the above-mentioned output capacitor Cout.

A terminal ET1 for supplying input power supply VIN is electrically connected to a lead 7L1 of the package PA and a die pad 7D1 through the wiring 39a of the wiring board 38. A terminal ET2 for supplying reference potential GND is electrically connected to a lead 7L3 of the package PF through the wiring 39b of the wiring board 38. Between the wirings 39a and 39b, there are electrically connected the chip components CB (input capacitor Cin).

A lead 7L5 of the package PA (semiconductor device 2) is electrically connected with a lead 40L of the package PF (control circuit 3) through the wiring 39c of the wiring board 38. A lead 7L2 of the package PA (semiconductor device 2) as a terminal for output and the die pad 7D2 is electrically connected to one end of the chip component CA (coil) through the wiring 39d of the wiring board 38. The other end of the chip component CA (coil) is electrically connected to the wiring 39e of the wiring board 38.

This wiring 39e is electrically connected with a lead for input of the package PG (load LD). A lead for reference potential of the package PG (load LD) is electrically connected to the above-mentioned wiring 39b. Between the wirings 39b and 39e, there are electrically connected the above-mentioned chip components CC (output capacitor Cout).

Second Embodiment

The second embodiment is different from the first embodiment in the configuration of the above-mentioned metal plate 8B. As for the other respects, this embodiment is identical with the first embodiment.

Figure 33:
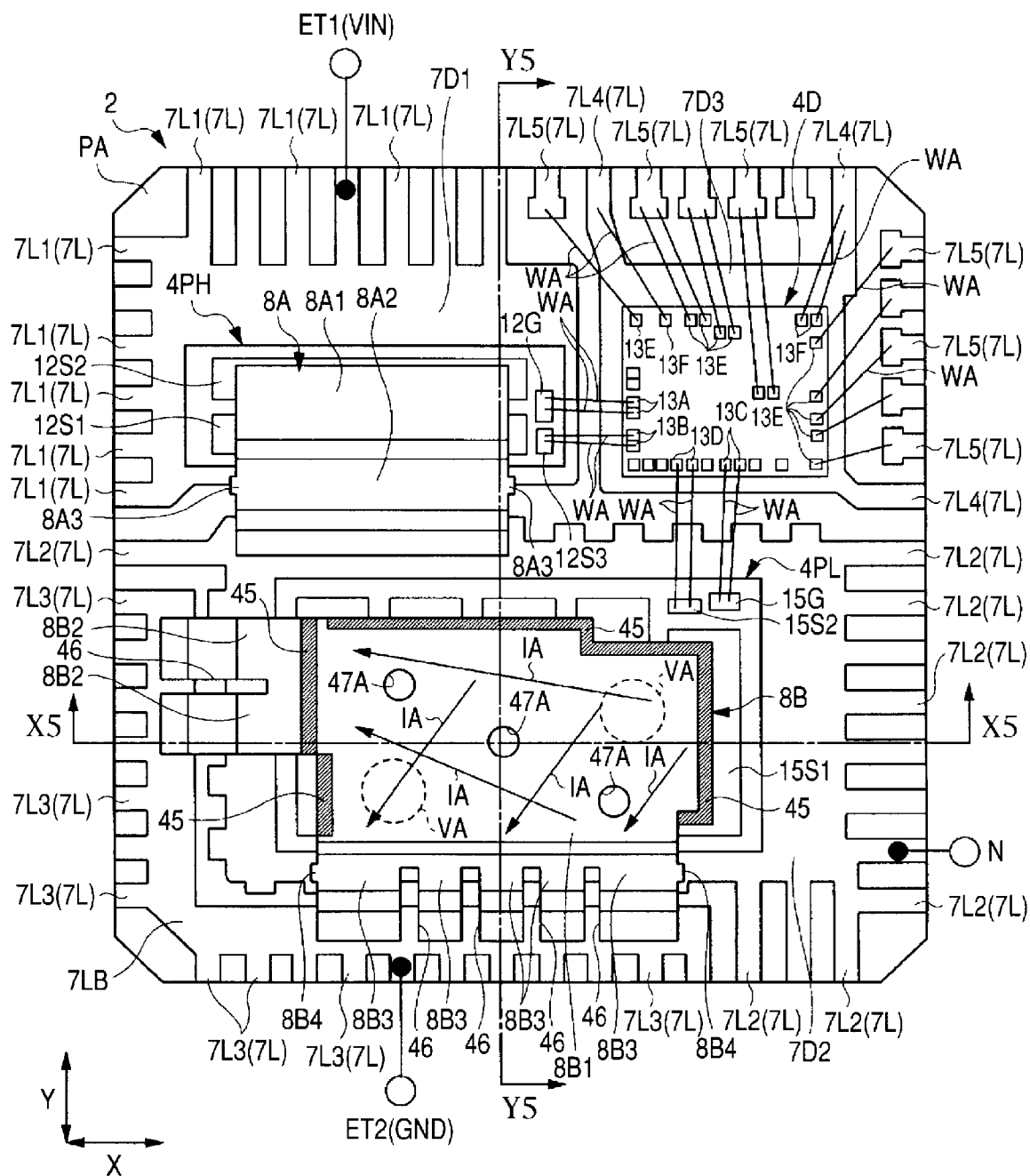
FIG. 33 is an overall plan view showing the interior of the package of a semiconductor device of another embodiment of the invention in a see-through manner.
Figure 34:
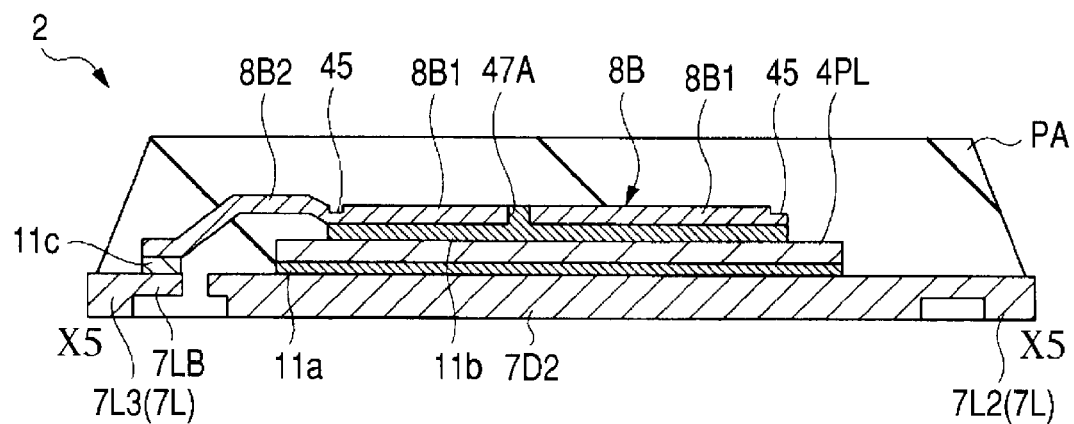
FIG. 34 is a sectional view taken along line X5-X5 of FIG. 33.
Figure 35:
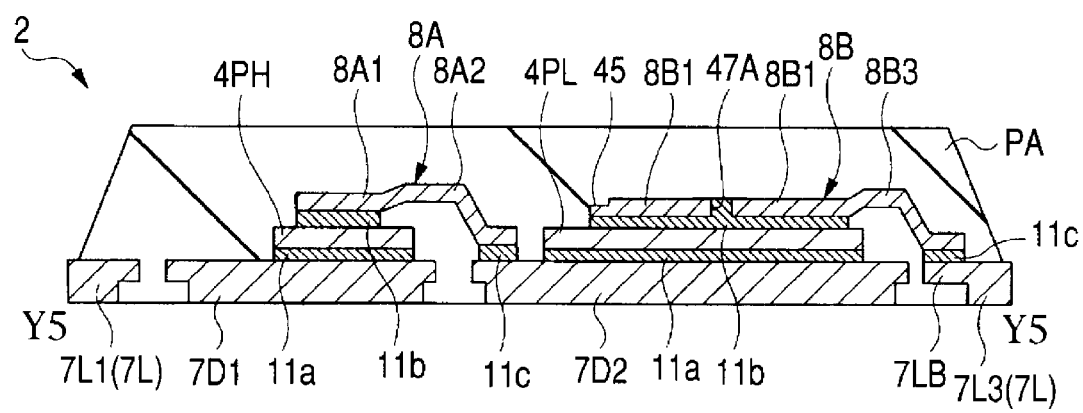
FIG. 35 is a sectional view taken along line Y5-Y5 of FIG. 33.

FIG. 33 is an overall plan view illustrating the interior of the package PA of a semiconductor device 2 in the second embodiment in a see-through manner; and FIG. 34 and FIG. 35 are sectional views respectively taken along line X5-X5 and line Y5-Y5 of FIG. 33.

In the second embodiment, there is formed an indentation 45 (hatched) on the periphery of the first portion 8B1 of the metal plate 8B. For this reason, the thickness of the indentation 45 formation region on the periphery of the metal plate 8B is thinner than the thickness of the central portion of the first portion 8B1 of the metal plate 8B. Thus, the metal plate 8B is prone to be deformed by thermal stress, and the burden on the junction (bonding layer 11b) between the metal plate 8B and the semiconductor chip 4PL can be reduced. That is, since stress and strain can be reduced, the reliability and yield of the semiconductor device 2 can be enhanced.

It is desirable that the indentation 45 should be formed on the upper face side of the metal plate 8B (on the side opposite the surface opposed to the semiconductor chip 4PL, where the sealing material of the package PA is brought into contact).

This is because in cases where the indentation 45 is formed on the side of the surface opposed to the semiconductor chip 4PL, the bonding layer 11b gets into the indentation 45 and the effect of the indentation 45 is weakened.

In the second embodiment, the indentation 45 is formed in most of the periphery of the first portion 8B1 of the metal plate 8B. Instead, the indentation 45 may be formed only in at least part of the periphery of the first portion 8B1 of the metal plate 8B. (For example, the indentation may be formed only on the long sides of or at corners of the metal plate 8B.) The corners (four corners) of the periphery of the first portion 8B1 of the metal plate 8B are farthest from the center of the first portion 8B1 of the metal plate 8B and largest stress is applied there. Therefore, it is especially desirable that the indentation 45 should be formed at the corners in terms of stress relaxation.

It is desirable that the thickness of the portion of the metal plate 8B where the indentation 45 is formed should be not more than half the thickness of the metal plate 8B. The sectional shape of the indentation 45 is stepped. Instead, the thickness of the periphery of the metal plate 8B may be gradually thinned as it goes outward of the metal plate 8B.

Here, description has been given to a case where the indentation 45 is provided on the periphery of the first portion 8B1 of the metal plate 8B having a relatively large area. Instead, the indentation may be similarly formed on the periphery of the first portion 8A1 of the metal plate 8A having a relatively small area.

In the second embodiment, slits (cuts, dividing grooves) 46 extended from the lead wiring 7LB side toward the first portion 8B1 of the metal plate 8B are formed in the second portion 8B2 and the third portion 8B3 of the metal plate 8B. For this reason, the second portion 8B2 and the third portion 8B3 are respectively divided into multiple sections and formed in comb-like planar shape. This makes the metal plate 8B prone to be deformed by thermal stress; therefore, the burden on the junction (bonding layer 11b) between the metal plate 8B and the semiconductor chip 4PL and on the junction (bonding layer 11c) between the metal plate 8B and the lead wiring 7LB can be reduced. That is, since stress and strain can be reduced, the reliability and yield of the semiconductor device 2 can be enhanced.

Here, the following case is described as an example: a case where the width of the divided portions on both outsides of the third portion 8B3 (the length in the first direction X) is larger than the width of the divided portions between them (the length in the first direction X). The reason for this is as follows: in the outermost divided portions in the third portion 8B3, there are integrally formed hanging portions 8B3; therefore, the outermost portions are increased in width and thus strength so that they are not deformed by force applied when the hanging portions 8B3 are cut. However, the widths (lengths in the first direction X) of the multiple divided portions of the third portion 8B3 may be all equal.

With respect to the depth of the slits 46, it is desirable that they should reach the position of the periphery of the semiconductor chip 4PL in terms of stress relaxation. However, too deep slits 46 can impair the inductance and on-resistance reducing effect, and it is desirable that consideration should be given to them. Here, the following case is described as an example: a case where the tips of the slits 46 (the tips in the direction in which the slits go toward the first portion 8B1) are terminated at some midpoint in the above-mentioned uppermost portions of the second portion 8B2 and the third portion 8B3.

It is desirable that the depth of the slits 46 (the length in the direction in which the slits go toward the first portion 8B1) should be sufficient at least to prevent the slits 46 from being buried under the swelling bonding layer 11c for joining the second portion 8B2 and the third portion 8B3 with the lead wiring 7LB. This is because, in cases where the slits 46 are buried under the bonding layer 11c, there is the possibility that the stress relaxation effect cannot be sufficiently obtained.

It is desirable that the depth of the slits 46 should be deeper than the positions where the second portion 8B2 and the third portion 8B3 are folded (the positions where the second portion 8B2 and the third portion 8B are folded to connect them to the lead wiring 7LB). Thus, the folded portions of the second portion 8B2 and the third portion 8B3 are narrowed, and this makes it easier to fold the second portion 8B2 and the third portion 8B3.

In the second embodiment, multiple circular holes (openings) 47A are formed in the first portion 8B1 of the metal plate 8B. The circular holes penetrate the first portion from its upper face to its lower face. This makes the metal plate 8B prone to be deformed by thermal stress, and thus the burden on the junction (bonding layer 11b) between the metal plate 8B and the semiconductor chip 4PL can be reduced. That is, since stress and strain can be reduced, the reliability and yield of the semiconductor device 2 can be enhanced.

The three holes 47A are disposed at predetermined intervals along one diagonal line in the first portion 8B1 of the metal plate 8B so that the following is implemented: the flow of current IA passed through the metal plate 8B is not hindered; and a vacuuming area VA for vacuuming the metal plate 8B can be ensured when the metal plate 8B is mounted over the semiconductor chip 4PL.

One of the three holes 47A is formed substantially in the center of the first portion 8B1 of the metal plate 8B. The remaining two holes 47A are respectively formed substantially in the centers of two areas diagonally positioned when the first portion 8B1 of the metal plate 8B is equally divided into four.

The description of the second embodiment has been given to a case where the indentation 45, slits 46, and holes 47A are provided in the metal plate 8B. The invention is not limited to this construction, and the indentation 45, slits 46, and holes 47A may be provided in the metal plate 8A.

The description of the second embodiment has been given to a case where the indentation 45, slits 46, and holes 47A are all provided in the metal plates 8A or 8B. The invention is not limited to this construction, and at least any of the indentation 45, slits 46, and holes 47A may be provided in the metal plate 8A or 8B.

Third Embodiment

The third embodiment is different from the second embodiment in the shape of holes for stress relaxation formed in the metal plate 8B. As for the other respects, this embodiment is identical with the first and second embodiments.

Figure 36:
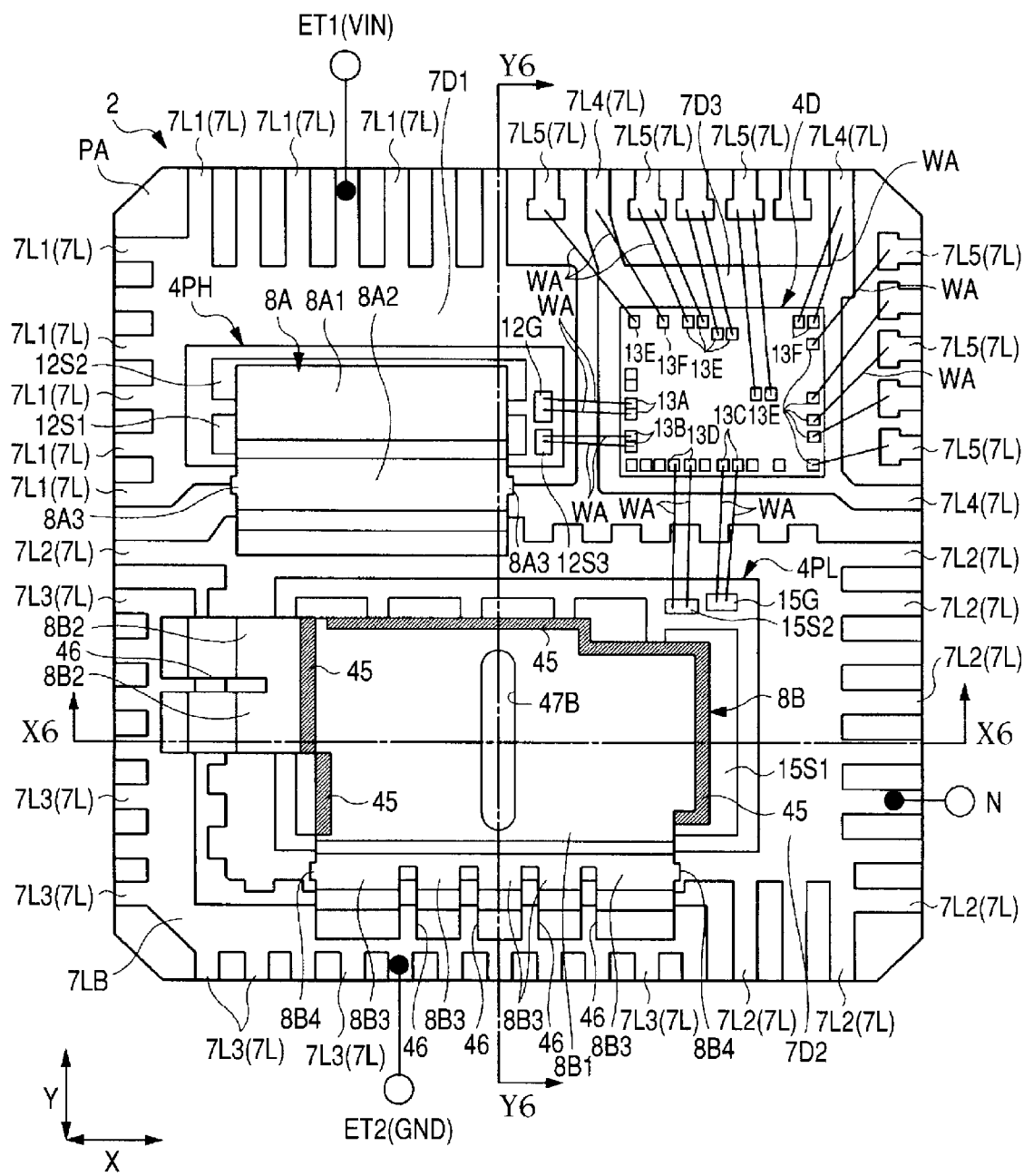
FIG. 36 is an overall plan view showing the interior of the package of a semiconductor device of another embodiment of the invention in a see-through manner.
Figure 37:
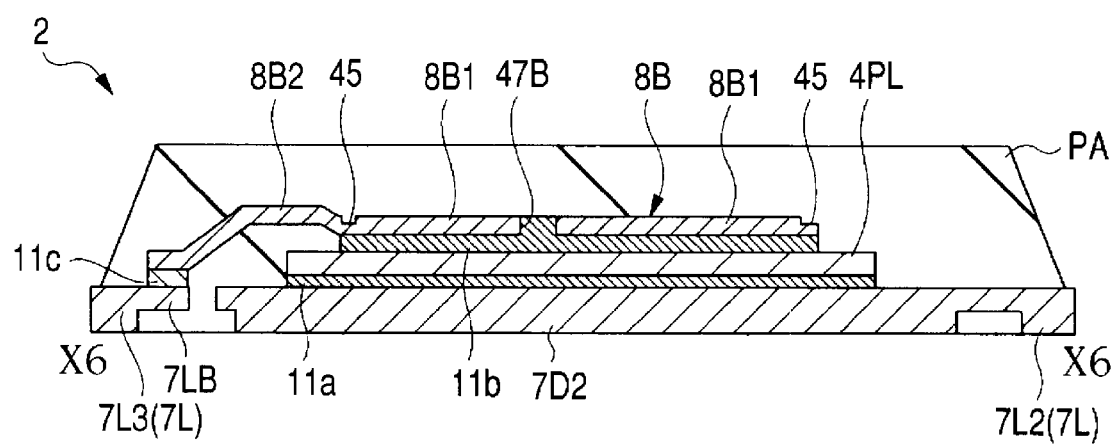
FIG. 37 is a sectional view taken along line X6-X6 of FIG. 36.
Figure 38:
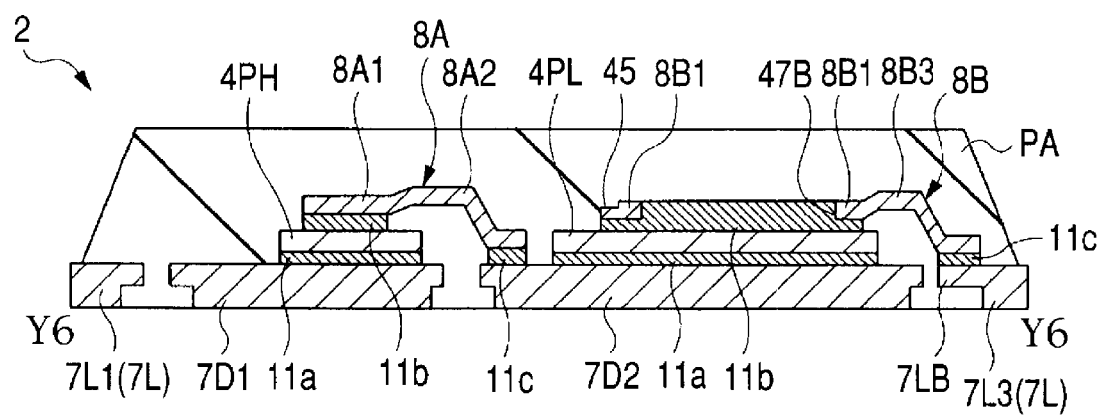
FIG. 38 is a sectional view taken along line Y6-Y6 of FIG. 36.

FIG. 36 is an overall plan view illustrating the interior of the package PA of a semiconductor device 2 in the third embodiment in a see-through manner; and FIG. 37 and FIG. 38 are sectional views respectively taken along line X6-X6 and line Y6-Y6 of FIG. 36.

In the third embodiment, one long and narrow hole (opening) 47B is formed in the first portion 8B1 of the metal plate 8B. The hole penetrates the metal plate from its upper face to its lower face. The hole 47B is disposed in I shape in the center of the first portion 8B1 of the metal plate 8B so that the metal plate 8B is substantially divided into two in the direction of its length (first direction X).

That is, the long and narrow hole 47B is extended from the vicinity of one long side of the first portion 8B1 to the vicinity of the other long side along the direction (second direction Y) orthogonal to the direction of the length of the metal plate 8B (first direction X). However, the hole 47B does not completely separate the metal plate 8B into two, and the portions of the metal plate 8B positioned on the left and right of the hole 47B are integrally and electrically connected to each other.

Provision of this hole 47B makes it possible to apparently divide the metal plate 8B into halves. Therefore, the thermal stress applied to the junction (bonding layer 11b) between the metal plate 8B and the semiconductor chip 4PL can be reduced more than in the second embodiment. That is, since stress and strain can be further reduced, the reliability and yield of the semiconductor device 2 can be enhanced.

The result of measurement carried out by the present inventors was as follows: even when a relatively large hole 47B was provided in the metal plate 8B, there was no change in the electrical characteristics because the bonding layer 11b got into the hole 47B. Even when the bonding layer 11b got into the hole 47B, it was possible to reduce the stress as mentioned above.

Fourth Embodiment

The fourth embodiment will be described taking the following case as an example: a case where an indentation is formed at the rim of a hole for stress relaxation formed in the metal plate 8B. As for the other respects, this embodiment is identical with the first, second, and third embodiments.

Figure 39:
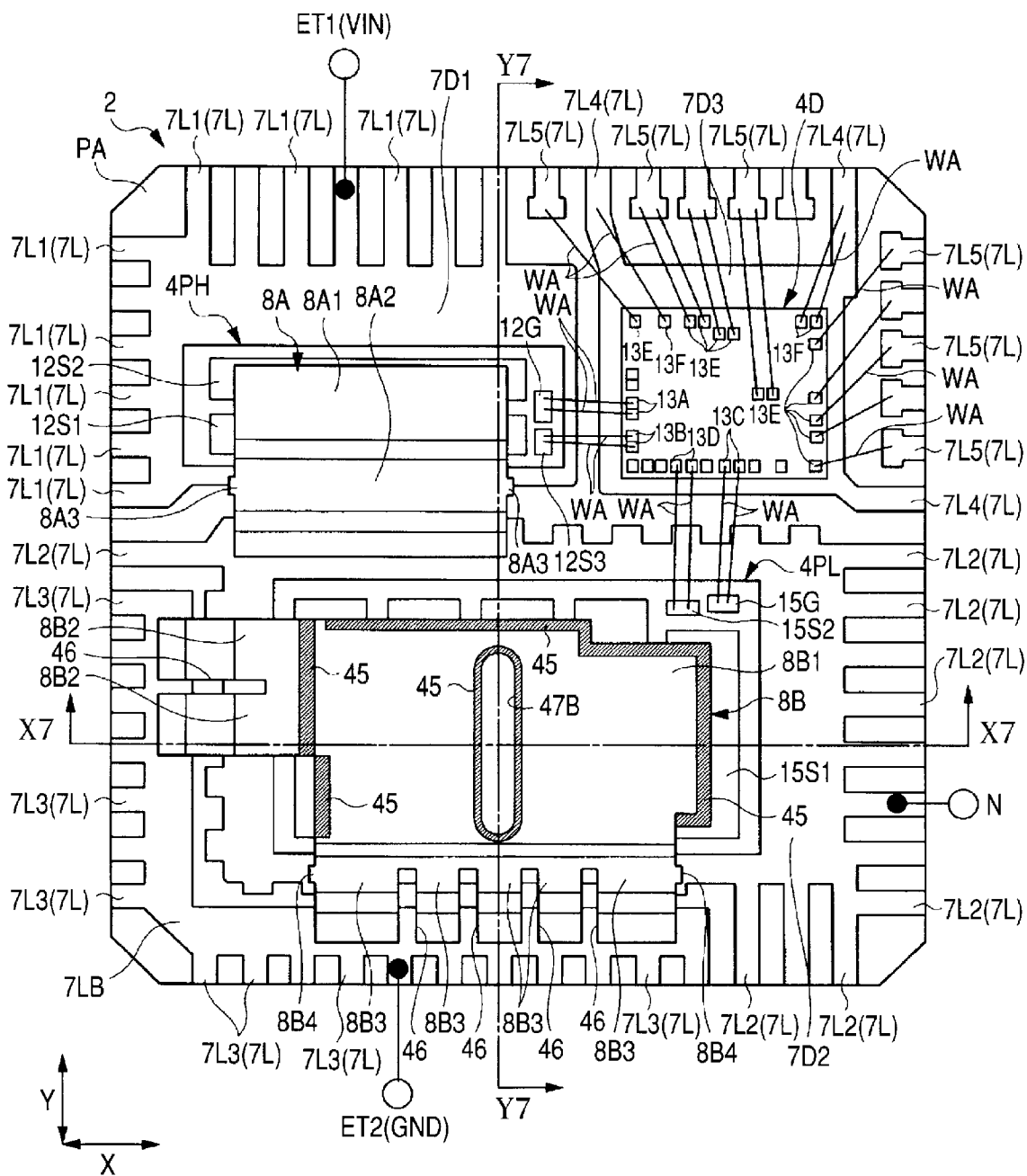
FIG. 39 is an overall plan view showing the interior of the package of a semiconductor device of another embodiment of the invention in a see-through manner.
Figure 40:
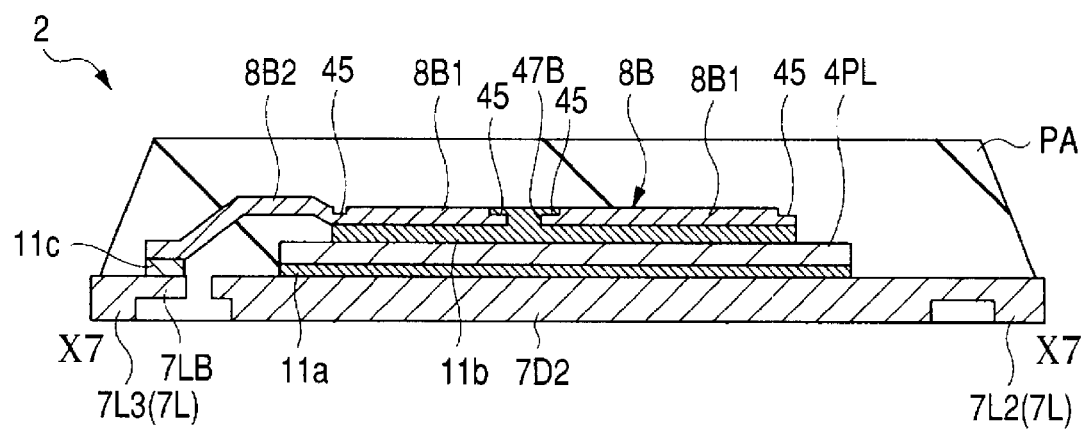
FIG. 40 is a sectional view taken along line X7-X7 of FIG. 39.
Figure 41:
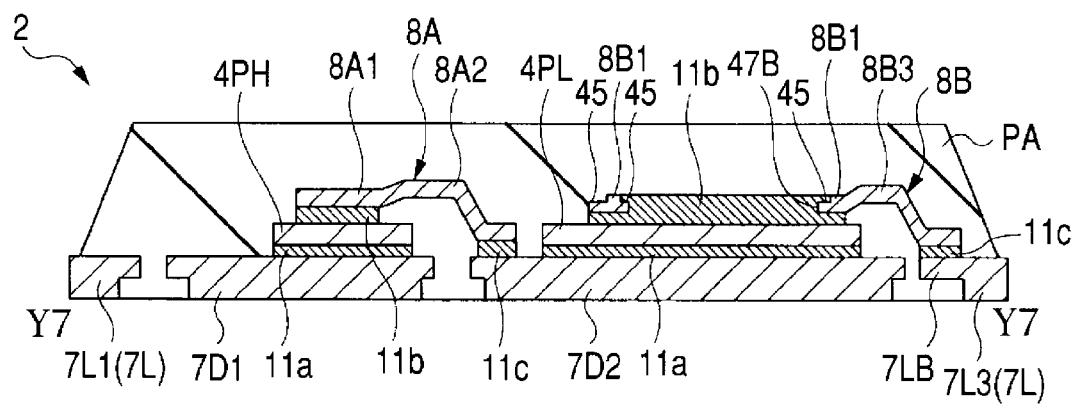
FIG. 41 is a sectional view taken along line Y7-Y7 of FIG. 39.

FIG. 39 is an overall plan view illustrating the interior of the package PA of a semiconductor device 2 in the fourth embodiment in a see-through manner; and FIG. 40 and FIG. 41 are sectional views respectively taken along line X7-X7 and line Y7-Y7 of FIG. 39.

In the fourth embodiment, an indentation 45 is formed at the rim of a hole 47B formed in the first portion 8B1 of the metal plate 8B. The state of formation of the indentation 45 at the rim of the hole 47B is the same as the state of formation of the indentation 45 on the periphery of the first portion 8B1, described in relation to the second embodiment.

Thermal stress is increased with increase in the distance from the center of the metal plate 8B. In case the hole 47B is disposed in the center of the metal plate 8B in the direction of its length as in the third embodiment, the position to be the basis of stress measurement is the center of each of the left and right halves of the first portion 8B1 divided by the hole 47B. From this view point, the rim of the hole 47B is also in a position far from the center of each of the divided halves of the first portion 8B1.

In the fourth embodiment, consequently, the indentation 45 is also provided at the rim of the hole 47B. This makes the metal plate 8B more prone to be deformed than in the third embodiment. Therefore, stress applied to the junction (bonding layer 11b) between the metal plate 8B and the semiconductor chip 4PL can be further reduced. That is, since stress and strain can be reduced, the reliability and yield of the semiconductor device 2 can be enhanced.

Fifth Embodiment

The fifth embodiment is different from the third embodiment in the disposition of holes for stress relaxation formed in the metal plate 8B. As for the other respects, this embodiment is identical with the first to third embodiments.

Figure 42:
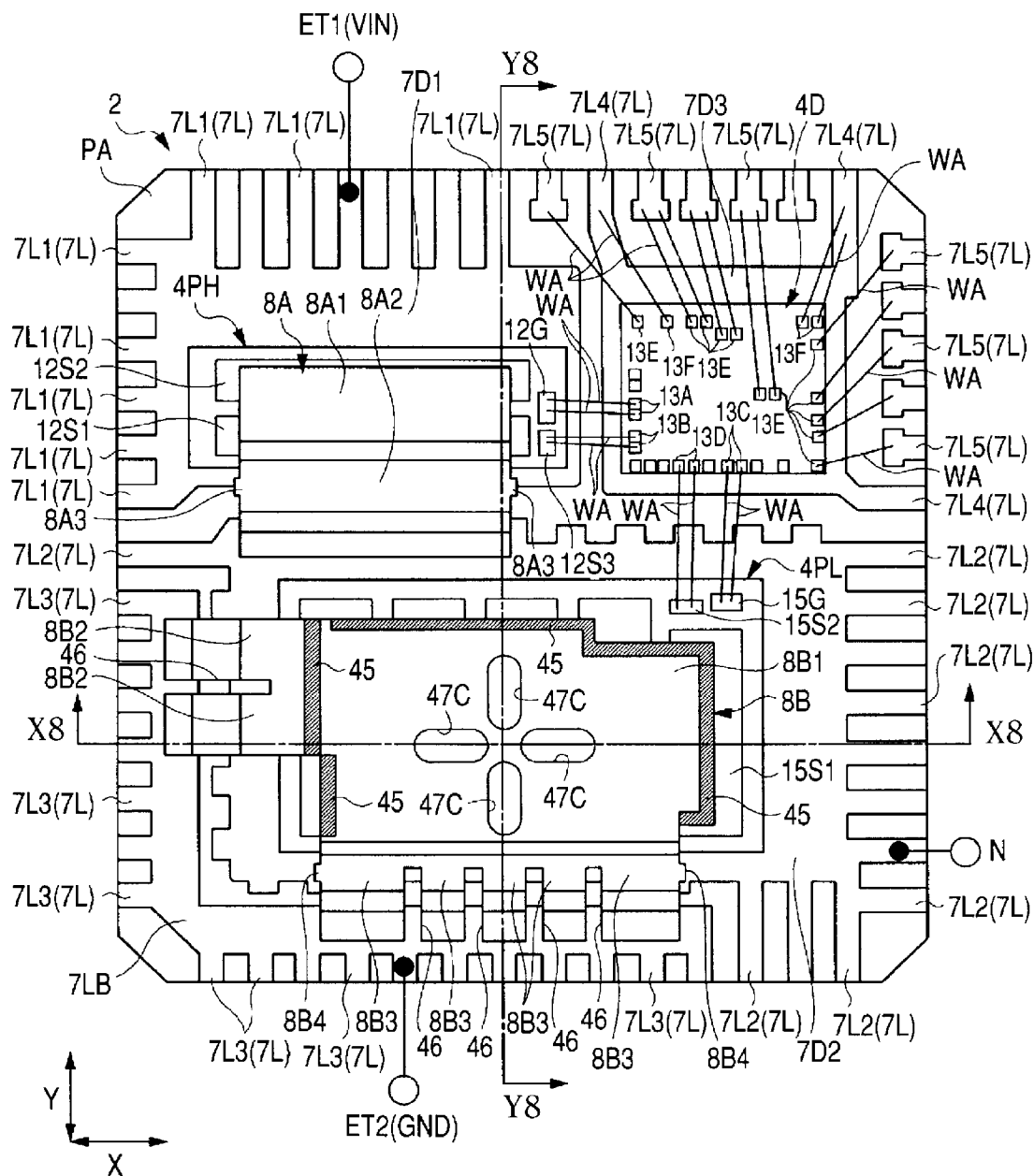
FIG. 42 is an overall plan view showing the interior of the package of a semiconductor device of another embodiment of the invention in a see-through manner.
Figure 43:
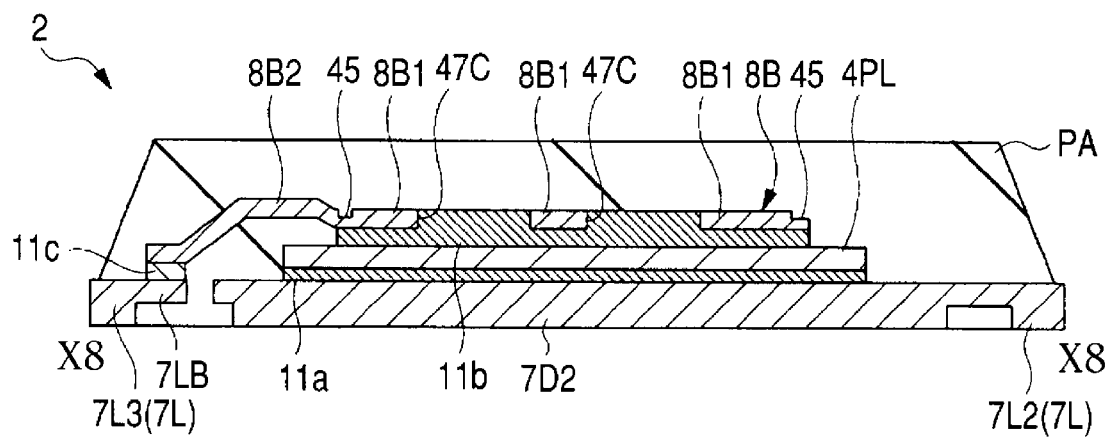
FIG. 43 is a sectional view taken along line X8-X8 of FIG. 42.
Figure 44:
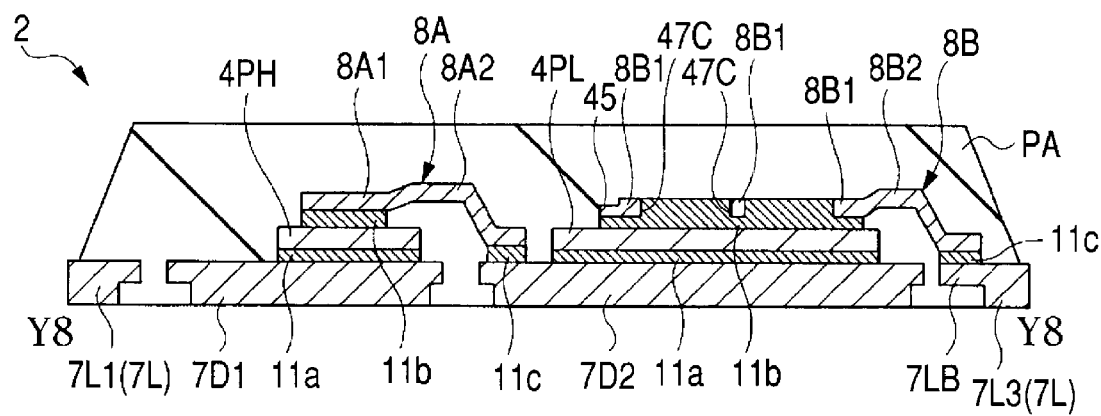
FIG. 44 is a sectional view taken along line Y8-Y8 of FIG. 42.

FIG. 42 is an overall plan view illustrating the interior of the package PA of a semiconductor device 2 in the fifth embodiment; and FIG. 43 and FIG. 44 are sectional views respectively taken along line X8-X8 and line Y8-Y8 of FIG. 42.

In the fifth embodiment, four holes (openings) 47C are formed in the first portion 8B1 of the metal plate 8B. The holes penetrate the first portion from its upper face to its lower face. The four holes 47C are disposed in the shape of a cross in the center of the first portion 8B1 so that the first portion 8B1 of the metal plate 8B is substantially equally divided into four.

That is, in the first portion 8B1 of the metal plate 8B, there are disposed the following holes: two long and narrow holes 47C disposed in the center of the first portion 8B1 in the direction of its length (first direction X) along the direction orthogonal to the direction of the length (second direction Y); and two long and narrow holes 47C disposed in the center of the first portion 8B1 in the direction of its short sides (second direction Y) along the direction orthogonal to the direction of the short sides (first direction X). The four holes 47C are identical in planar shape and planar dimensions. However, the four holes 47C do not completely separate the metal plate 8B into four, and the four divided portions of the metal plate 8B are integrally and electrically connected.

Provision of these holes 47C arranged in the shape of a cross makes it possible to apparently reduce the area of the metal plate 8B to ¼. Therefore, the thermal stress applied to the junction (bonding layer 11b) between the metal plate 8B and the semiconductor chip 4PL can be reduced more than in the third embodiment. That is, since stress and strain can be further reduced, the reliability and yield of the semiconductor device 2 can be enhanced.

Also, in the fifth embodiment, the indentation 45 may be provided at the rims of the four holes 47C as in the fourth embodiment.

Sixth Embodiment

In the description of the sixth embodiment, a case where a recess for stress relaxation is formed in the back surface of the above-mentioned metal plate will be taken as an example.

Figure 45:
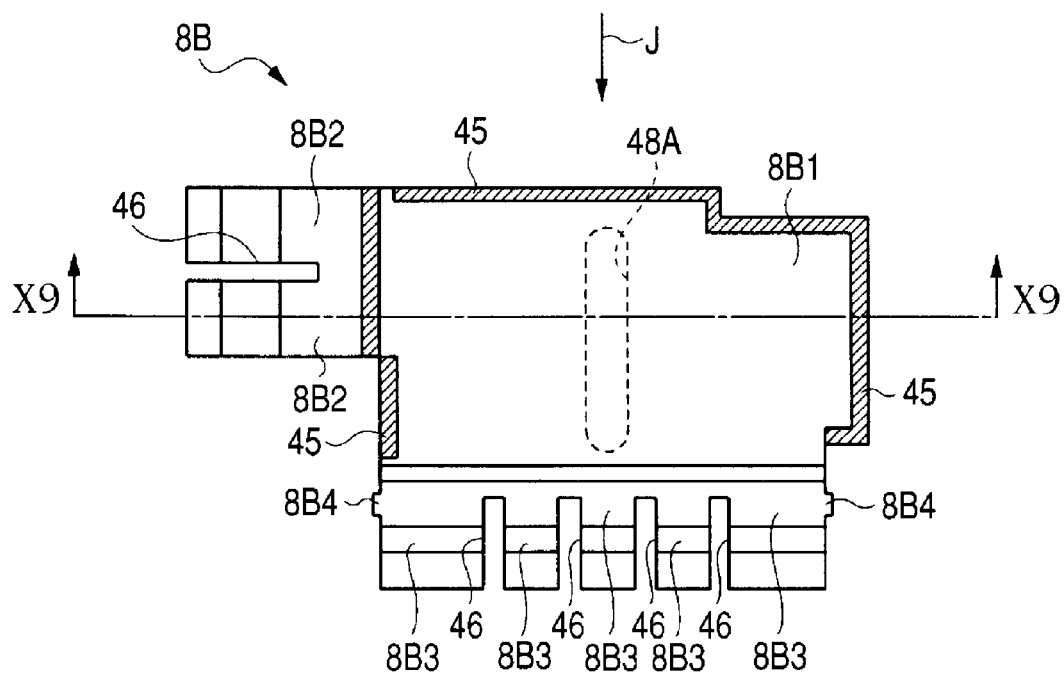
FIG. 45 is an overall plan view of a metal plate investigated by the present inventors.
Figure 46:
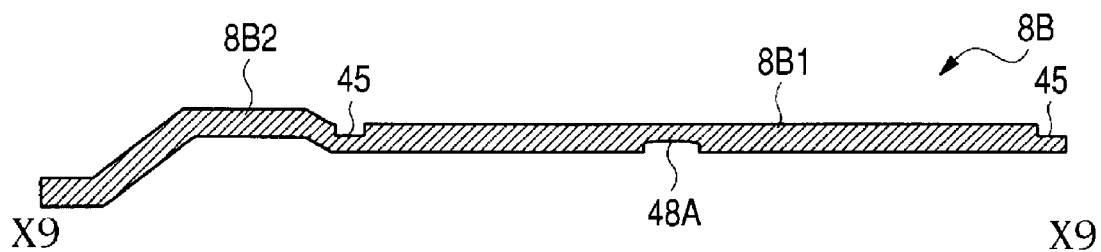
FIG. 46 is a sectional view taken along line X9-X9 of FIG. 45.
Figure 47:
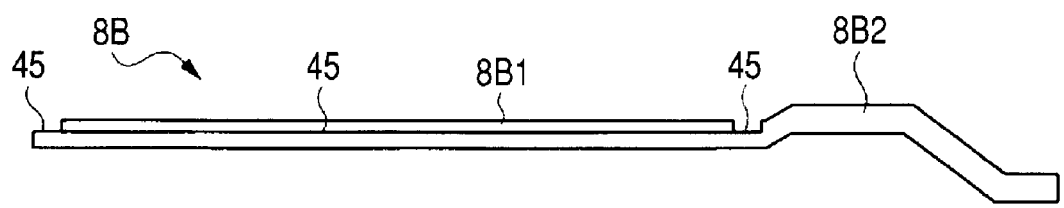
FIG. 47 is a side view showing the metal plate in FIG. 45 as viewed from the direction indicated by arrow J.

FIG. 45 is an overall plan view of the metal plate 8B the present inventors investigated; FIG. 46 is a sectional view taken along line X9-X9 of FIG. 45; and FIG. 47 is a side view of the metal plate in FIG. 45 as viewed from the direction indicated by arrow J.

In this example, the above-mentioned recess 48A for relaxing stress is formed in the back surface (the surface opposed to the semiconductor chip 4PL) of the metal plate 8B. The recess 48A is identical with the hole 47B described in relation to the third embodiment in planar shape and planar dimensions. In this case, neither of the ends of the recess 48A in the direction of the length is extended to a side face of the metal plate 8B in the direction of its short sides, and they are terminated short of the side faces.

Also, in this case, the metal plate 8B is prone to be deformed by thermal stress for the same reason as with the indentation 45 in the second to fifth embodiments. Therefore, thermal stress applied to the junction (bonding layer 11b) between the metal plate 8B and the semiconductor chip 4PL can be reduced.

However, the present inventors found for the first time that in this case, the following problem arises: when the back surface of the metal plate 8B is joined with the main surface of the semiconductor chip 4PL, air in the recess 48A cannot be released sometimes. In such a case, a void can be formed in the recess 48A. This can degrade the electrical characteristics, reliability, and yield of the semiconductor device 2.

Figure 48:
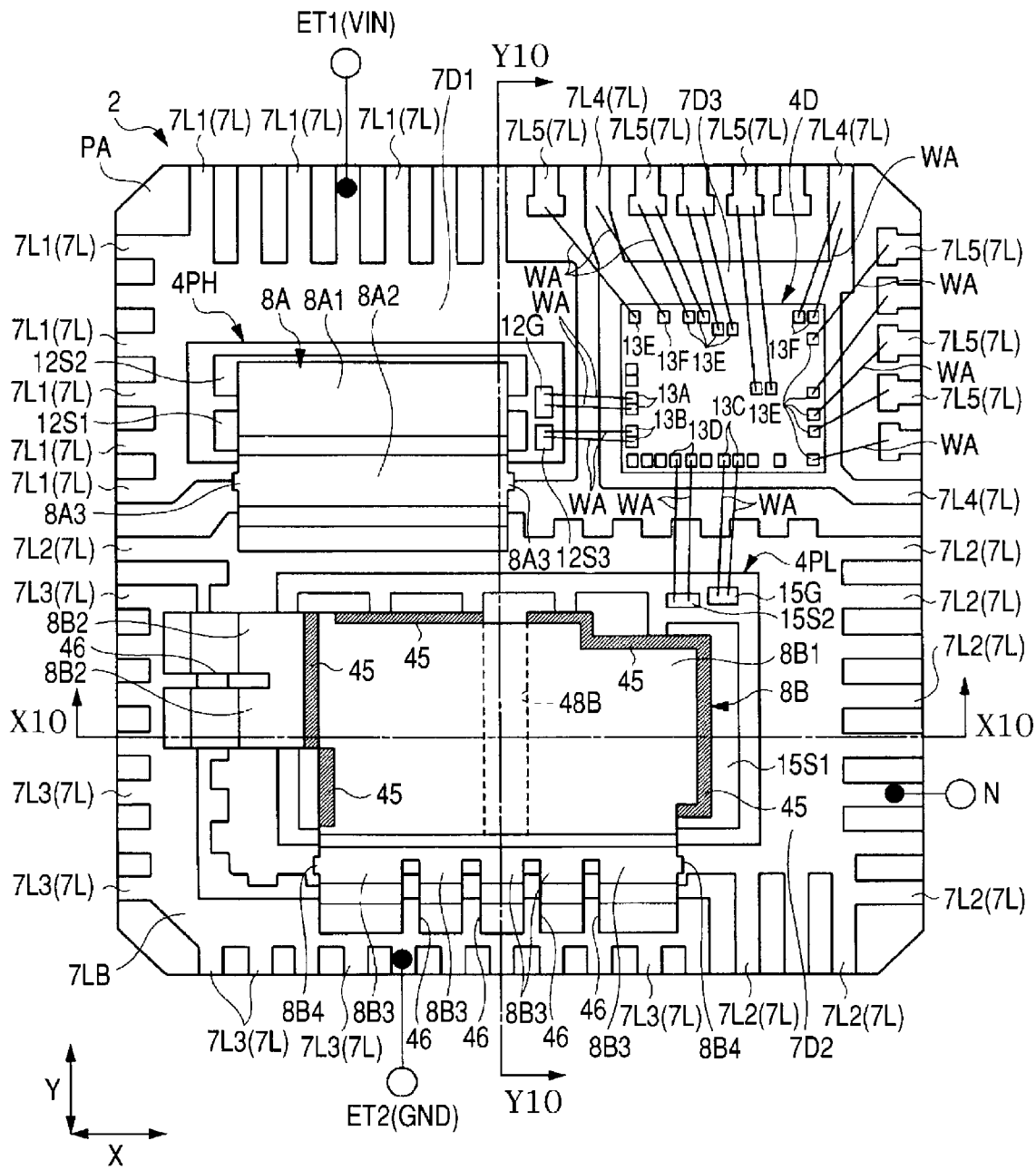
FIG. 48 is an overall plan view showing the interior of the package of a semiconductor device of another embodiment of the invention in a see-through manner.
Figure 49:
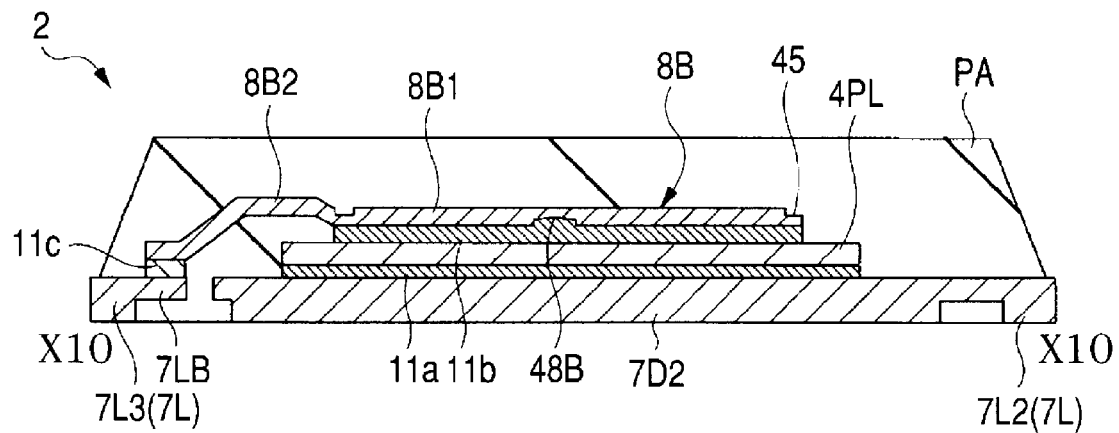
FIG. 49 is a sectional view taken along line X10-X10 of FIG. 48.
Figure 50:
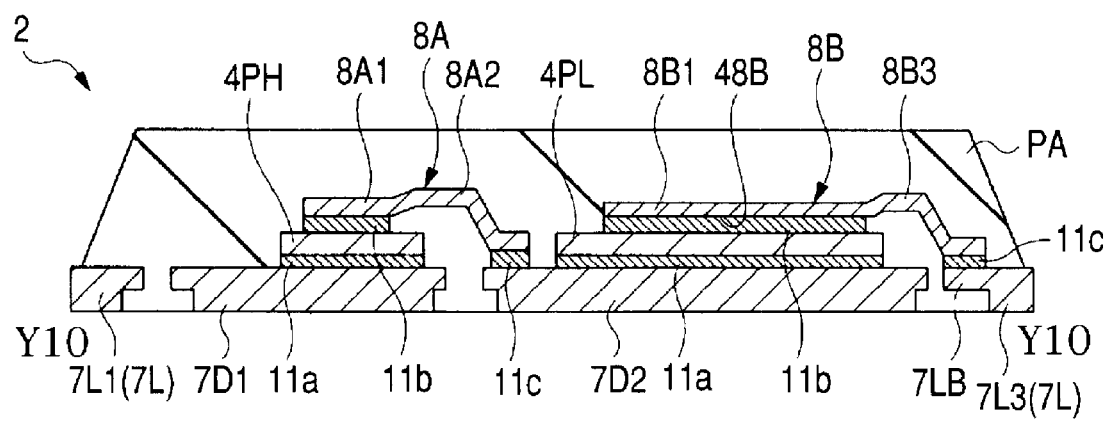
FIG. 50 is a sectional view taken along line Y10-Y10 of FIG. 48.
Figure 51:
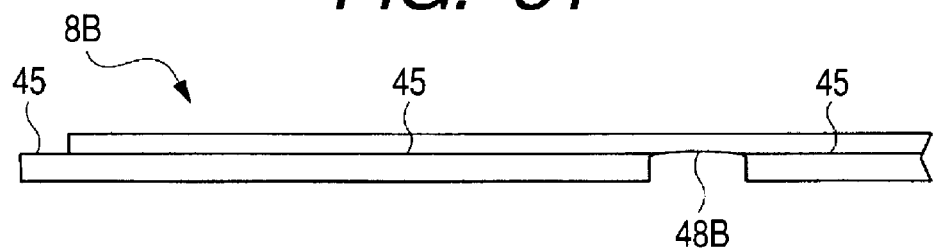

To cope with this, the sixth embodiment is so constructed that air in the above-mentioned recess can be released. FIG. 48 is an overall plan view illustrating the interior of the package PA of a semiconductor device 2 in the sixth embodiment; FIG. 49 and FIG. 50 are sectional views respectively taken along line X10-X10 and line Y10-Y10 of FIG. 48; and FIG. 51 is a side view of a substantial part of the metal plate 8B in FIG. 48 and the like.

In the sixth embodiment, the above-mentioned recess 48B for relaxing stress is formed in the back surface (the surface opposed to the semiconductor chip 4PL) of the metal plate 8B. The recess 48B is identical with the hole 47B described in relation to the third embodiment in planar position and width (length in the first direction X). The depth of the recess 48B is, for example, approximately half the thickness of the metal plate 8B. Also, in this case, the metal plate 8B is prone to be deformed by thermal stress for the same reason as with the indentation 45 in the second to fifth embodiments. Therefore, thermal stress applied to the junction (bonding layer 11b) between the metal plate 8B and the semiconductor chip 4PL can be reduced. That is, since stress and strain can be further reduced, the reliability and yield of the semiconductor device 2 can be enhanced.

In the sixth embodiment, however, both the ends of the recess 48B in the direction of its length penetrate both the side faces of the metal plate 8B in the direction of its short sides. Thus, when the back surface of the metal plate 8B is joined with the main surface of the semiconductor chip 4PL, air in the recess 48B can be released from the side faces of the metal plate 8B to the outside. For this reason, a void can be prevented from being formed in the recess 48B. Therefore, the high electrical characteristics, reliability, and yield of the semiconductor device 2 can be ensured.

Seventh Embodiment

In the description of the seventh embodiment, a case where a semiconductor chip is so formed that the thickness of its periphery is thinner than that of its central portion will be taken as an example.

Figure 52:
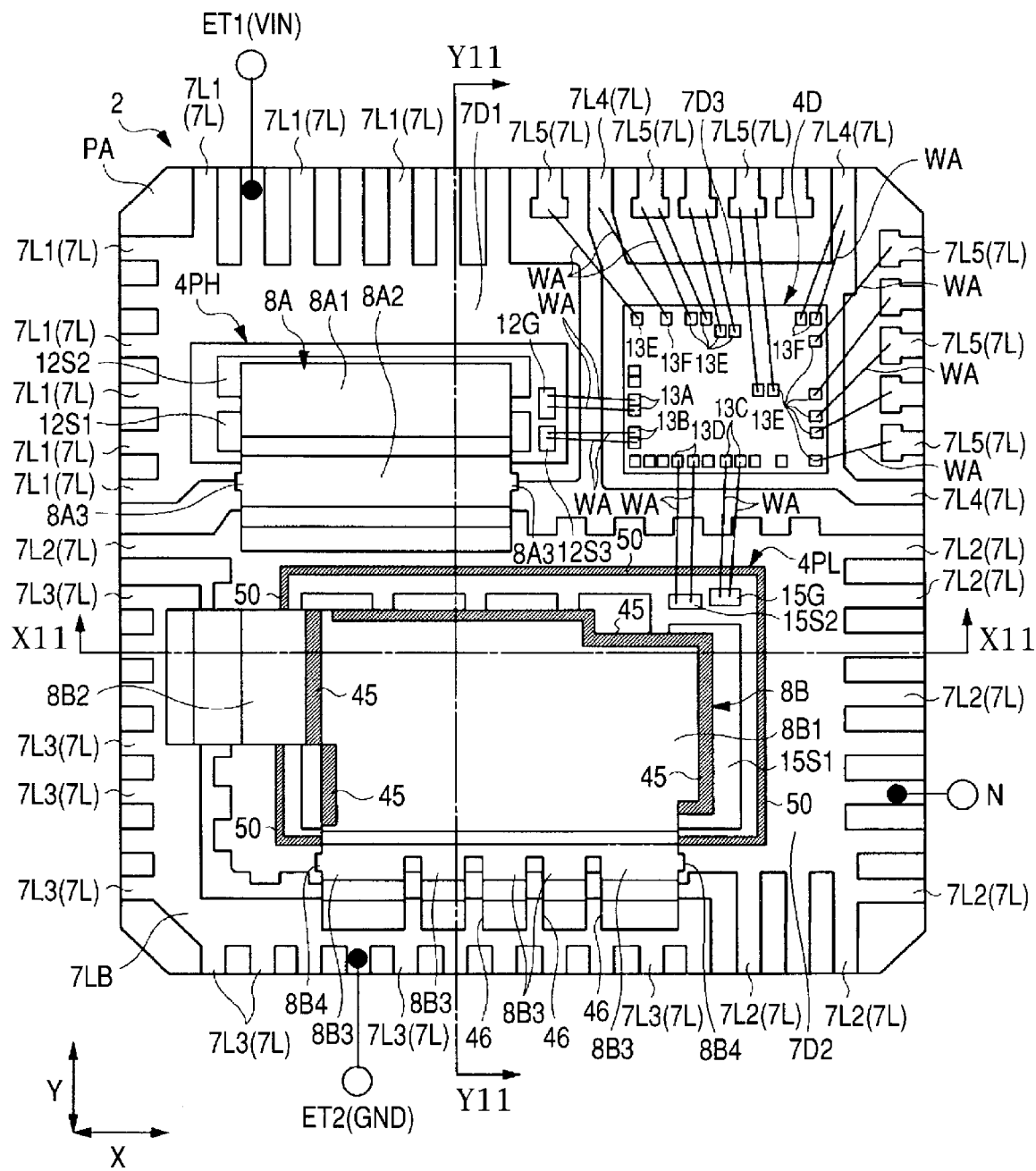
FIG. 52 is an overall plan view showing the interior of the package of a semiconductor device of another embodiment of the invention in a see-through manner.
Figure 53:
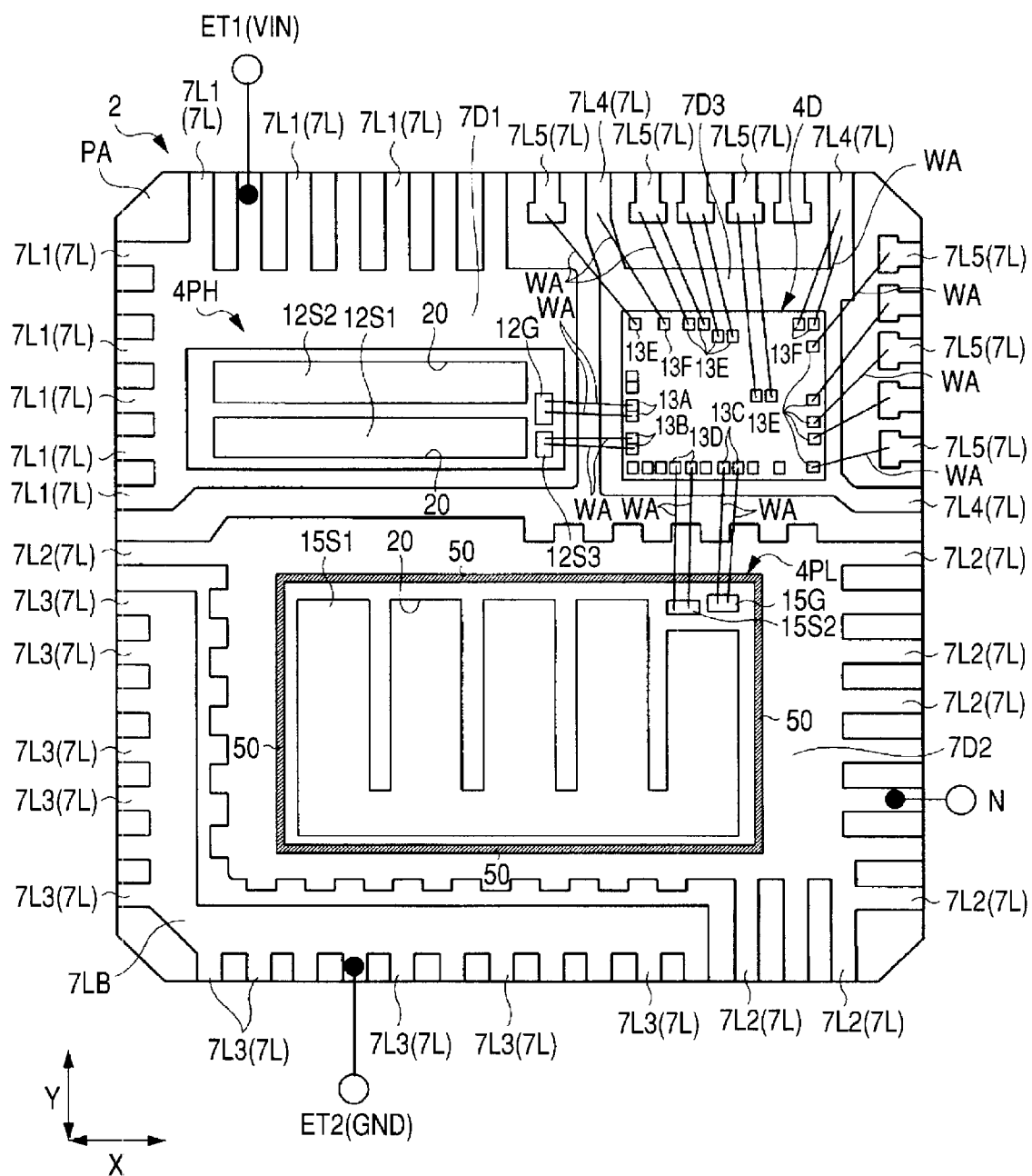
FIG. 53 is an overall plan view showing the interior of the package with the metal plates in FIG. 52 removed.
Figure 54:
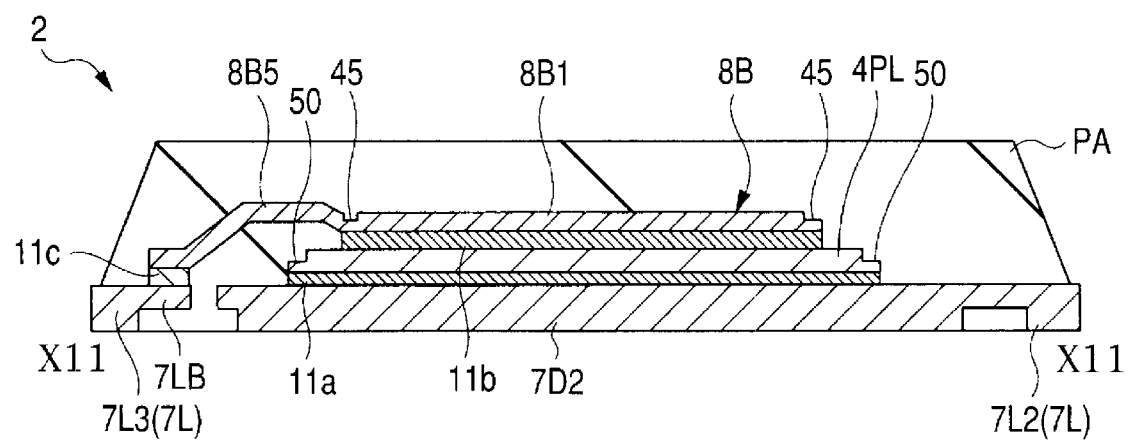
FIG. 54 is a sectional view taken along line X11-X11 of FIG. 52.
Figure 55:
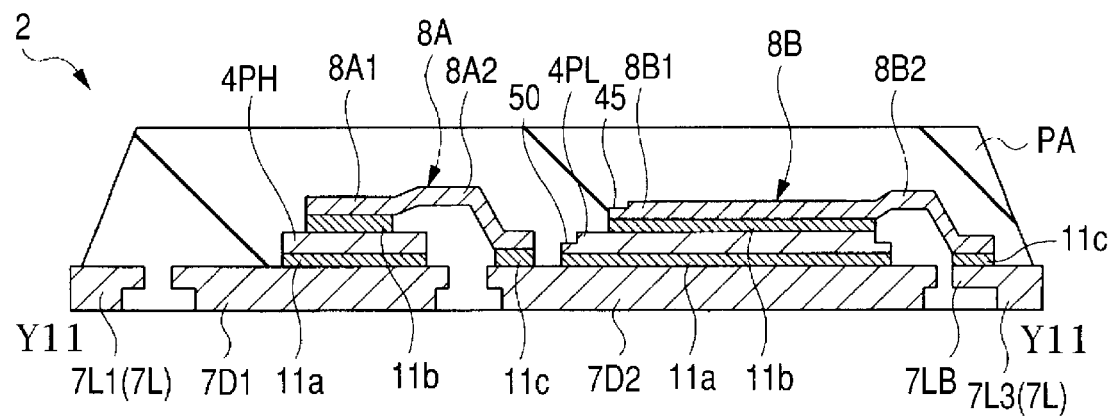
FIG. 55 is a sectional view taken along line Y11-Y11 of FIG. 52.

FIG. 52 is an overall plan view illustrating the interior of the package PA of a semiconductor device 2 in the seventh embodiment in a see-through manner; FIG. 53 is an overall plan view illustrating the interior of the package PA in FIG. 52 with the metal plates 8A and 8B removed in a see-through manner; FIG. 54 is a sectional view taken along line X11-X11 of FIG. 52; and FIG. 55 is a sectional view taken along line Y11-Y11 of FIG. 52.

In the semiconductor device 2 in the seventh embodiment, an indentation 50 (hatched) is formed on the periphery of the largest semiconductor chip 4PL. For this reason, the thickness of the indentation 50 formation region on the periphery of the semiconductor chip 4PL is thinner than the thickness of the central portion of the semiconductor chip 4PL. This makes the semiconductor chip 4PL prone to be deformed by thermal stress, and thus stress applied to the junction (bonding layer 11a) between the semiconductor chip 4PL and the die pad 7D2 can be reduced. That is, since stress and strain can be reduced, the reliability and yield of the semiconductor device 2 can be enhanced.

It is desirable that the indentation 50 should be formed on the main surface side of the semiconductor chip 4PL (on the side of a surface opposite a surface opposed to the die pad 7D2, where the sealing material for the package PA is brought into contact). This is because, in cases where the indentation 50 is formed on the side of the surface opposed to the die pad 7D2, the bonding layer 11a gets into the indentation 50 and the effect of the indentation 50 is reduced.

In the seventh embodiment, the indentation 50 is formed on the entire periphery of the semiconductor chip 4PL. (Refer to FIG. 53.) Instead, the indentation 50 may be formed only on at least part of the periphery of the semiconductor chip 4PL (e.g., only on the long sides of or at corners of the semiconductor chip 4PL, or the like). The corners (four corners) of the periphery of the semiconductor chip 4PL are farthest from the center of the main surface of the semiconductor chip 4PL, and the largest stress is applied there. Therefore, it is especially desirable that the indentation 50 should be formed at these corners in terms of stress relaxation.

It is desirable that the thickness of the portion of the semiconductor chip 4PL where the indentation 50 is formed should be not more than half the thickness of the semiconductor chip 4PL. The sectional shape of the indentation 50 is stepped. Instead, the thickness of the periphery of the semiconductor chip 4PL may be gradually thinned as it goes outward of the semiconductor chip 4PL.

Here, description has been given to a case where the indentation 50 is provided on the periphery of the semiconductor chip 4PL having a relatively large area. Instead, the indentation may be similarly formed on the periphery of the semiconductor chip 4PH having a relatively small area. In the seventh embodiment, the indentation 45 is formed on the periphery of the first portion 8B1 of the metal plate 8B as in the second to sixth embodiments.

As for the other respects, this embodiment is identical with the first embodiment. In the seventh embodiment, at least any of the above-mentioned slits 46, holes 47A, 47B, and 47C, and recesses 48A and 48B may be added as described in relation to the second to sixth embodiments.

Figure 56:
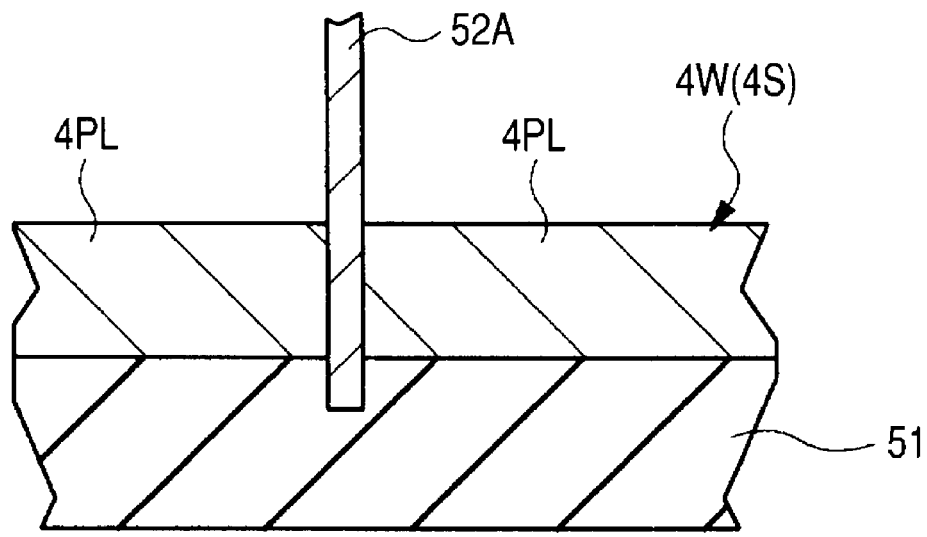
FIG. 56 is a sectional view of a substantial part of the semiconductor chip where a field effect transistor for high side is formed, of the semiconductor device in FIG. 52 in a manufacturing process.
Figure 57:
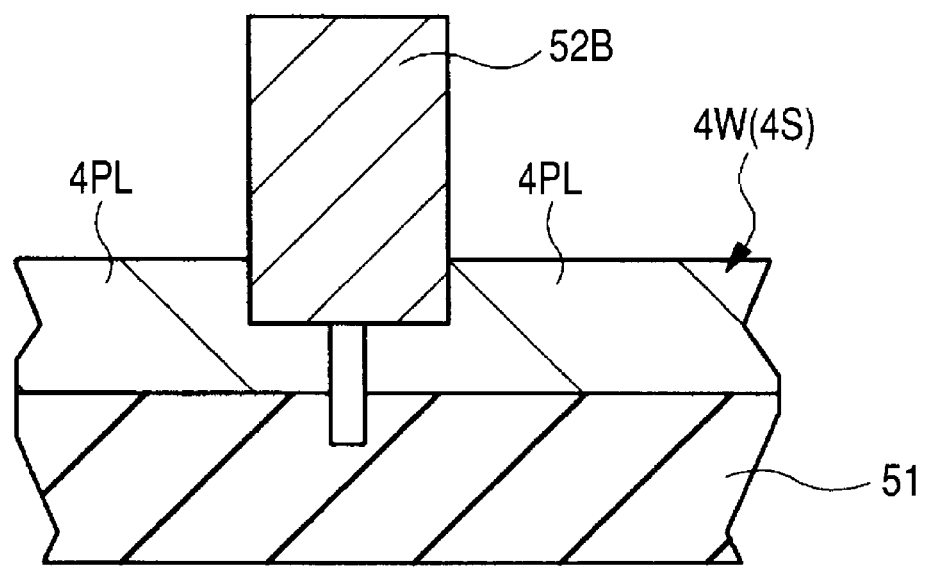
FIG. 57 is a sectional view of the substantial part of the semiconductor chip in the manufacturing process, following FIG. 56.
Figure 58:
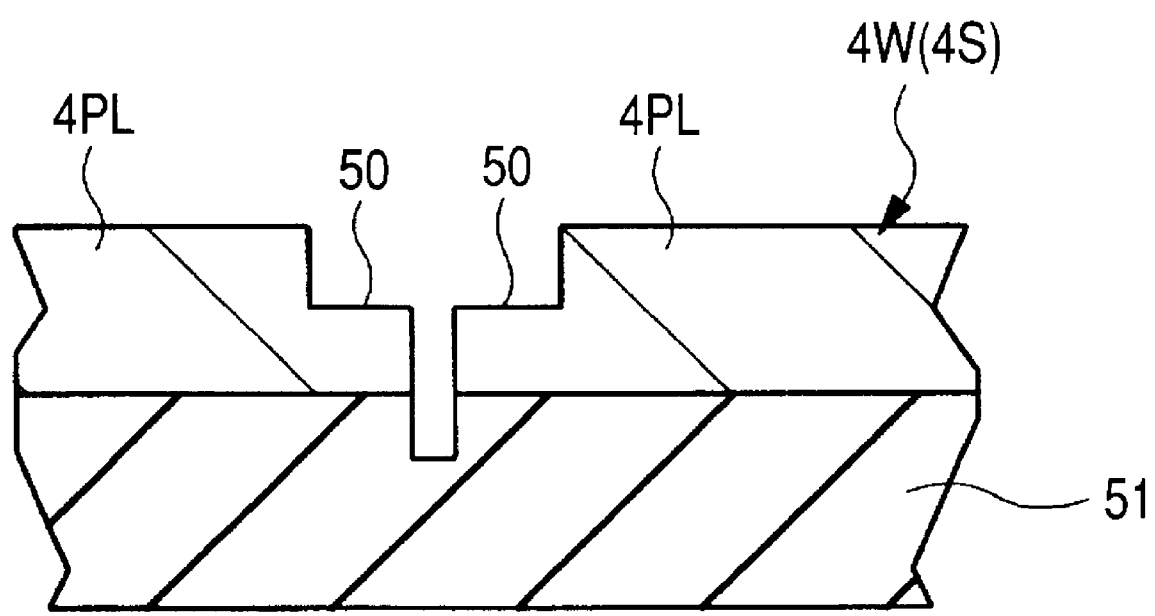
FIG. 58 is a sectional view of the substantial part of the semiconductor chip in the manufacturing process, following FIG. 57.

Description will be given to an example of a method for forming the above-mentioned indentation 50 on the periphery of the main surface of the semiconductor chip 4PL with reference to FIG. 56 to FIG. 58. FIG. 56 to FIG. 58 are sectional views of a substantial part of a semiconductor wafer in a formation process for the indentation 50.

First, a semiconductor wafer 4W for forming a semiconductor chip 4PL is stuck to a dicing tape 51 as illustrated in FIG. 56. The semiconductor wafer 4W is composed of a semiconductor thin plate in substantially circular planar shape with multiple regions for the semiconductor chip 4PL formed therein. The semiconductor wafer is stuck to the dicing tape 51 with its main surface (the main surfaces of the semiconductor chips 4PL) facing upward and its back surface (the back surfaces of the semiconductor chips 4PL) facing toward the dicing tape 51. Thereafter, a rotating dicing saw 52A of dicing equipment is brought into contact with a dicing area on the main surface of the semiconductor wafer 4W to completely cut the semiconductor wafer 4W.

As illustrated in FIG. 57, subsequently, a rotating dicing saw 52B wider than the dicing saw 52A is brought into contact with the dicing area on the main surface of the semiconductor wafer 4W. At this time, the cutting line of the dicing saw 52A agrees with that of the dicing saw 52B. With the dicing saw 52B, the semiconductor wafer 4W is not completely cut from its main surface to its back surface, and it is cut so that the depth of cut is approximately half the thickness of the semiconductor wafer 4W. The order of cutting with the dicing saws 52A and 52B may be reversed.

By carrying out step dicing using two dicing saws 52A and 52B different in saw blade width, the indentation 50 can be formed on the periphery of the semiconductor chip 4PL as illustrated in FIG. 58.

Eighth Embodiment

In the description of the eighth embodiment, a case where the second portion 8A2 of the metal plate 8A joined with the semiconductor chip 4PH with the power MOS QH1 for high side formed therein is divided into multiple sections will be taken as an example.

Figure 59:
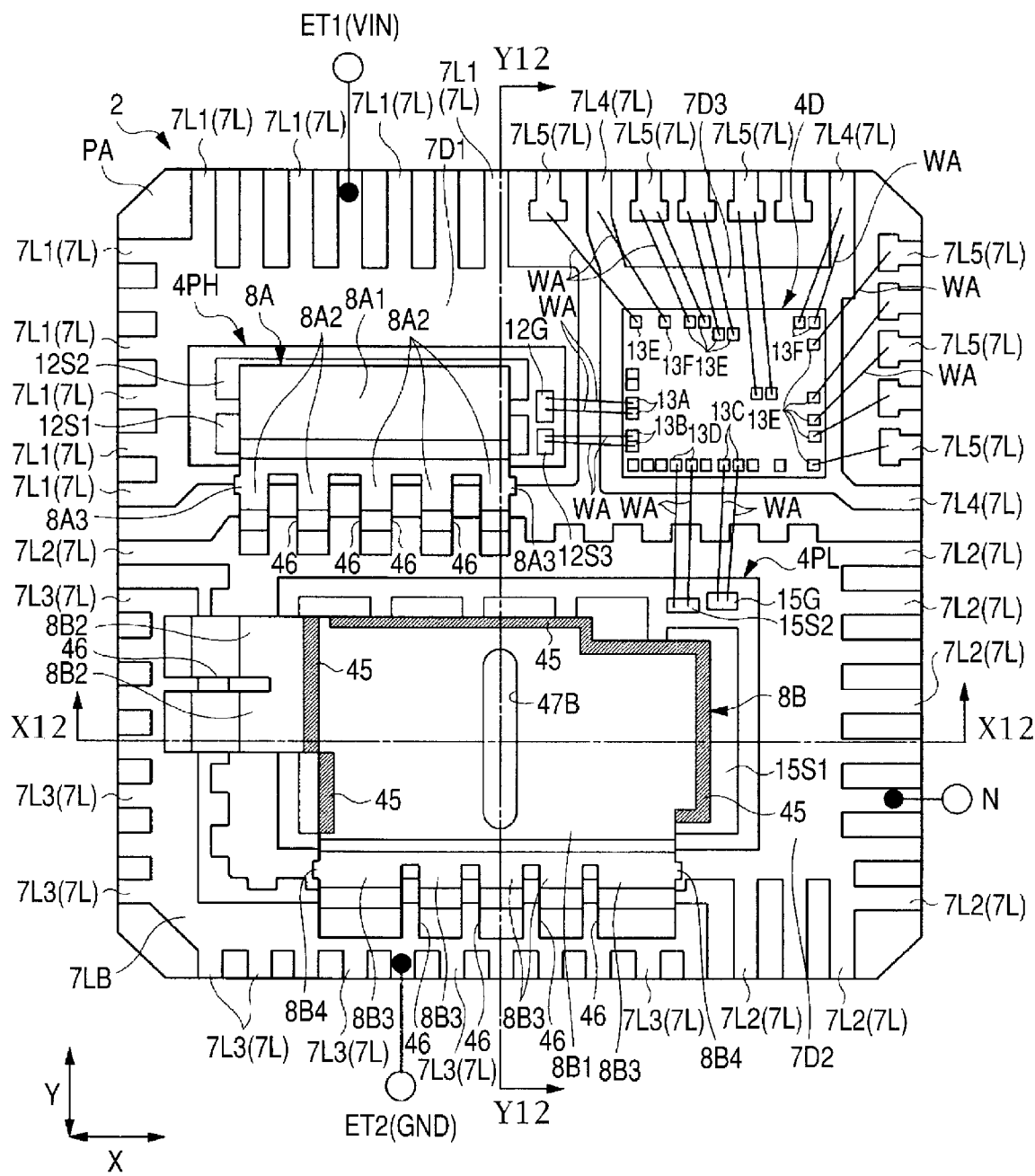
FIG. 59 is an overall plan view showing the interior of the package of a semiconductor device of another embodiment of the invention in a see-through manner.

FIG. 59 is an overall plan view illustrating the interior of the package PA of a semiconductor device 2 in the eighth embodiment in a see-through manner. A sectional view taken along line X12-X12 of FIG. 59 is identical with FIG. 37. A sectional view taken along line Y12-Y12 of FIG. 59 is identical with FIG. 38.

In the eighth embodiment, slits (cuts, dividing grooves) 46 extended from the die pad 7D2 side toward the first portion 8A1 of the metal plate 8A are formed in the second portion 8A2 of the metal plate 8A joined with the semiconductor chip 4PH with the power MOS QH1 for high side formed therein. For this reason, the second portion 8A2 is divided into multiple sections and formed in comb-like planar shape. This makes the metal plate 8A prone to be deformed by thermal stress; therefore, thermal stress applied to the junction (bonding layer 11b) between the metal plate 8A and the semiconductor chip 4PH and on the junction (bonding layer 11b) between the metal plate 8A and the die pad 7D2 can be reduced, and thus the burden on these junctions can be reduced. That is, since stress and strain can be reduced, the reliability and yield of the semiconductor device 2 can be enhanced.

As for the other respects, this embodiment is identical with the first and third embodiments. Also, in the eighth embodiment, the shape of the hole 47B in the metal plate 8B may be as in the second and fourth to sixth embodiments. The indentation 50 may be formed on the peripheries of the semiconductor chips 4PL and 4PH as in the seventh embodiment.

Ninth Embodiment

In the description of the ninth embodiment, a case where a protrusion is formed on the back surfaces of the metal plates 8A and 8B.

Figure 60:
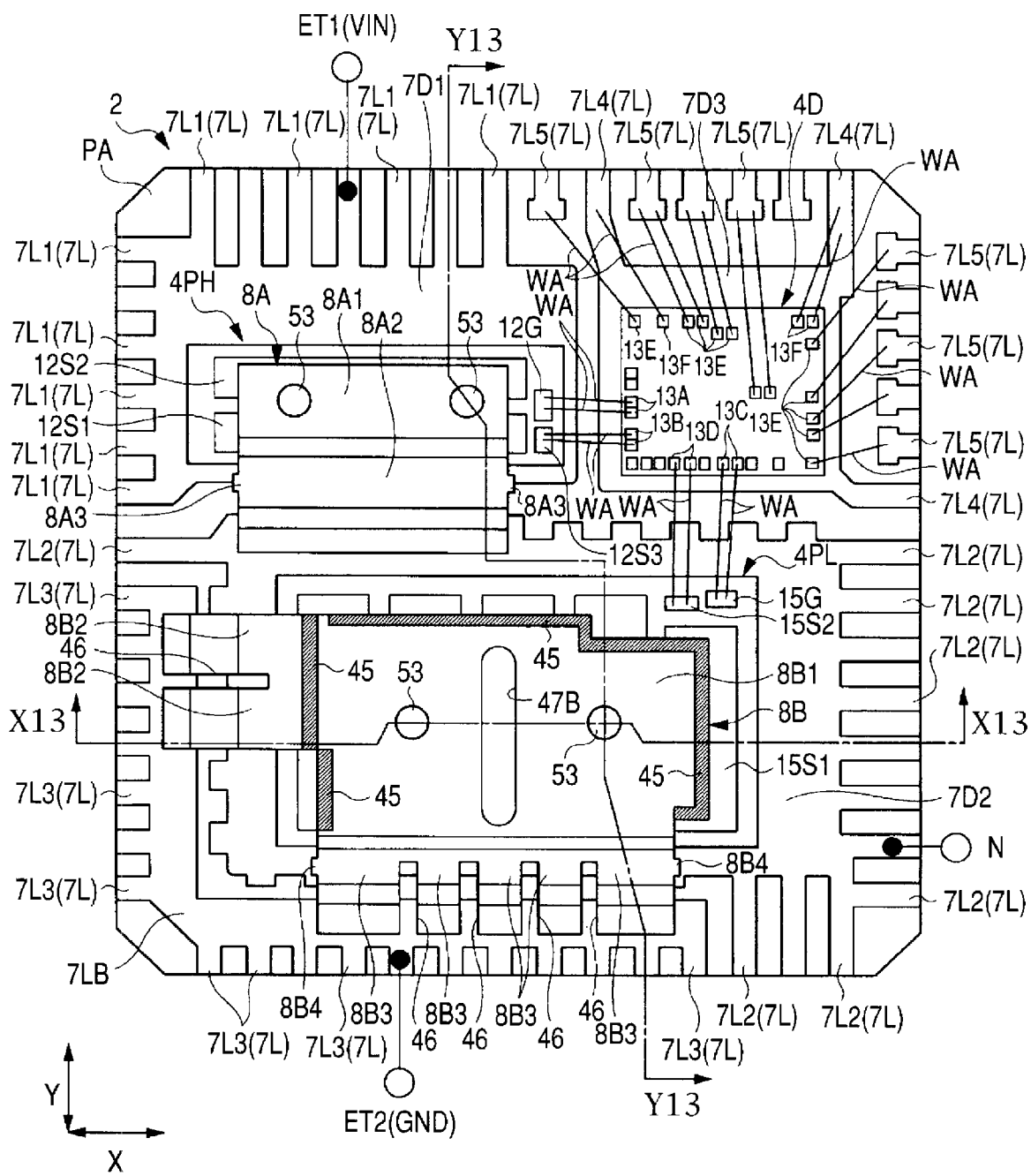
FIG. 60 is an overall plan view showing the interior of the package of a semiconductor device of another embodiment of the invention in a see-through manner.
Figure 61:
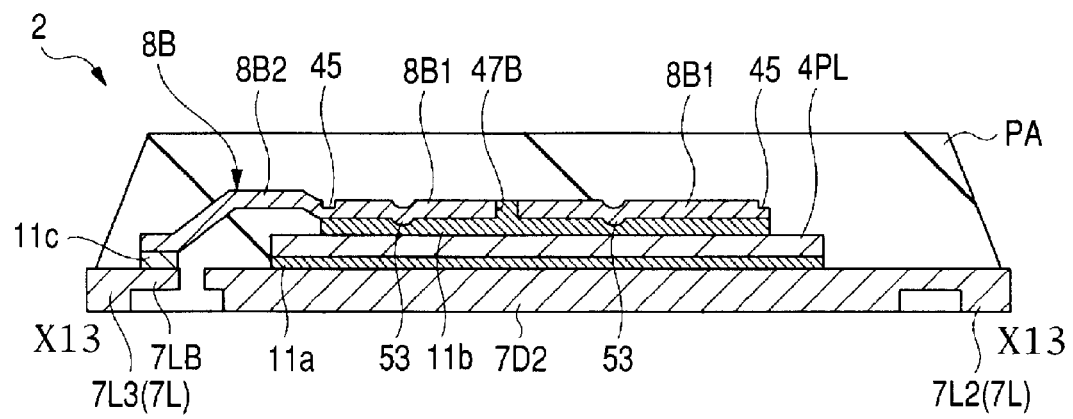
FIG. 61 is a sectional view taken along line X13-X13 of FIG. 60.
Figure 62:
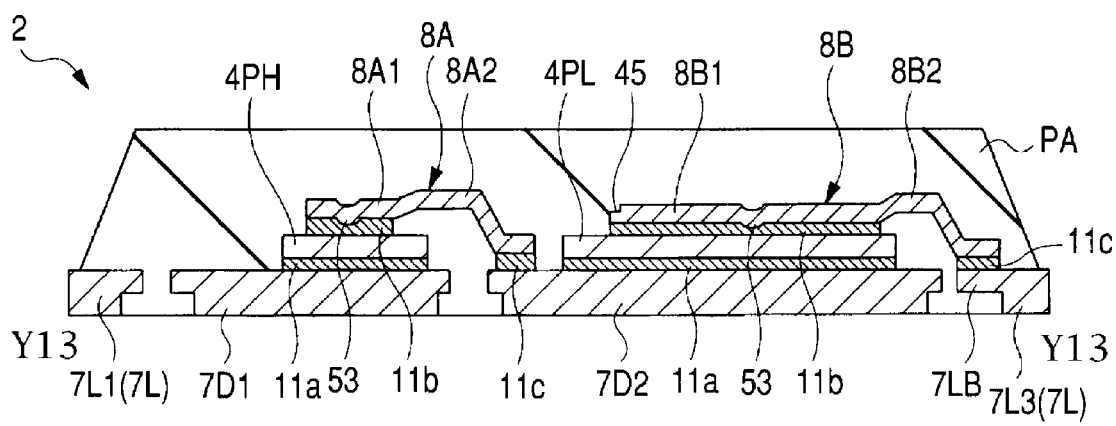
FIG. 62 is a sectional view taken along line Y13-Y13 of FIG. 60.
Figure 63:
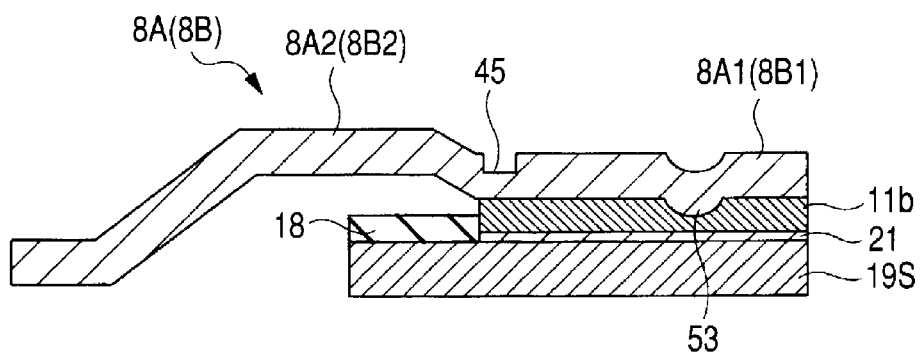
FIG. 63 is an enlarged sectional view of a substantial part of a metal plate in FIG. 60.

FIG. 60 is an overall plan view illustrating the interior of the package PA of a semiconductor device 2 in the ninth embodiment in a see-through manner; FIG. 61 is a sectional view taken along line X13-X13 of FIG. 60; FIG. 62 is a sectional view taken along line Y13-Y13 of FIG. 60; and FIG. 63 is an enlarged sectional view of a substantial part in a metal plate 8A or 8B in FIG. 60.

In the ninth embodiment, a protrusion 53 is formed on the back surfaces (the surfaces opposed to the semiconductor chip 4PH or 4PL) of the metal plates 8A and 8B. When no protrusion 53 is provided and the bonding layer 11b is of natural thickness, it is difficult to increase the thickness of the bonding layer 11b between the opposite surfaces of the metal plates 8A and 8B and the semiconductor chips 4PH and 4PL, and there is the possibility that the thickness of the bonding layer 11b is not uniform. As a result, the metal plate 8A or 8B can be inclined relative to the main surface of the semiconductor chip 4PH or 4PL or the metal plates 8A and 8B can be peeled off from a portion where the bonding layer 11b is thinned, by the above-mentioned thermal stress.

In the ninth embodiment, to cope with this, the protrusion 53 is provided on the back surfaces of the metal plates 8A and 8B so that the thickness of the bonding layer 11b is forcibly ensured. This makes it possible to thicken the bonding layer 11b between the opposite surfaces of the metal plates 8A and 8B and the semiconductor chips 4PH and 4PL, and to make uniform the thickness of the bonding layer 11b between the opposite surfaces of the metal plates 8A and 8B and the semiconductor chips 4PH and 4PL. For this reason, inclination of the metal plate 8A or 8B relative to the main surface of the semiconductor chip 4PH or 4PL can be suppressed or prevented. Further, since the adhesion between the metal plates 8A and 8B and the semiconductor chips 4PH and 4PL can be enhanced, peeling of the metal plates 8A and 8B can be suppressed or prevented.

Two protrusions 53 are disposed on the back surface of each of the metal plates 8A and 8B. In the individual metal plates 8A and 8B, the two protrusions 53 are symmetrically disposed with respect to the center lines of the metal plates 8A and 8B in the direction of their length. In each metal plate 8A or 8B, the two protrusions 53 are identical in planar dimensions and protrusion height. This makes it possible to prevent the metal plate 8A or 8B from being inclined relative to the main surface of the semiconductor chip 4PH or 4PL.

However, the number or disposition of the protrusions 53 is not limited to the foregoing, and they can be variously modified. For example, the number of protrusions 53 disposed on the back surface of each of the metal plates 8A and 8B may be three or above. In cases where three protrusions 53 are disposed, the protrusions 53 may be disposed so that they are respectively positioned at apexes of an equilateral triangle. Thus, the metal plates 8A and 8B are supported in directions orthogonal to each other, and thus the metal plates 8A and 8B can be stably disposed. For this reason, the inclination of the metal plates 8A and 8B can be further suppressed or prevented.

The protrusions 53 are formed by, for example, embossing. Embossing is a forming method in which the metal plates 8A and 8B are sandwiched and pressed between an upper die and a lower die with their projections and depressions reversed and thereby projections and depressions are formed in the metal plates 8A and 8B. Coining, for example, may be used in place of embossing. Coining is a forming method in which the metal plates 8A and 8B are sandwiched and pressed between two dies either of which has depressions for protrusion formation and thereby projections and depressions are formed in the metal plates 8A and 8B. Both embossing and coining are easy to carry out, and neither results in increase in cost.

As for the other respects, this embodiment is identical with the first and third embodiments. Also, in the ninth embodiment, the shape of the hole 47B in the metal plate 8B may be as in the second and fourth to sixth embodiments. Further, the indentation 50 may be formed on the peripheries of the semiconductor chips 4PL and 4PH as in the seventh embodiment. The second portion 8A2 of the metal plate 8A may be divided into multiple sections as in the eighth embodiment.

Tenth Embodiment

In the description of the tenth embodiment, a case where a schottky barrier diode SBD is connected in parallel with the power MOS QL1 for low side will be taken as an example.

Figure 64:
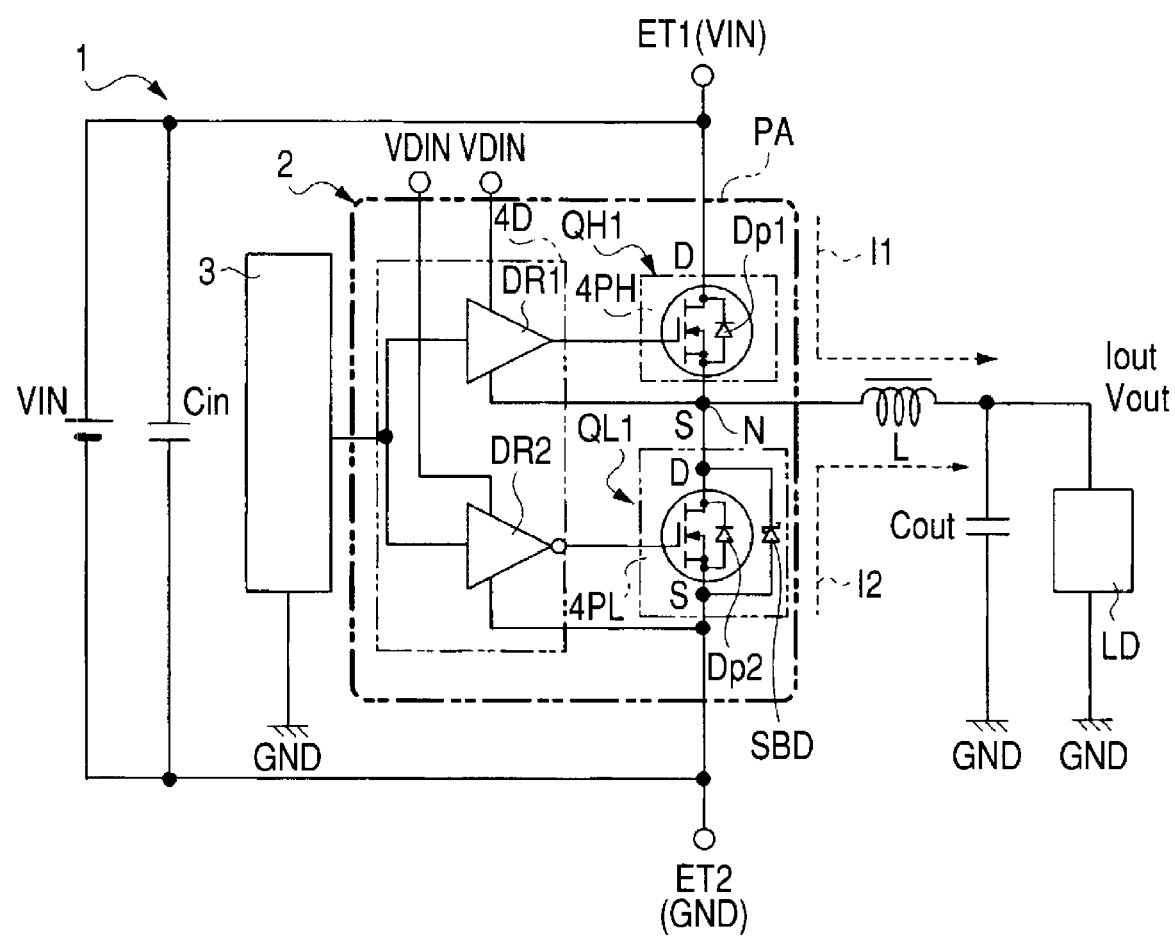
FIG. 64 is a circuit diagram of an example of a non-isolated DC-DC converter including a semiconductor device of another embodiment of the invention.

FIG. 64 is a circuit diagram of an example of a non-isolated DC-DC converter 1 including a semiconductor device 2 in the tenth embodiment.

In the tenth embodiment, a schottky barrier diode SBD is electrically connected in parallel with the power MOS QL1 for low side of the semiconductor device 2. More specific description will be given. The schottky barrier diode SBD has its anode electrically connected to the source S of the power MOS QL1 for low side (i.e., the terminal ET2 for supplying reference potential GND) and its cathode electrically connected to the drain D of the power MOS QL1 for low side (i.e., the output wiring (output node N) of the semiconductor device 2). The schottky barrier diode SBD is formed in the semiconductor chip 4PL with the power MOS QL1 for low side formed therein.

The forward voltage VF of the schottky barrier diode SBD is lower than the forward voltage VF of the parasitic diode Dp2 of the power MOS QL1 for low side. By connecting the schottky barrier diode SBD lower in forward voltage VF than the parasitic diode Dp2 in parallel with the power MOS QL1 for low side, voltage drop at a dead time when the power MOS QL1 for low side is turned off can be reduced. Therefore, the conduction loss of the diode can be reduced, and further the diode recovery loss can be reduced by shortening a reverse recovery time (trr). The other respects related to the circuitry are the same as described with reference to FIG. 1 and FIG. 2, and the description thereof will be omitted.

Figure 65:
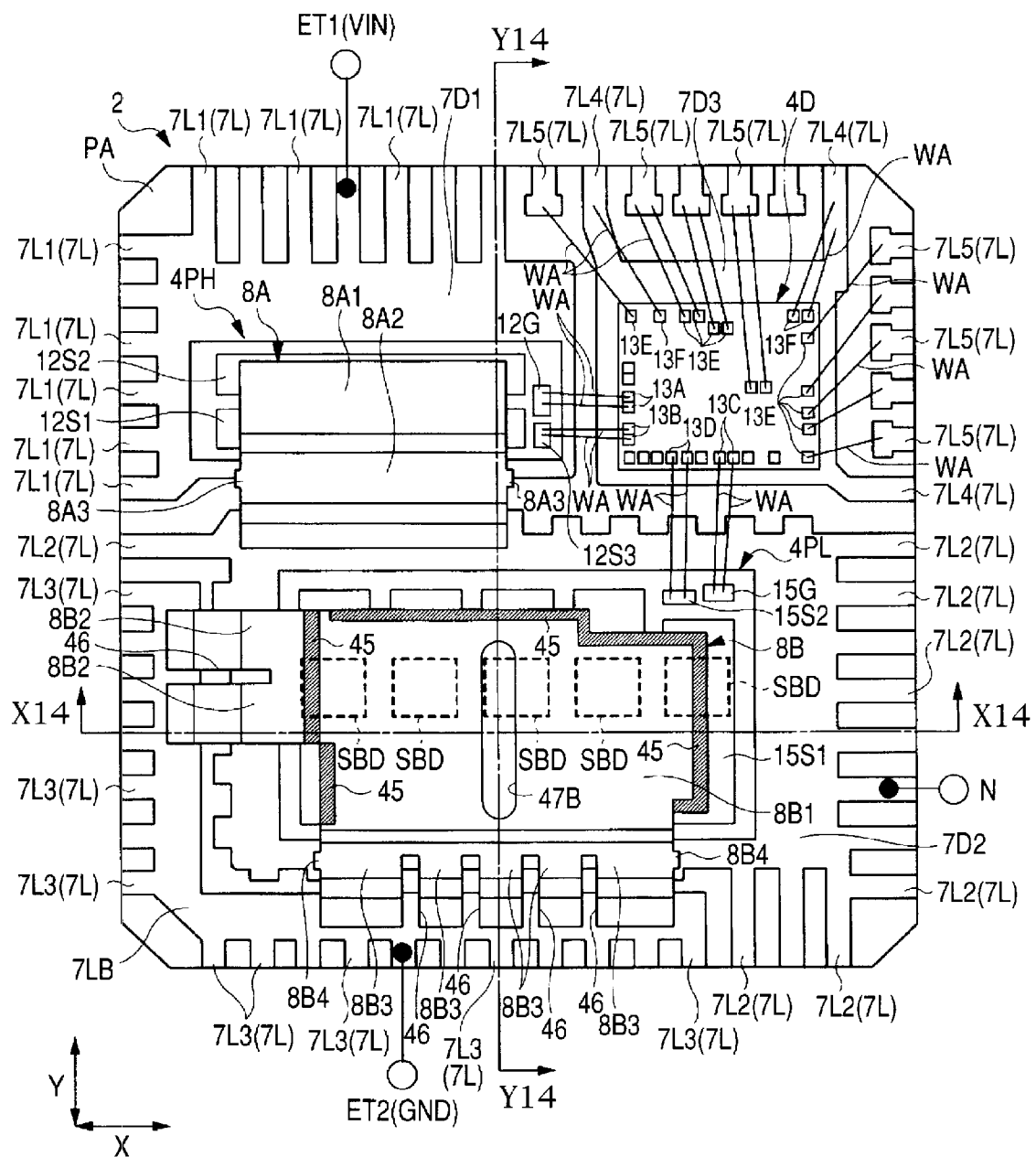
FIG. 65 is an overall plan view showing the interior of the package of the semiconductor device in FIG. 64 in a see-through manner.
Figure 66:
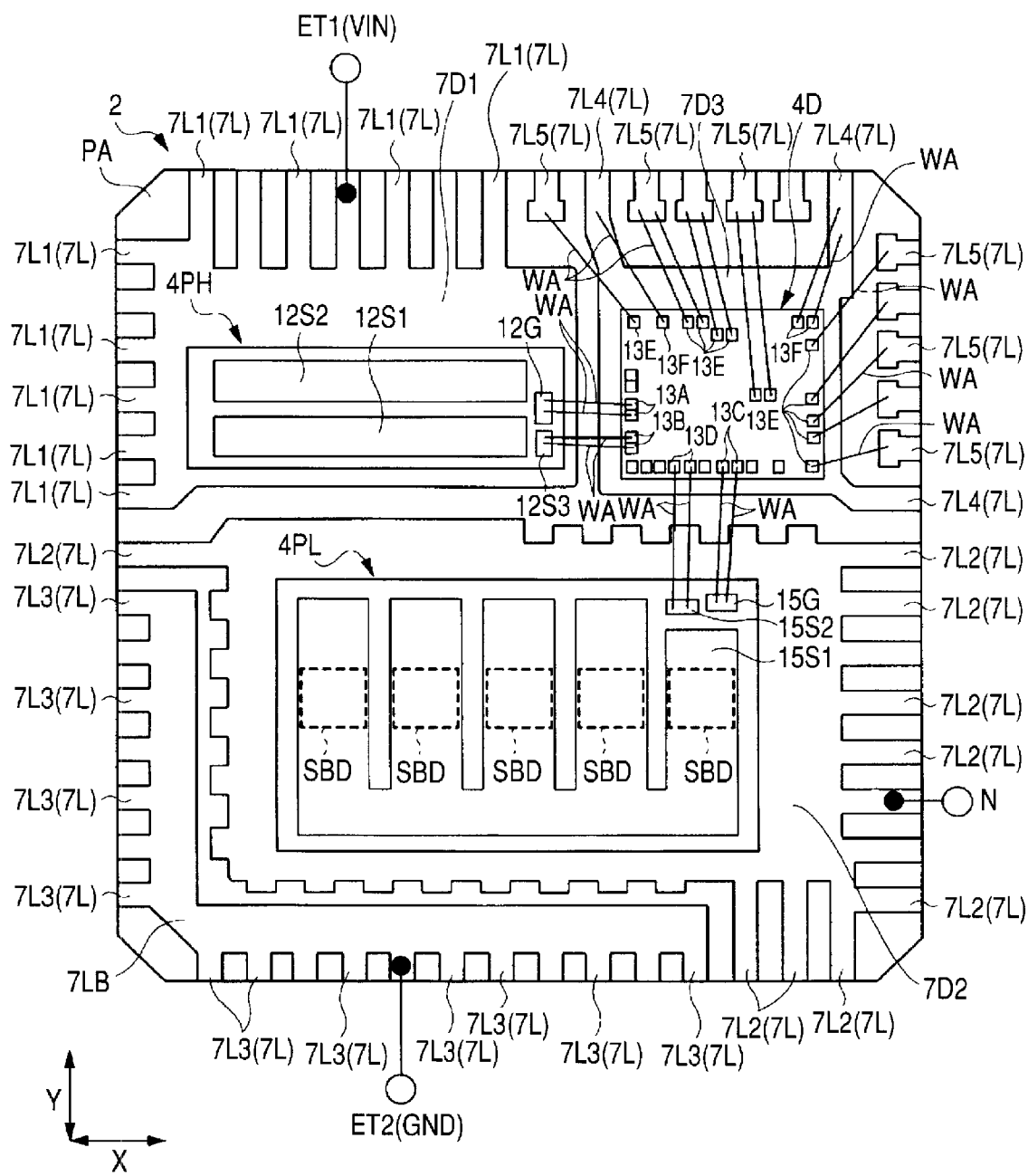
FIG. 66 is an overall plan view showing the interior of the package in FIG. 65 with metal plates removed in a see-through manner.

FIG. 65 is an overall plan view illustrating the interior of the package PA of the semiconductor device 2 in FIG. 64 in a see-through manner; and FIG. 66 is an overall plan view illustrating the interior of the package PA in FIG. 65 with the metal plates 8A and 8B removed in a see-through manner.

In the tenth embodiment, schottky barrier diodes SBD (indicated by broken lines) are formed in the semiconductor chip 4PL with the power MOS QL1 for low side formed therein. Thus, the parasitic inductance parasitic on the wiring that connects the power MOS QL1 and the schottky barrier diodes SBD can be significantly reduced. Therefore, it is possible to pass current through the schottky barrier diodes SBD rather than the parasitic diode Dp2 during dead time periods. Therefore, the conduction loss and recovery loss of the diodes can be reduced, and thus the power supply voltage conversion efficiency of the non-isolated DC-DC converter 1 can be enhanced.

Since the effects of the schottky barrier diodes SBD can be sufficiently obtained, it is possible to suppress or prevent turn-on of a parasitic npn bipolar transistor in the semiconductor chip 4D with the driver circuits DR1 and DR2 formed therein, and to suppress or prevent increase in the consumption current of the circuits in the semiconductor chip 4D.

Further, as the result of the schottky barrier diodes SBD and the power MOS QL1 for low side being formed in one and the same semiconductor chip 4PL, the system can be reduced in size.

In this case, the pad 15S1 for the source electrode of the semiconductor chip 4PL also functions as the anode electrodes of the schottky barrier diodes SBD. The pad 15S1 as the common electrode used as the source electrode and the anode electrodes is electrically connected to the metal plate 8A, electrically connected to the lead wiring 7LB through the metal plate 8A, and further electrically connected to the terminal ET2 for reference potential GND.

In this example, the schottky barrier diodes SBD are disposed in the center of the semiconductor chip 4PL in the direction of its short sides (second direction Y). This prevents the distance between the schottky barrier diodes SBD and the lead wiring 7LB from being increased. For this reason, the parasitic inductance on the anode side of the schottky barrier diodes SBD is not increased.

Further, by disposing the schottky barrier diodes SBD in the center of the semiconductor chip 4PL in the direction of its short sides (second direction Y), the distance between the power MOS QL1 and the lead wiring 7LB can also be prevented from being increased. For this reason, the parasitic inductance on the source side of the power MOS QL1 is not increased, either, and increase in the loss in the power MOS QL1 can also be suppressed.

As for the other respects, this embodiment is identical with the first and third embodiments. Also, in the tenth embodiment, the shape of the hole 47B in the metal plate 8B may be as in the second and fourth to sixth embodiments. Further, the indentation 50 may be formed on the peripheries of the semiconductor chips 4PL and 4PH as in the seventh embodiment. The second portion 8A2 of the metal plate 8A may be divided into multiple sections as in the eighth embodiment. Further, the protrusions 53 may be provided on the back surfaces of the metal plates 8A and 8B as in the ninth embodiment.

Figure 67:
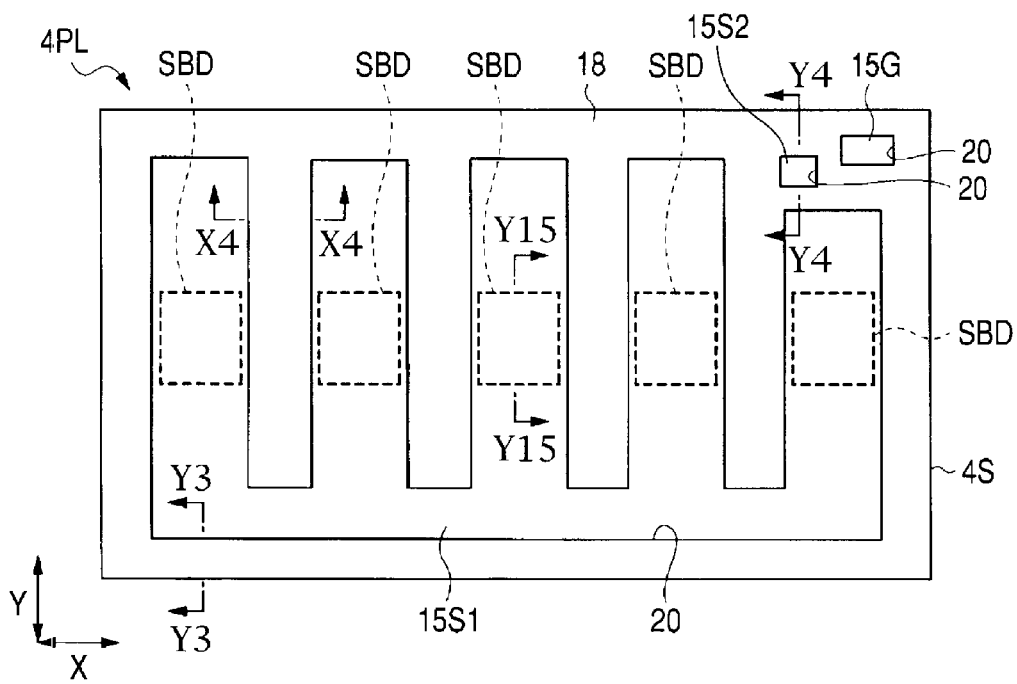
FIG. 67 is an overall plan view showing the uppermost layer of the semiconductor chip where a power transistor for low-side switch is formed, in the semiconductor device in FIG. 65.
Figure 68:
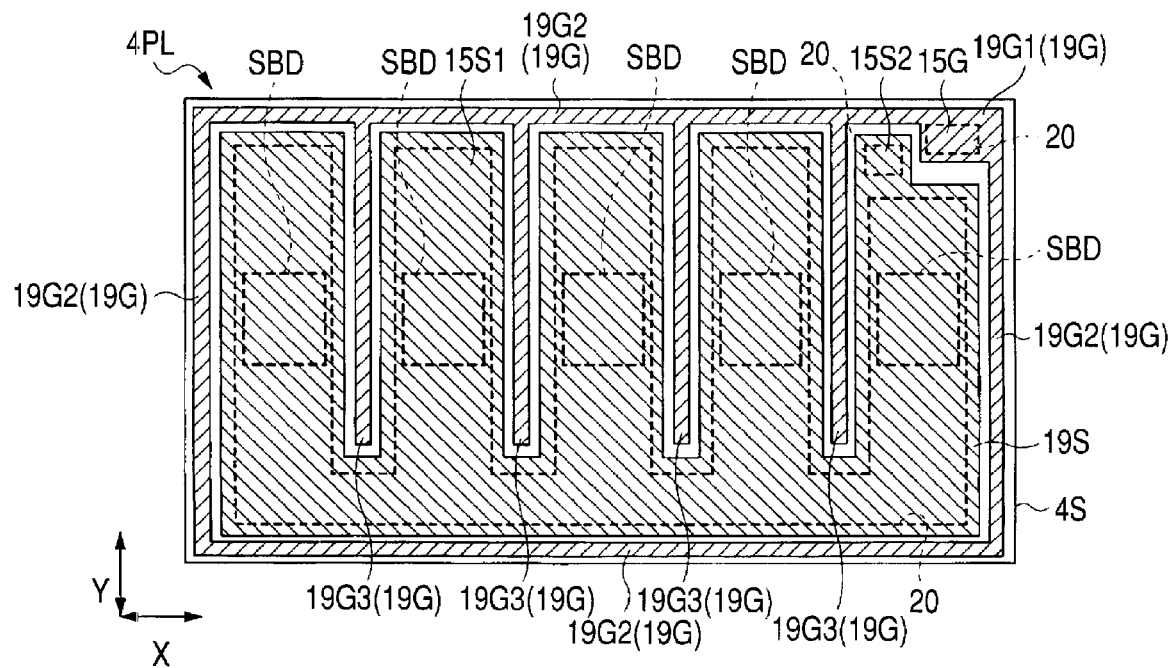
FIG. 68 is an overall plan view showing the uppermost wiring layer of the semiconductor chip in FIG. 67 where a power transistor for low-side switch is formed.
Figure 69:
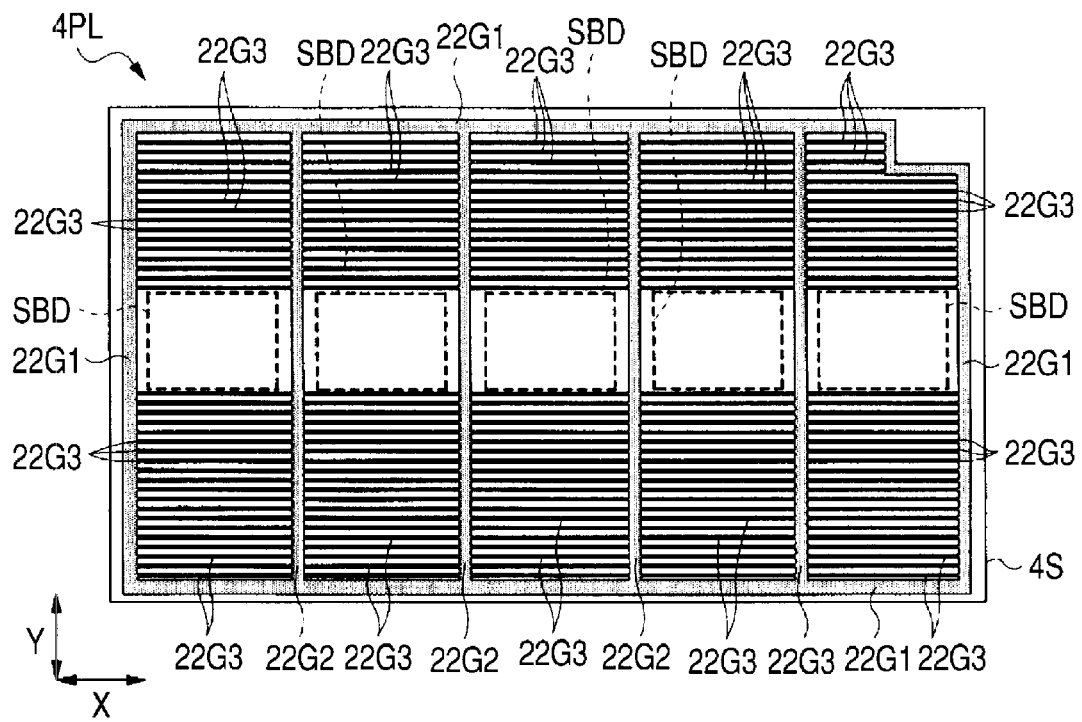
FIG. 69 is an overall plan view showing the gate electrode layer of the semiconductor chip in FIG. 67 where a power transistor for low-side switch is formed.
Figure 70:
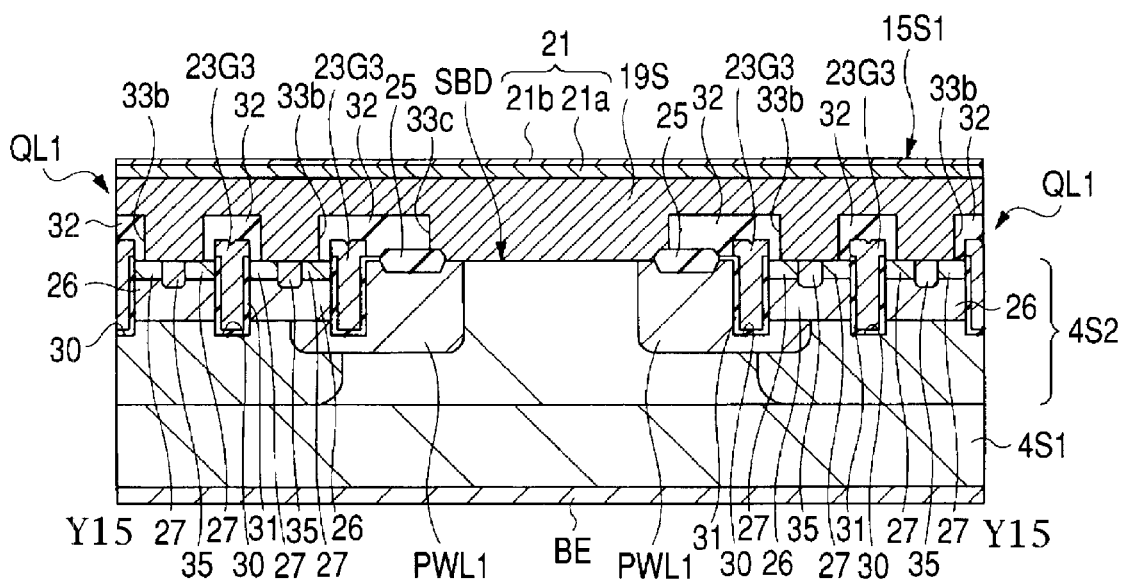
FIG. 70 is a sectional view taken along line Y15-Y15 of FIG. 67.

FIG. 67 is an overall plan view illustrating the uppermost layer of the semiconductor chip 4PL in the semiconductor device 2 in FIG. 65; FIG. 68 is an overall plan view illustrating the uppermost wiring layer of the semiconductor chip 4PL in FIG. 67; FIG. 69 is an overall plan view illustrating the gate electrode layer of the semiconductor chip 4PL in FIG. 67; and FIG. 70 is a sectional view taken along line Y15-Y15 of FIG. 67. A sectional view taken along line X4-X4 of FIG. 67 is identical with FIG. 17. A sectional view taken along line Y3-Y3 of FIG. 67 is identical with FIG. 16. A sectional view taken along line Y4-Y4 of FIG. 67 is identical with FIG. 19 and FIG. 20.

Similarly with the foregoing, the planar shape of the semiconductor chip 4PL is, for example, the shape of oblong whose length in the first direction X is longer than its length in the second direction Y. In the center of the main surface of the semiconductor chip 4PL in the second direction Y, there are formed the formation regions for the above-mentioned schottky barrier diode SBD at predetermined intervals along the first direction X. Each formation region for the schottky barrier diode SBD is disposed between adjacent gate finger portions 19G2 and 19G3 extended in the second direction Y.

Above and below the schottky barrier diode SBD formation regions in the second direction Y, there are disposed multiple unit transistor cells that form the power MOS QL1 so that they sandwich the schottky barrier diode SBD formation regions. From another view point, the formation regions for the multiple unit transistor cells of the power MOS QL1 on the main surface of the semiconductor chip 4PL are substantially equally divided into two, upper sections and lower section, in the second direction Y by the disposition of the above-mentioned formation regions for the schottky barrier diode SBD.

This makes it possible to shorten the distances from the schottky barrier diodes SBD to the farthest unit transistor cell of the power MOS QL1, as compared with cases where the formation regions for the schottky barrier diode SBD are unevenly disposed in proximity to either side of the semiconductor chip 4PL.

By dividing the formation regions for the multiple unit transistor cells of the power MOS QL1 into two in the direction of the short sides of the semiconductor chip 4PL, the following advantage is especially brought: the distances from the schottky barrier diodes SBD to the farthest unit transistor cell of the power MOS QL1 can be shortened as compared with cases where the formation regions for the schottky barrier diode SBD are disposed in the center of the semiconductor chip 4PL in the direction of its length so that they are extended along the direction of the short sides of the semiconductor chip 4PL.

As mentioned above, the pad 15S1 for source electrode is a common electrode used as the source electrode of the power MOS QL2 for low side and the anode electrodes of the schottky barrier diodes SBD. That is, the above-mentioned barrier metal layer (e.g., titanium tungsten) of the source wiring 19S that forms the pad 15S1 is in contact with the main surface of the epitaxial layer 4S2 through a contact hole 33c formed in the insulating film 32, in the formation regions for the schottky barrier diode SBD. The schottky barrier diodes SBD are formed in the areas of contact between the barrier metal layer and the epitaxial layer 4S2. In this example, the impurity concentration of the epitaxial layer 4S2 is set to a slightly low value (e.g., $5 \times 10^{15}/cm^3$ or so) to reduce the leakage current of the schottky barrier diodes SBD.

The back surface electrode BE of the semiconductor chip 4PL is a common electrode used as the drain electrode of the power MOS QL2 for low side and the cathode electrodes of the schottky barrier diodes SBD. As for the other respects, the construction of the tenth embodiment is identical with the construction described in relation to the first embodiment.

Eleventh Embodiment

With respect to the eleventh embodiment, description will be given to a modification to the disposition of the gate wiring 19G of the semiconductor chip 4PL with the power MOS for low side formed therein.

In the description of the first to tenth embodiments, cases where the multiple vertically long gate finger portions 19G3 are disposed over the main surface of the semiconductor chip 4PL with the power MOS QL1 for low side formed therein along the direction of the length of the semiconductor chip 4PL were taken as examples.

The disposition of the gate finger portions 19G3 is not limited to this, and multiple horizontally long gate finger portions 19G3 may be disposed along the direction of the short sides of the semiconductor chip 4PL. In this case, the source wiring 19S of the semiconductor chip 4PL is divided into multiple sections along the direction of the short sides of the semiconductor chip 4PL by the gate finger portions 19G3. Thus, the multiple pads 15S1 for source electrode are disposed along the direction of the short sides of the semiconductor chip 4PL.

With this construction, gate finger portions 19G3 composed of low-resistance aluminum or the like can be disposed in the direction of the length of the semiconductor chip 4PL. Even with an identical number of divisions, the length of the gate electrodes 22G3 formed of polycrystalline silicon can be more shortened by dividing the source wiring in the direction of the short sides of the semiconductor chip 4PL. As a result, the gate resistance of the power MOS QL1 for low side can be reduced; therefore, it is possible to reduce the switching loss of the power MOS QL1 for low side and to enhance the switching speed of the power MOS QL1 for low side.

However, in cases where the construction, illustrated in FIG. 25, in which the pad 15S1 for source electrode of the semiconductor chip 4PL and the lead wiring 7LB are connected with each other through multiple wires WB is adopted, it is indispensable to dispose the multiple vertically long gate finger portions 19G3 along the direction of the length of the semiconductor chip 4PL.

This is because, if the construction in which the multiple horizontally long gate finger portions 19G3 are disposed in the semiconductor chip 4PL along the direction of the short sides of the semiconductor chip 4PL is adopted in case of wire connection, the above-mentioned aluminum spreading resistance is increased. The reason why the aluminum spreading resistance is increased is as follows:

In case of wire WB connection, wires must be connected to the pad 15S1 portion closest to the lead wiring 7LB of the pads 15S1 for source electrode disposed along the direction of the short sides of the semiconductor chip 4PL. Therefore, the distances from the wire WB connecting positions to the farthest pad 15S1 is increased, and further the flow of current in the source wiring 19S is hindered by the gate finger portions 19G3.

The reason why wires WB must be connected to the pad 15S1 portion closest to the lead wiring 7LB is as follows: if a wire is connected to a pad 15S1 positioned in a direction far from the lead wiring 7LB of the pads 15S1 lined along the direction of the short sides of the semiconductor chip 4PL in case of wire WB connection, as mentioned above, the height of the loop of the wires WB increased. As a result, the wires WB are partly exposed from the package PA.

In this embodiment, meanwhile, the pad 15S1 for source electrode of the semiconductor chip 4PL and the lead wiring 7LB are electrically connected with each other through the metal plate 8B as mentioned above, and thus the aluminum spreading resistance can be reduced. For this reason, the multiple horizontally long gate finger portions 19G3 can be disposed over the main surface of the semiconductor chip 4PL with the power MOS QL1 for low side formed therein along the direction of the short sides of the semiconductor chip 4PL.

Figure 71:
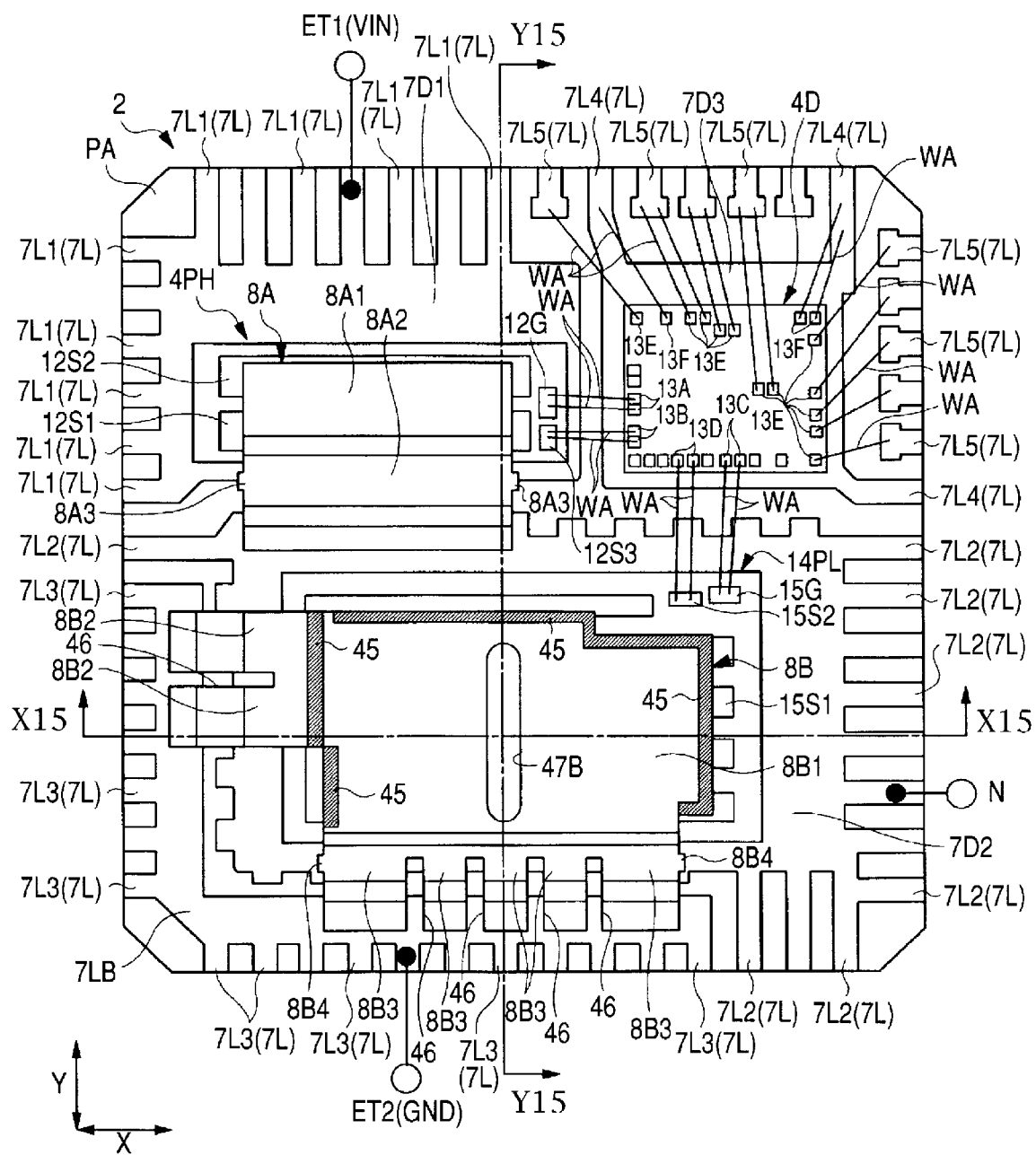
FIG. 71 is an overall plan view showing the interior of the package PA of a semiconductor device of another embodiment of the invention in a see-through manner.
Figure 72:
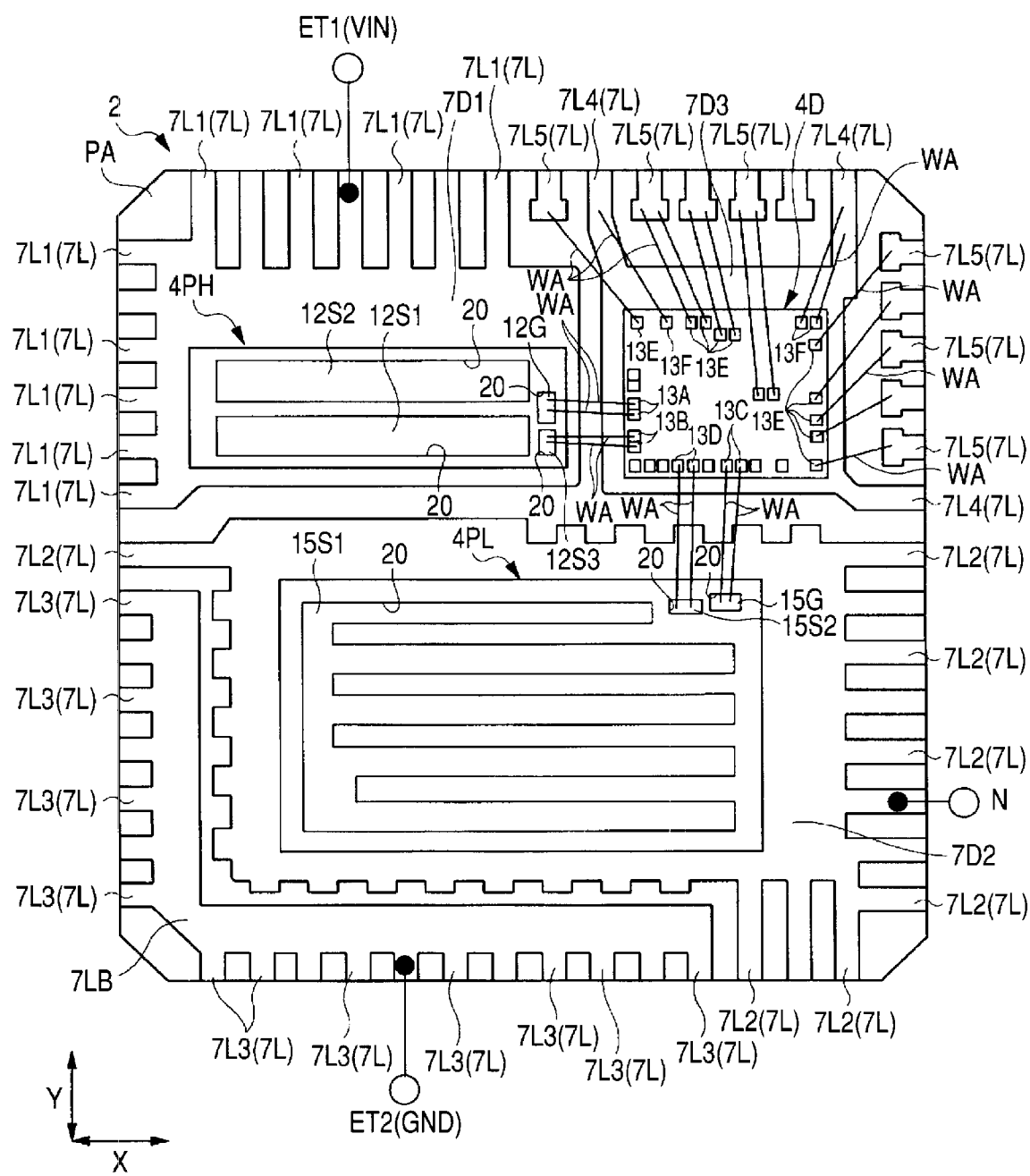
FIG. 72 is an overall plan view showing the interior of the package in FIG. 71 with metal plates removed in a see-through manner.
Figure 73:
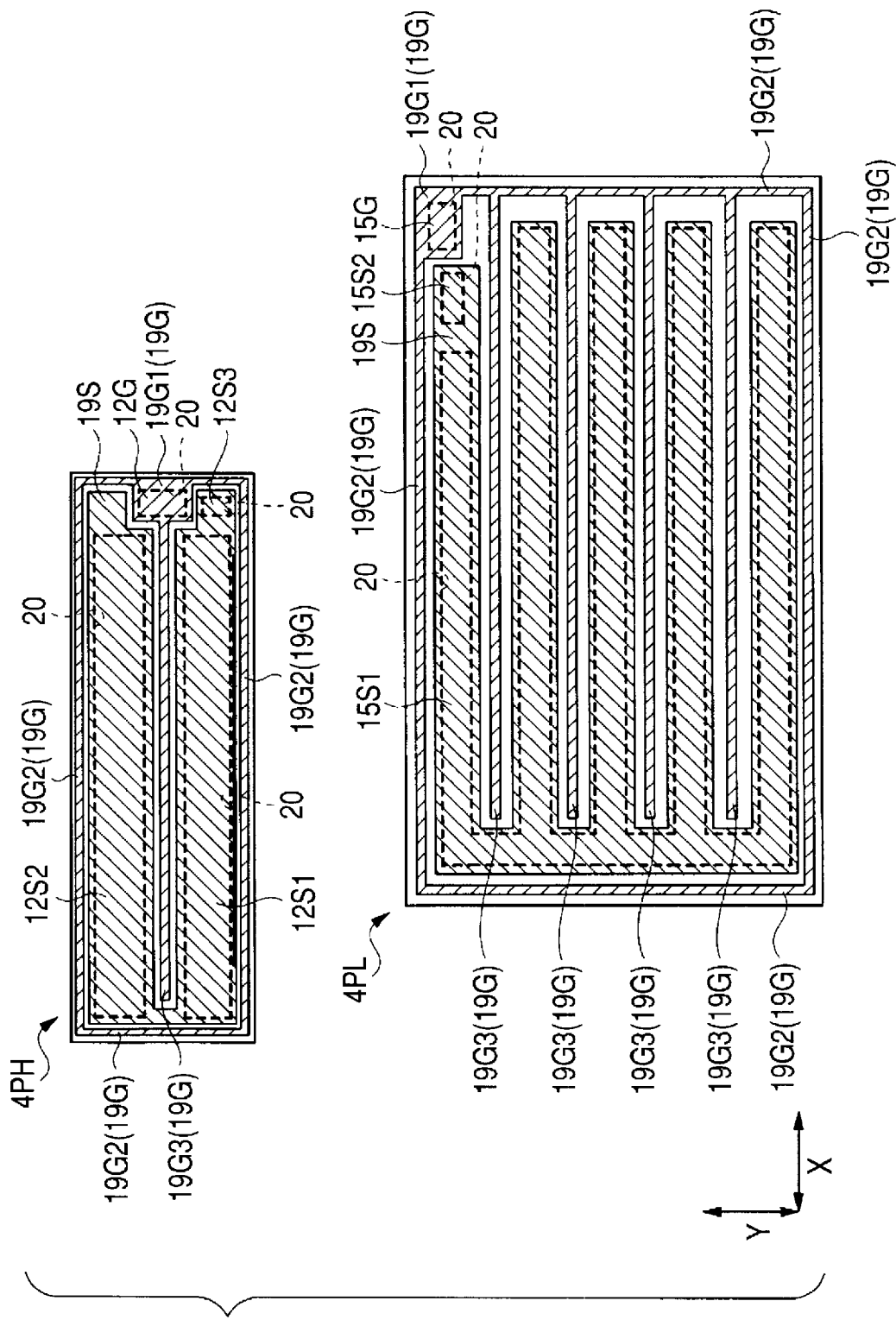
FIG. 73 is an overall plan view showing the uppermost wiring layer of semiconductor chips in the semiconductor device in FIG. 71 and FIG. 72.
Figure 74:
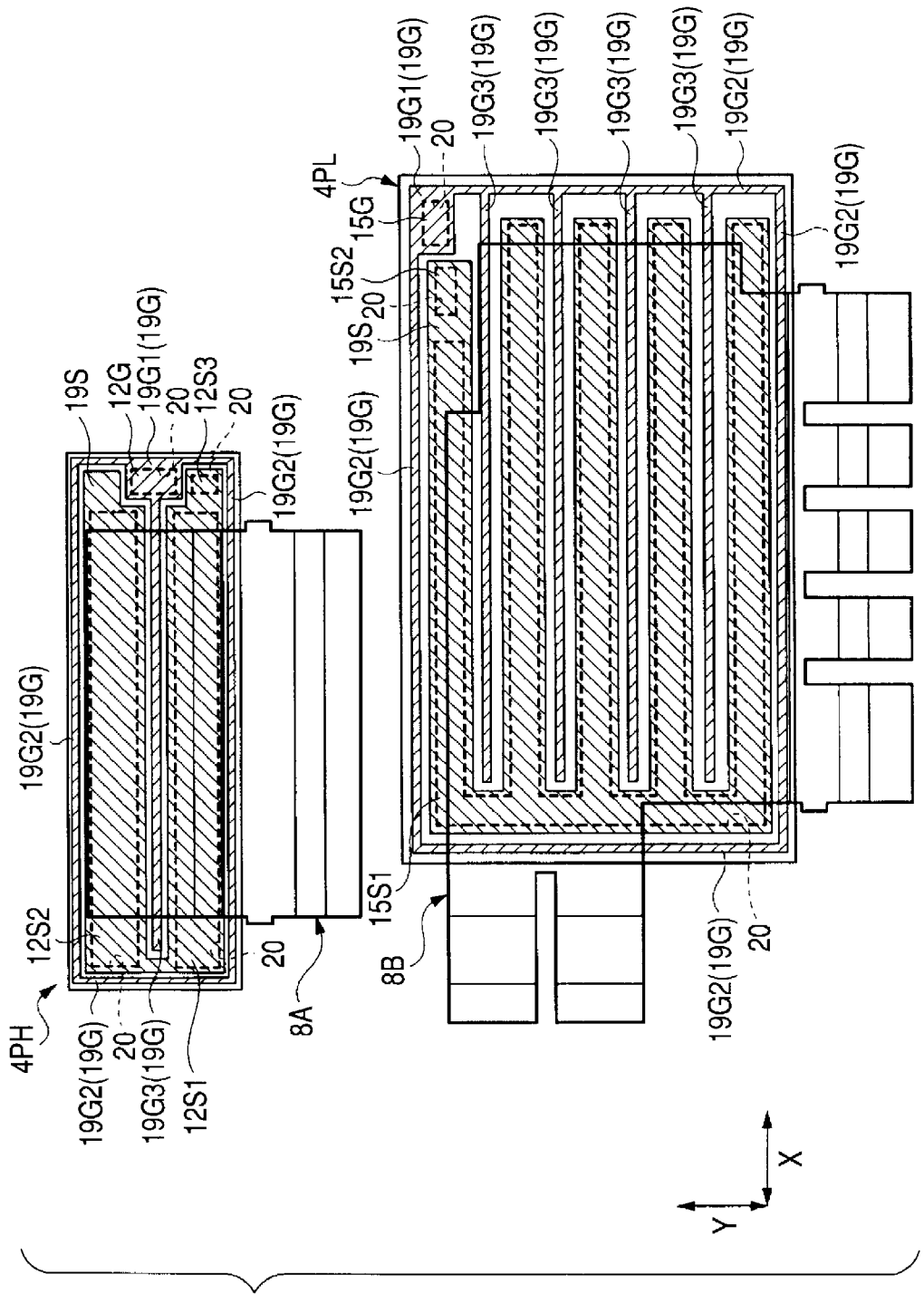
FIG. 74 is an overall plan view illustrating the positional relation between the gate electrode layer of the semiconductor chips in FIG. 73 and metal plates.
Figure 75:
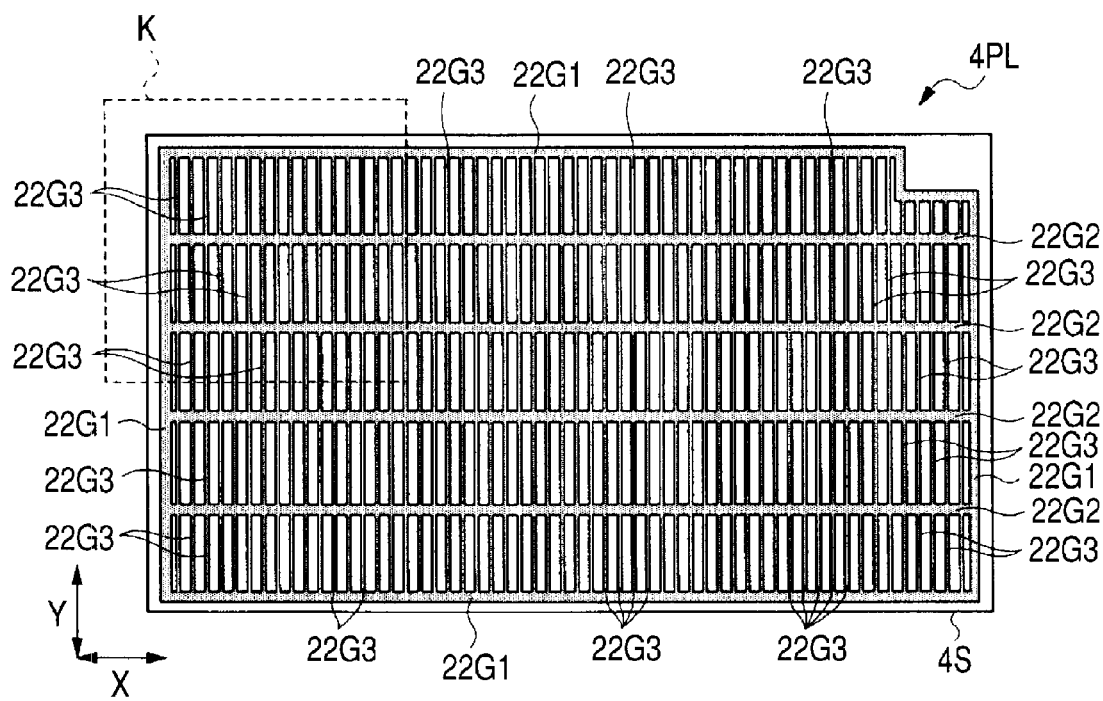
FIG. 75 is an overall plan view showing the gate electrode layer of a semiconductor chip in FIG. 73.
Figure 76:
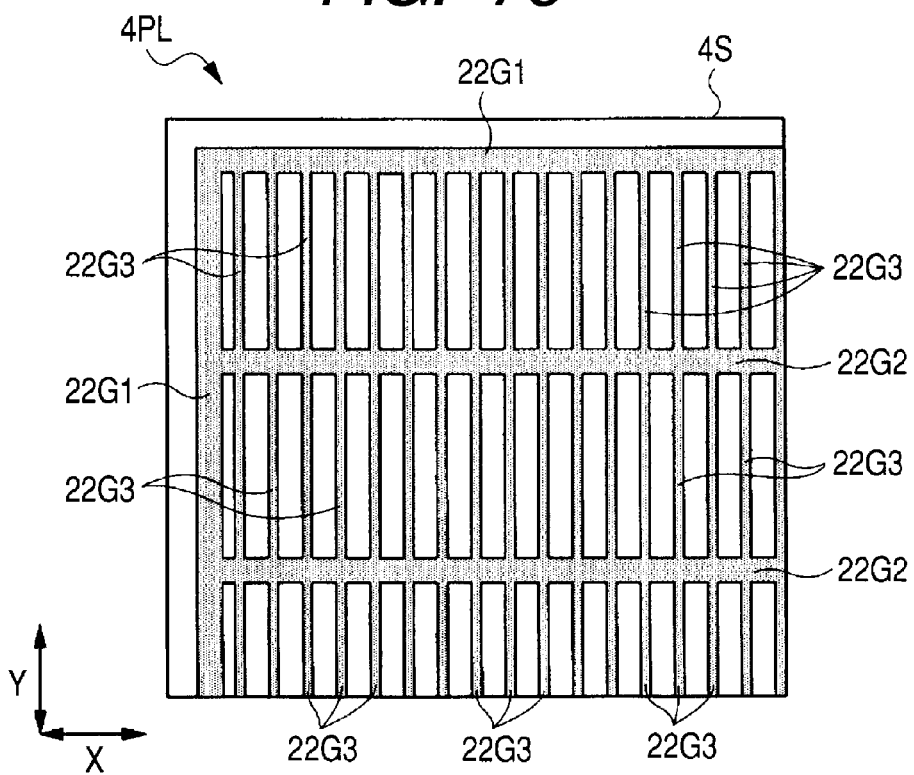
FIG. 76 is an enlarged plan view of region K of the gate electrode layer in FIG. 75.

FIG. 71 is an overall plan view illustrating the interior of the package PA of a semiconductor device 2 in the eleventh embodiment in a see-through manner; and FIG. 72 is an overall plan view illustrating the interior of the package PA in FIG. 71 with the metal plates 8A and 8B removed in a see-through manner. FIG. 73 is an overall plan view illustrating the uppermost wiring layers of the semiconductor chips 4PH and 4PL in the semiconductor device 2 in FIG. 71 and FIG. 72; FIG. 74 is an overall plan view illustrating the positional relation between the gate electrode layers of the semiconductor chips 4PH and 4PL and the metal plates 8A and 8B in FIG. 73; FIG. 75 is an overall plan view illustrating the gate electrode layer of the semiconductor chip 4PH, 4PL in FIG. 73; and FIG. 76 is an enlarged plan view of region K in FIG. 75. A sectional view taken along line X15-X15 of FIG. 71 is identical with FIG. 37. A sectional view taken along line Y16-Y16 of FIG. 71 is identical with FIG. 38.

In the eleventh embodiment, the multiple horizontally long gate finger portions 19G3 are disposed over the main surface of the semiconductor chip 4PL with the power MOS QL1 for low side formed therein, along the direction of the short sides of the semiconductor chip 4PL. Thus, the gate finger portions 19G3 composed of low-resistance aluminum or the like can be disposed in the direction of the length of the semiconductor chip 4PL. Even with an identical number of divisions, the length of the gate electrodes 22G3 formed of polycrystalline silicon can be more shortened by dividing the source wiring in the direction of the short sides of the semiconductor chip 4PL. As a result, the gate resistance of the power MOS QL1 for low side can be reduced; therefore, it is possible to reduce the switching loss of the power MOS QL1 for low side and to enhance the switching speed of the power MOS QL1 for low side.

In the eleventh embodiment, the pad 15S1 for source electrode on the main surface of the semiconductor chip 4PL is formed in comb-like shape as illustrated in FIG. 72 and FIG. 73. In the eleventh embodiment, however, the portions of the pad 15S1 for source electrode corresponding to the teeth of the "comb" are extended in the direction of the length of the semiconductor chip 4PL (first direction X).

In the eleventh embodiment, the multiple gate finger portions 19G3 of the semiconductor chip 4PL are formed in horizontally long shape and extended along the direction of the length of the semiconductor chip 4PL (first direction X) as illustrated in FIG. 73. The respective gate finger portions 19G3 of the semiconductor chips 4PH and 4PL in the package PA are so disposed that they are parallel with each other.

The multiple gate finger portions 19G3 of the semiconductor chip 4PL are disposed at predetermined intervals along the direction of the short sides of the semiconductor chip 4PL so that the main surface of the semiconductor chip 4PL is divided into multiple sections in the direction of its short sides (second direction Y). Each gate finger portion 19G3 of the semiconductor chip 4PL is extended from part of the gate finger portion 19G2 extended along one of the short sides of the semiconductor chip 4PL on the side where the gate pad portion 19G1 is disposed. Each gate finger portion 19G3 is extended toward the gate finger portion 19G2 on the opposite short side in the direction of the length of the semiconductor chip 4PL (first direction X), and is terminated in a position away from the gate finger 19G2 on the opposite short side. For this reason, one short side (short side on the right in FIG. 71 and FIG. 74) of the metal plate 8B in the direction of its length intersects (is orthogonal to) gate finger portions 19G3 as illustrated in FIG. 74.

As mentioned above, each gate finger portion 19G3 of the semiconductor chip 4PL is extended from part of the gate finger portion 19G2 extended along one of the short sides of the semiconductor chip 4PL on the side where the gate pad portion 19G1 is disposed. The reason for this is as follows:

In cases where each gate finger portion 19G3 is extended from part of the gate finger portion 19G2 extended along one of the short sides of the semiconductor chip 4PL on the side away from the gate pad portion 19G1, the distance from the gate pad portion 19G1 to the gate finger portion 19G3 is lengthened, and the speed of gate current supply is lowered.

In the case of the eleventh embodiment, the multiple gate wirings 22G2 are disposed as illustrated in FIG. 75 and FIG. 76 in the gate electrode layer under the gate wiring 19G and the source wiring 19S. That is, the multiple gate wirings 22G2 are disposed at predetermined intervals along the direction of the short sides of the semiconductor chip 4PL so that the main surface of the semiconductor chip 4PL is divided into multiple sections in the direction of its short sides (second direction Y). Each gate wiring 22G2 has both the ends in the direction of its length (first direction X) connected with the gate wirings 22G1 on the periphery of the semiconductor chip 4PL.

Also, in the eleventh embodiment, the gate electrodes 22G3 of the semiconductor chip 4PL are formed integrally with the gate wirings 22G1 and 22G2, and are disposed in a stripe pattern, for example. In the eleventh embodiment, however, the multiple gate electrodes 22G3 linearly extended along the direction of the short sides of the semiconductor chip 4PL (second direction Y) are disposed in line at desired intervals along the direction of the length of the semiconductor chip 4PL (first direction X) in each region defined by the multiple gate wirings 22G2. Also, in this case, however, the planar shape of disposition of the gate electrodes 22G3 need not be a stripe pattern, and can be modified in various manners. For example, they may be disposed in a reticular planar shape.

As for the other respects, this embodiment is identical with the first and third embodiments. Also, in the eleventh embodiment, the shape of the hole 47B in the metal plate 8B may be as in the second and fourth to sixth embodiments. The indentation 50 may be formed on the peripheries of the semiconductor chips 4PL and 4PH as in the seventh embodiment. The second portion 8A2 of the metal plate 8A may be divided into multiple sections as in the eighth embodiment. The protrusion 53 may be provided on the back surfaces of the metal plates 8A and 8B as in the ninth embodiment. Further, a schottky barrier diode SBD may be provided in the semiconductor chip 4PL as in the tenth embodiment.

Twelfth Embodiment

With respect to the twelfth embodiment, description will be given to an example of a manufacturing method for the semiconductor device 2 described in relation to the first to eleventh embodiments with reference to the flowchart in FIG. 77. In this description, a manufacturing method for the semiconductor device 2 described in relation to the third embodiment will be taken as an example.

First, a semiconductor wafer is prepared (Process 100). The semiconductor wafer is composed of, for example, a semiconductor thin plate in substantially circular planar shape, whose base material is single crystal silicon. It includes a main surface (first main surface) and a back surface (second main surface) positioned on the opposite sides to each other in the direction of its thickness.

Subsequently, through a wafer process (front-end process), multiple semiconductor chip regions are formed on the semiconductor wafer. The semiconductor chip cited here refers to the above-mentioned semiconductor chip 4D, 4PH, or 4PL, but the respective semiconductor chips 4D, 4PH, and 4PL are formed in separate semiconductor wafers. The above-mentioned wafer process refers to processes from subjecting a semiconductor wafer, as a starting material, with the epitaxial layer 4S2 formed over the substrate 4S1 to, for example, impurity implantation process, conductor film and insulating film disposition process, conductor film and insulating film etching process, electrode wiring formation process, and the like to forming pads in the multiple semiconductor chips on the semiconductor wafer.

Thereafter, the semiconductor wafer with the semiconductor chips 4PH and 4PL formed therein is subjected to, for example, electroless plating. Thus, for example, nickel and gold plating layers are formed from beneath on the surfaces of the pads 12G, 12S1, 12S2, 12S3, 15G1, 15S1, and 15S2 on the multiple semiconductor chips 4PH and 4PL in the semiconductor wafer. Thus, the above-mentioned metal layer 21 is formed on the surfaces of the pads 12G, 12S1, 12S2, 12S3, 15G1, 15S1, and 15S2 (Process 101).

Subsequently, a dicing tape is prepared (Process 102). The back surface of the semiconductor wafer is stuck to the adhesive surface of this dicing tape (Process 103). The semiconductor wafer stuck on the dicing tape is loaded into dicing equipment, and is separated into individual semiconductor chips (Process 104). Solder paste is prepared (Process 105A). The solder paste is made with, for example, lead-tin-silver-copper alloy used as the principal material.

Figure 78:
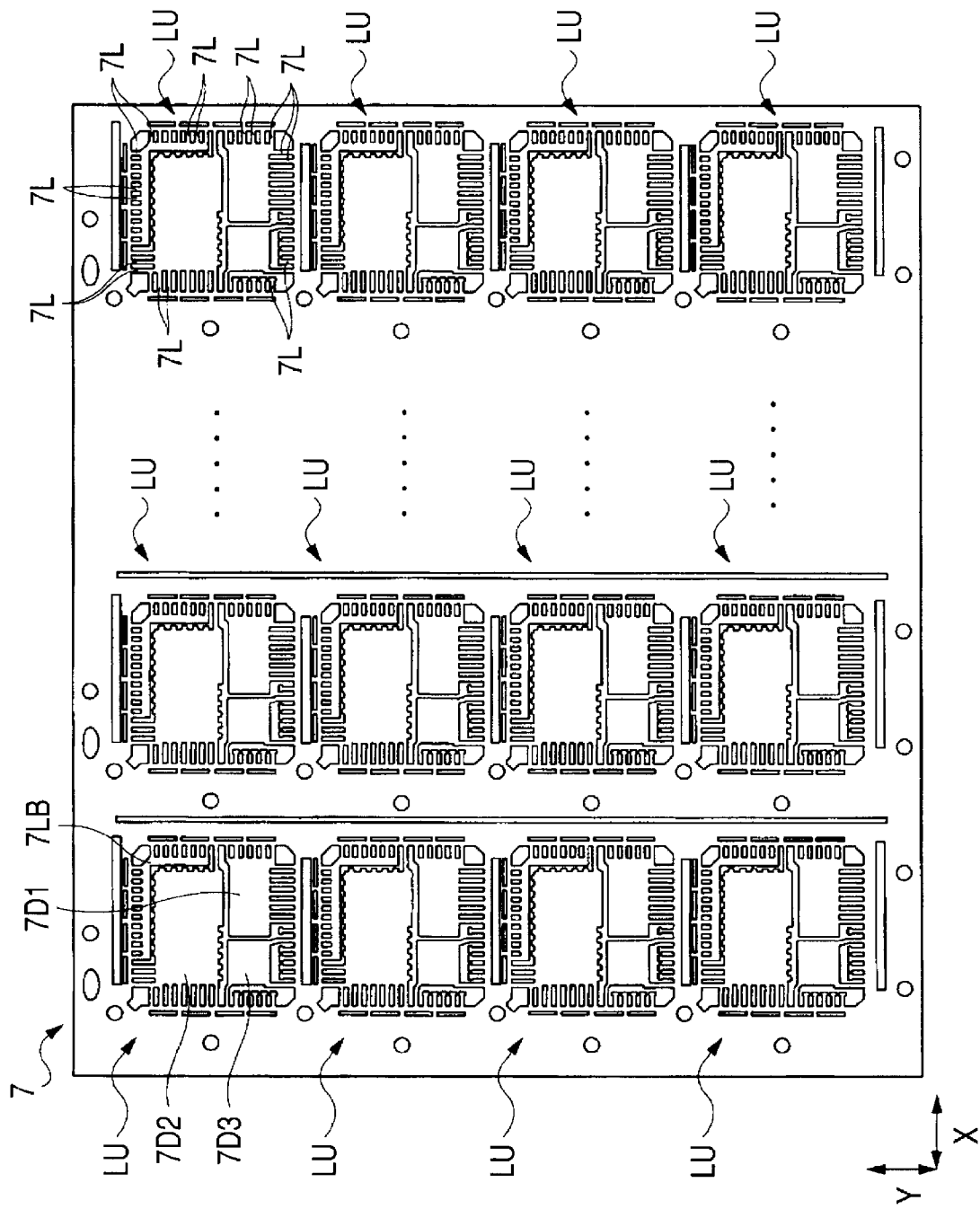
FIG. 78 is a plan view of an example of a lead frame used in the manufacturing process for a semiconductor device in FIG. 77.

A lead frame (wiring board, frame body) is prepared (Process 106). FIG. 78 is a plan view of an example of the lead frame 7. The lead frame 7 is composed of, for example, 42 alloy, and in the lead frame, there are disposed, for example, 56 (4 rows×14 columns) unit regions LU. In each unit region LU, there are integrally disposed die pads 7D1 to 7D3, leads 7L, and lead wiring 7LB required to construct one semiconductor device 2.

The semiconductor chip 4D is mounted over the die pad 7D3 in each unit region LU of the lead frame 7 through the above-mentioned solder paste. The semiconductor chip 4PH is mounted over the die pad 7D1 in each unit region LU of the lead frame 7 through the above-mentioned solder paste. Thereafter, the semiconductor chip 4PL is mounted over the die pad 7D2 in each unit region LU of the lead frame 7 through the above-mentioned solder paste (die bonding process 107). The order of mounting the semiconductor chips 4D, 4PH, and 4PL can be varied in various manners.

Figure 79:
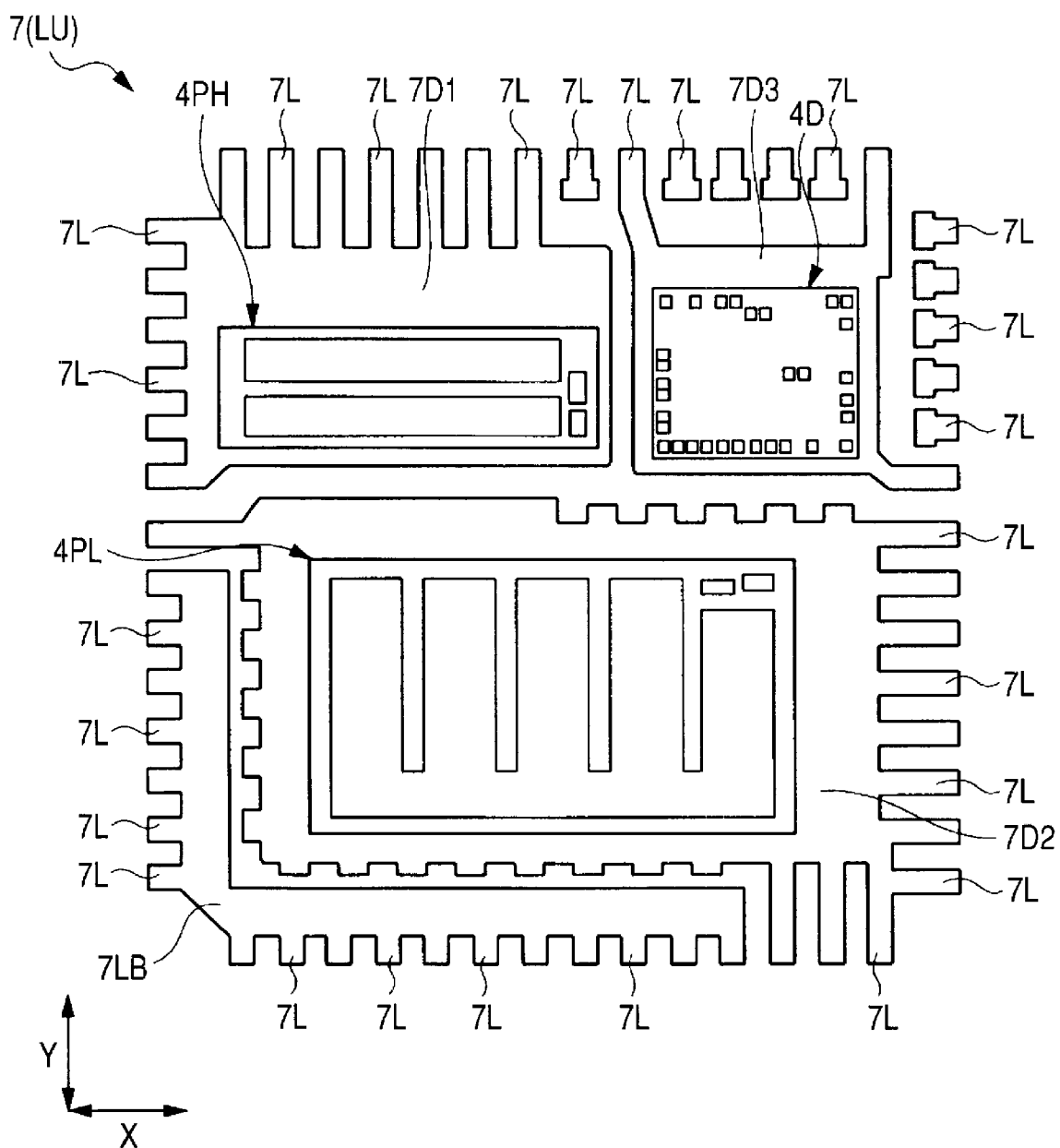
FIG. 79 is an enlarged plan view of a unit region in the lead frame that underwent the die bonding process for a semiconductor device in FIG. 77.

FIG. 79 is an enlarged plan view of a unit region LU of the lead frame 7 that underwent the above-mentioned die bonding process. Over the die pads 7D1 to 7D3 in the unit region LU of the lead frame 7, there are mounted the semiconductor chips 4PH, 4PL, and 4D through the above-mentioned solder paste with their main surfaces facing upward and their back surfaces opposed to the die pads 7D1 to 7D3.

Subsequently, solder paste is prepared (Process 108A). This solder paste is the same as that prepared in Process 105A. The solder paste prepared in Processes 105A and 108A is a material for forming the above-mentioned bonding layers 11a to 11c.

Figure 80A:
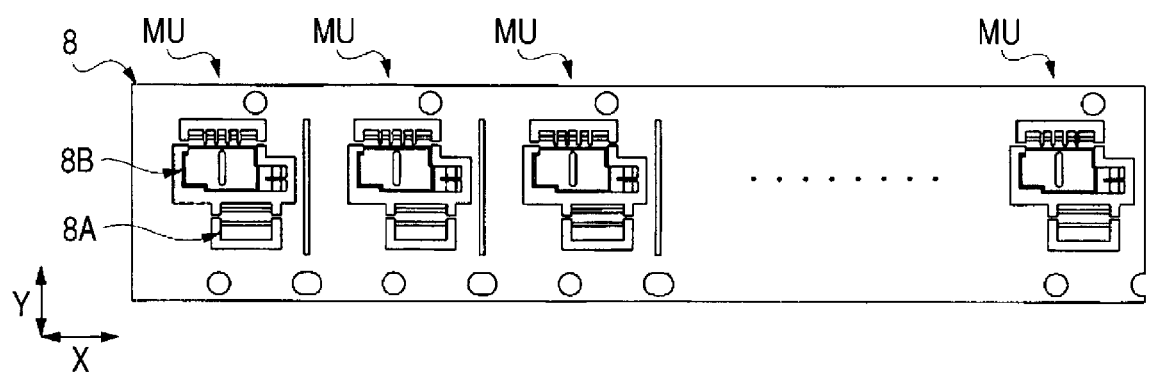
FIGS. 80A and 80B are plan views of an example of a metal plate frame used in the manufacturing process for a semiconductor device in FIG. 77.
Figure 80B:
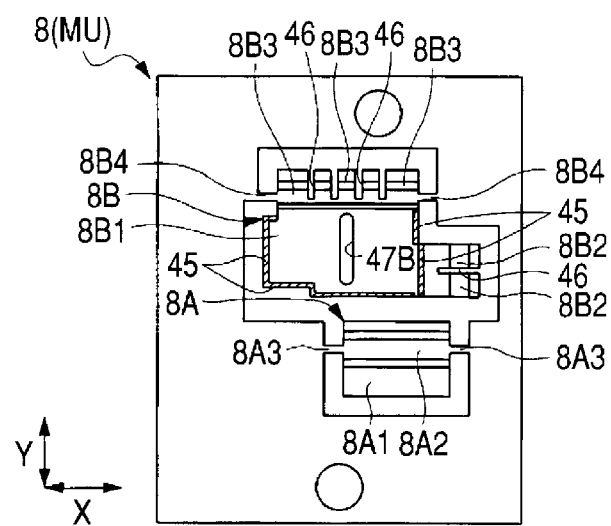

A metal plate frame (frame body) is prepared (Process 109). FIG. 80A is a plan view of an example of the metal plate frame 8. The metal plate frame 8 is formed of, for example, copper or the like, and in the metal plate frame, there are disposed, for example, 16 (1 row×16 columns) unit regions MU. In each unit region MU, there are integrally disposed metal plates 8A and 8B required for constructing one semiconductor device 2.

In the twelfth embodiment, hanging portions 8A3 and 8B4 that integrally connect the metal plates 8A and 8B and the metal frame 8 are formed in the following positions: positions away from each of the first portions 8A1 and 8B1 of the metal plates 8A and 8B. (These portions are portions that planarly overlap the main surfaces of the semiconductor chips 4PH and 4PL and are connected with the pads 12S1, 12S2, and 15s1.) Thus, even if chippings (burrs) are left on a cut surface when the hanging portions 8A3 and 8B4 are cut, it is possible to reduce or prevent a trouble caused by the chippings because the positions of the hanging portions 8A3 and 8B4 become farther away from the semiconductor chips 4PH and 4PL.

In the twelfth embodiment, the metal plates 8A and 8B in a unit region MU of a metal plate frame 8 are so disposed that their longs sides are parallel with each other and they are arranged in line along the direction intersecting (orthogonal to) the long sides (second direction Y). In addition, the disposition of (planar positional relation and adjacency distance between) the metal plates 8A and 8B in each unit region MU of a metal plate frame 8 is identical with the disposition of (planar positional relation and adjacency distance between) the metal plates 8A and 8B after they are mounted over the semiconductor chips 4PH and 4PL.

Subsequently, the hanging portions 8A3 and 8B4 of a set of metal plates 8A and 8B of the metal plate frame 8 are cut. Thereafter, the set of metal plates 8A and 8B is vacuumed and transported to directly above the semiconductor chips 4PH and 4PL on the die pads 7D1 to 7D3 in a unit region LU of the above-mentioned lead frame 7. In the twelfth embodiment, at this time, the state of disposition of (planar positional relation and adjacency distance between) the metal plates 8A and 8B in each unit region MU of the metal plate frame 8 is maintained, and the separated metal plates 8A and 8B are transported to directly above the semiconductor chips 4PH and 4PL.

Thereafter, the metal plates 8A and 8B and the semiconductor chips 4PH and 4PL are aligned with each other with respect to planar position, and then both the metal plates 8A and 8B are mounted over the semiconductor chips 4PH and 4PH in a lump through the above-mentioned solder paste. This metal plate bonding process is carried out with respect to each unit region LU of the lead frame 7, and thus, the metal plates 8a and 8B are mounted over the semiconductor chips 4PH and 4PL in all the unit regions LU of the lead frame 7 (Process 110). In the twelfth embodiment, as mentioned above, the metal plates 8A and 8B can be mounted over the semiconductor chips 4PH and 4PL in a lump. Therefore, it is possible to simplify the process for mounting the metal plates 8A and 8B and shorten a time required for the process as compared with cases where the metal plates 8A and 8B are separately mounted.

Figure 81:
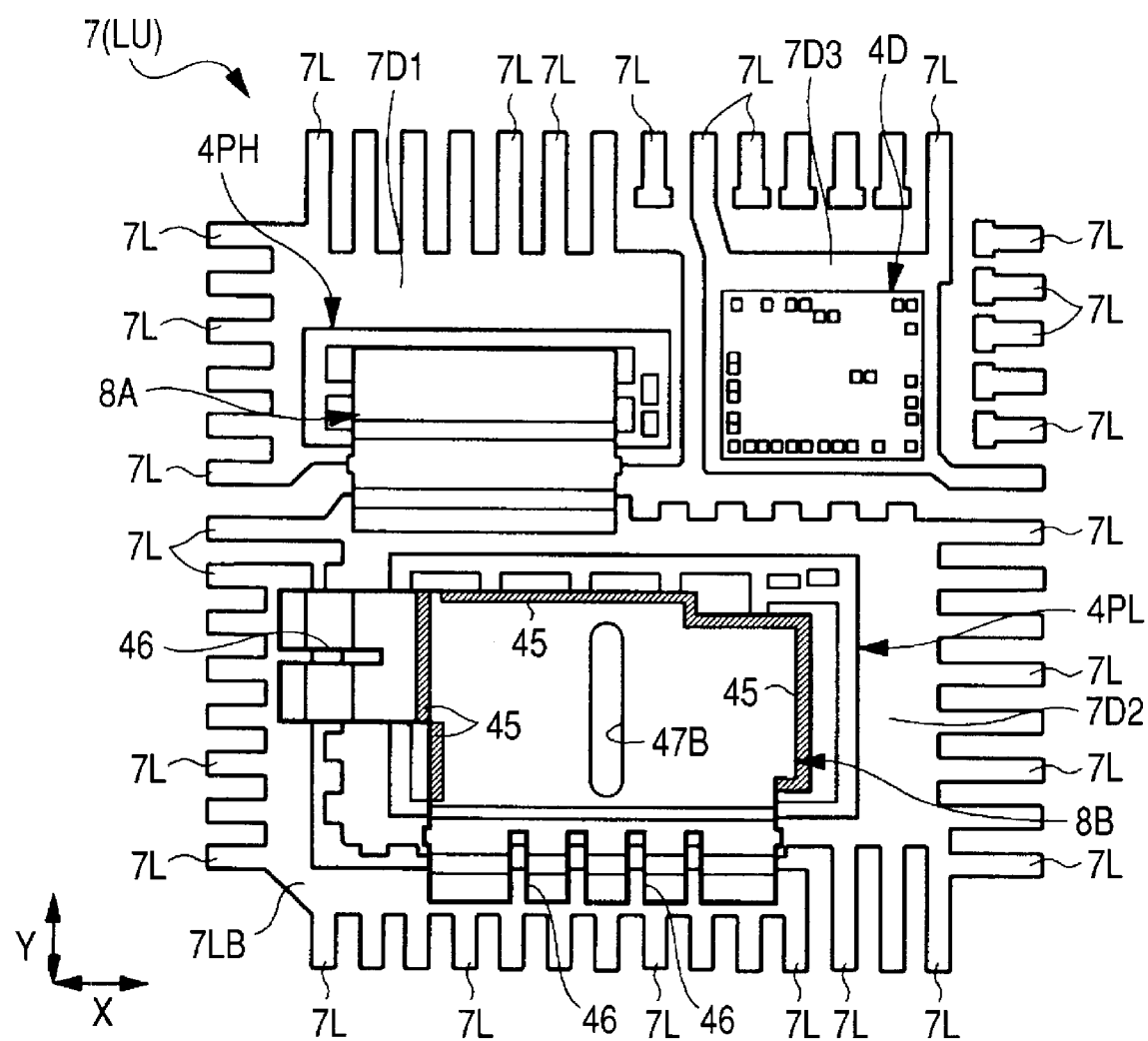
FIG. 81 is an enlarged plan view of a unit region in a lead frame that underwent the metal plate bonding process for a semiconductor device in FIG. 77.

FIG. 81 is an enlarged plan view of a unit region LU of a lead frame 7 after the metal plates 8A and 8B are mounted. The back surface of the first portion 8A1 of the metal plate 8A is bonded to the pads 12S1 and 12S2 for source electrode on the main surface of the semiconductor chip 4PH through the above-mentioned solder paste. The back surface of the tip of the second portion 8A2 of the metal plate 8A is bonded to the die pad 7D2 through the solder paste. The back surface of the first portion 8B1 of the metal plate 8B is bonded to the pad 15S1 for source electrode on the main surface of the semiconductor chip 4PL through the solder paste. The back surfaces of the tips of the second portion 8B2 and third portion 8B3 of the metal plate 8B are bonded to the lead wiring 7LB through the solder paste.

After the metal plates 8A and 8B is mounted over the semiconductor chips 4PH and 4PL in each unit region LU of the lead frame 7 through solder paste, heat treatment is carried out at 350° C., for example. Thus, the following are melted in a lump: the solder paste between the semiconductor chips 4PH, 4PL, and 4D and the die pads 7D1 to 7D3; the solder paste between the semiconductor chips 4PH and 4PL and the metal plates 8A and 8B; the solder paste between the metal plate 8A and the die pad 7D2; and the solder paste between the metal plate 8B and the lead wiring 7LD. The semiconductor chips 4PH, 4PL, and 4D are thereby bonded to (joined with) the die pads 7D1 to 7D3. At the same time, the metal plates 8A and 8B are bonded to (joined with) the semiconductor chips 4PH and 4PL, die pad 7D2, and lead wiring 7LB (reflow process 111A). In the twelfth embodiment, as mentioned above, the metal plates 8A and 8B can be bonded to the semiconductor chips 4PH and 4PL at the same time as the semiconductor chips 4PH, 4PL, and 4D are bonded to the die pads 7D1 to 7D3. Therefore, a time required for the manufacture of the semiconductor device 2 can be shortened. Further, since heat treatment and the like can be reduced, the reliability and yield of the semiconductor device 2 can be enhanced.

Subsequently, cleaning is carried out (Process 112). In this example, the flux produced during the above-mentioned reflow process 111A is immersed in alcohol solution or the like and thereby removed, and then plasma cleaning is carried out. The metal surfaces of wire connecting portions in the pads 13A to 13F and the like on the semiconductor chip 4D and the leads 7L of the lead frame 7 are exposed to the surface.

Figure 82:
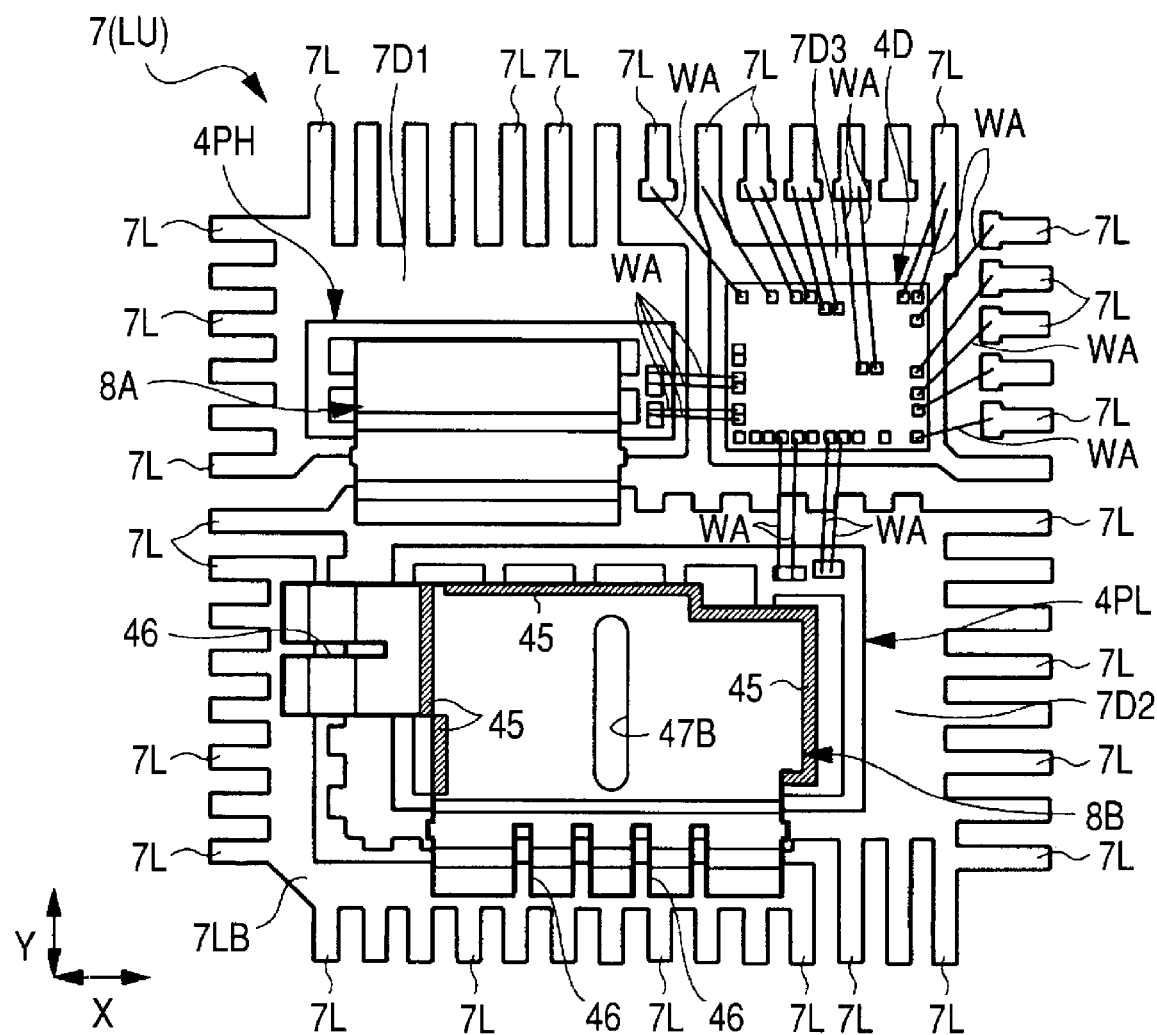
FIG. 82 is an enlarged plan view of a unit region in a lead frame that underwent the wire bonding process for a semiconductor device in FIG. 77.

Subsequently, a wire WA is prepared (Process 113), and the pads 13A to 13F on the semiconductor chip 4D and leads 7L of the lead frame 7 are connected with each other through the wire WA in each unit region LU of the lead frame 7 (wire bonding process 114). FIG. 82 is an enlarged plan view of a unit region LU of a lead frame 7 after wires WA are connected. The wires WA are connected to the pads 13A to 13F using ultrasonic vibration.

The metal plates 8A and 8B could be connected to the semiconductor chips 4PH and 4PL after wires WA are connected. In this case, however, there is the possibility that the metal plates 8A and 8B are brought into contact with a wire WA and the wire WA is deformed when the metal plates 8A and 8B are mounted and connected. In addition, stress is applied to the wire WA during the above-mentioned cleaning process 112 after the metal plates 8A and 8B are connected. This is unfavorable from the viewpoint of reliability and yield.

In the twelfth embodiment, meanwhile, the wires WA are connected after the process 111A for connecting the metal plates 8A and 8B (after the above-mentioned cleaning process 112). Thus, deformation failure in wires WA caused by contact with the metal plates 8A and 8B can be prevented. When the above-mentioned cleaning is carried out after the metal plates 8A and 8B are connected, wires WA have not been formed. Therefore, stress is not applied to wires WA during the cleaning process 112. For this reason, the reliability and yield of the semiconductor device 2 can be favorably ensured.

Figure 83:
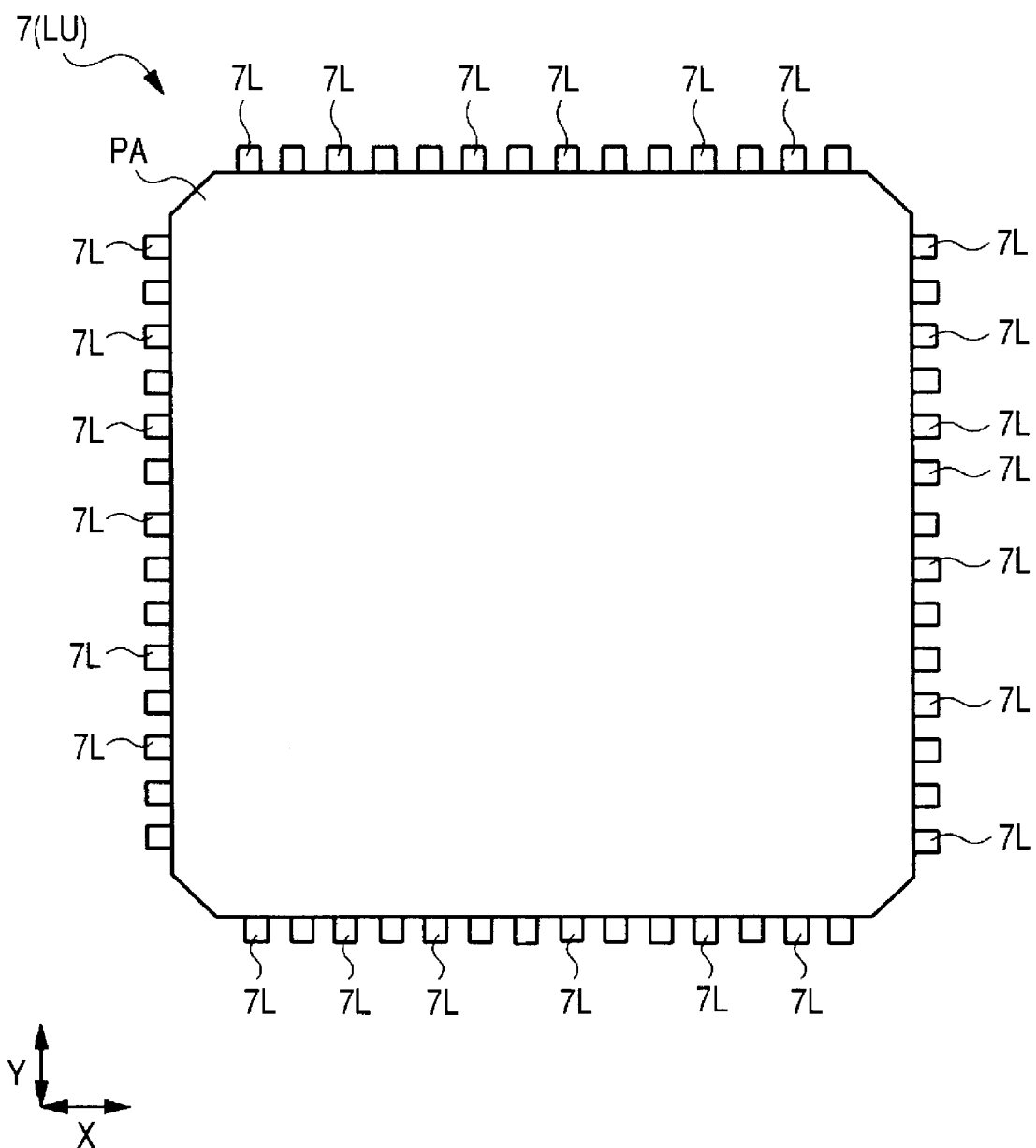
FIG. 83 is an enlarge plan view of a unit region in a lead frame that underwent the molding process for a semiconductor device in FIG. 77.

Subsequently, resin for package PA formation is prepared (Process 115). This resin is mainly composed of epoxy resin. Using this resin, the semiconductor chips 4D, 4PH, and 4PL and metal plates 8A and 8B in multiple unit regions LU of the lead frame 7 are sealed in a lump by transfer molding (molding process 116). FIG. 83 is an enlarged plan view of a unit region LU of a lead frame 7 after the molding process 116. In this example, multiple unit regions LU of the lead frame 7 are sealed in a lump; however, the packages PA of the individual unit regions LU of the lead frame 7 are separate from one another.

The individual packages PA may be obtained by sealing the multiple unit regions LU of a lead frame 7 with an integral resin sealing body, and thereafter cutting the lead frame into the individual unit regions LU.

Subsequently, the package PA is subjected to heat treatment (curing baking process 117), and then burrs of the resin for package PA formation and the like are removed. Further, the surface of the lead frame 7 (leads 7L) exposed from the package PA is plated with, for example, tin (Sn) and bismuth (Bi) from beneath (Process 118). Subsequently, a mark or the like is formed on the surface of the package PA in a desired position by laser or the like (Process 119), and then the leads 7L exposed from the package PA are cut to cut the individual packages PA out of the lead frame 7 (Process 120). Thus, the semiconductor device 2 is manufactured.

Thirteenth Embodiment

With respect to the thirteenth embodiment, description will be given to a manufacturing method for a semiconductor device in which silver paste is used as the material of the bonding layers 11a to 11c in place of the above-mentioned solder paste.

Figure 84:
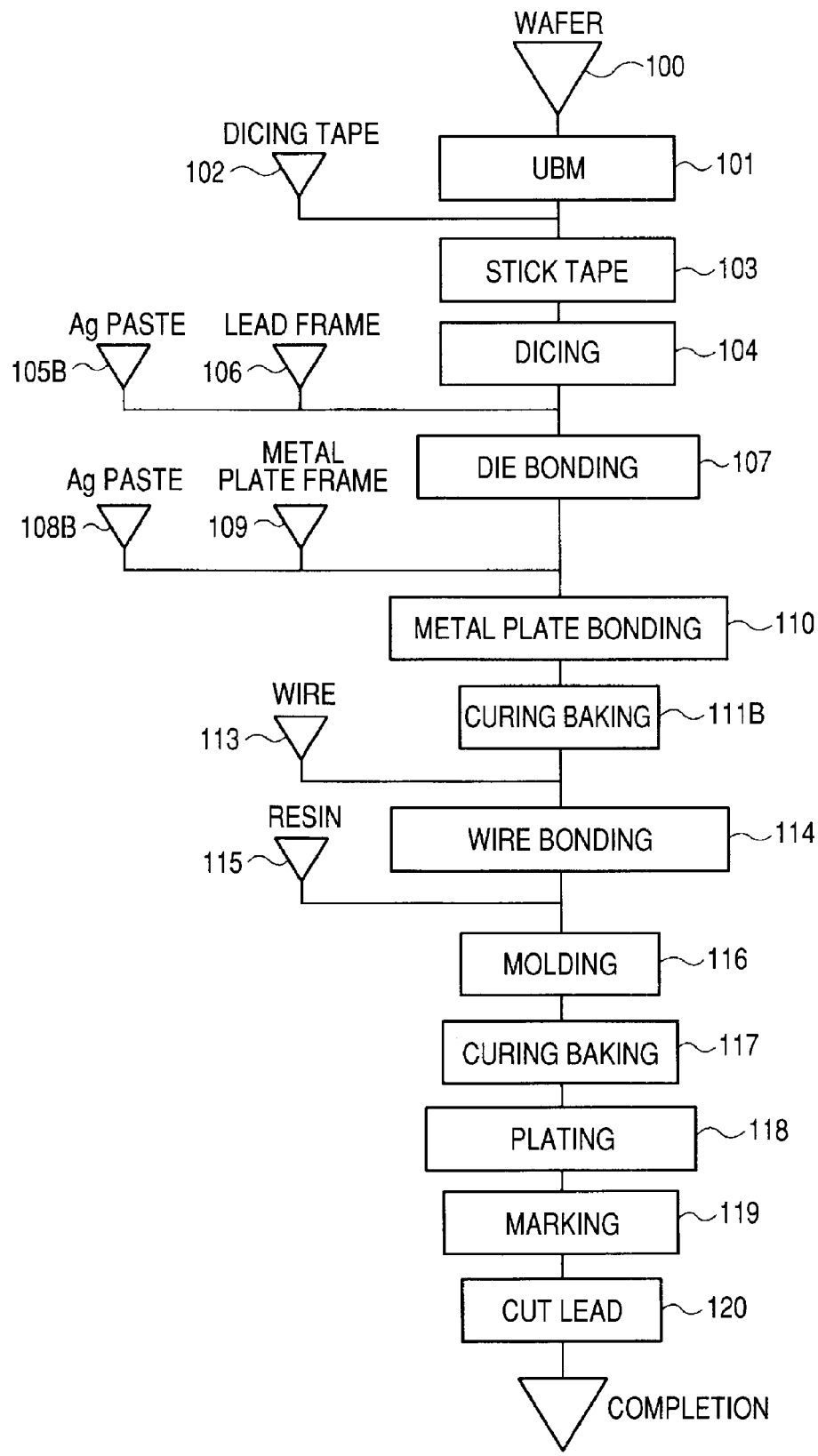
FIG. 84 is a flowchart of a manufacturing process for a semiconductor device of another embodiment of the invention.

FIG. 84 is a flowchart of the manufacture of the semiconductor device 2 in the thirteenth embodiment.

In the thirteenth embodiment, silver paste is prepared in Processes 105B and 108B, and silver paste is used in place of the above-mentioned solder paste in the die bonding process 107 and the metal plate bonding process 110.

Figure 77:
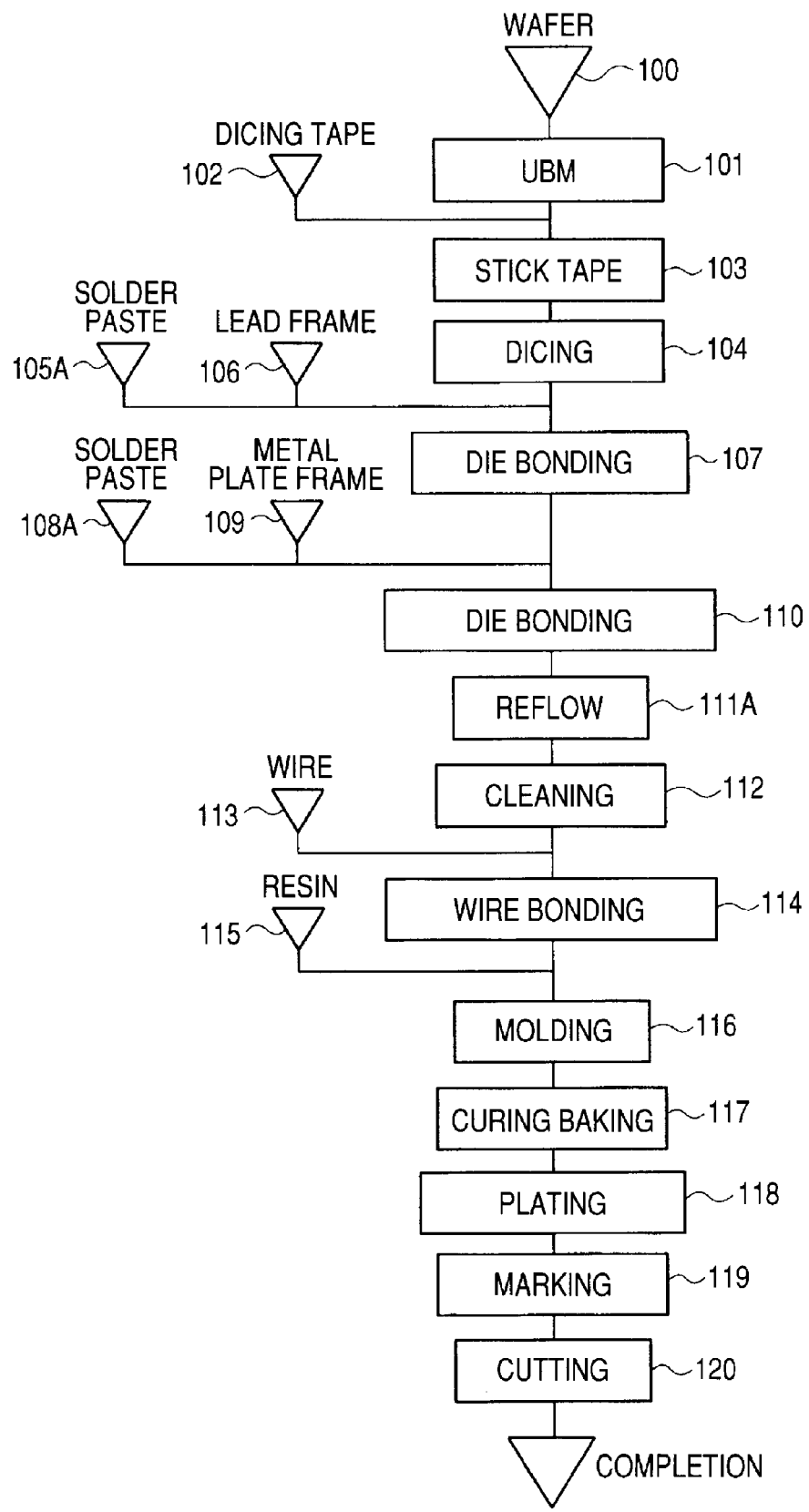
FIG. 77 is a flowchart of a manufacturing process for a semiconductor device of an embodiment of the invention.

After the metal plate bonding process 110, curing backing is carried out in place of the reflow process 111A in FIG. 77 (Process 111B).

This curing baking process 111B is carried out as follows: heat treatment is carried out at, for example, 180° C. to 200° C. or so to cure the epoxy resin in the silver paste. The semiconductor chips 4PH, 4PL, and 4D are thereby bonded to (joined with) the die pads 7D1 to 7D3, and the same time, the metal plates 8A and 8B are bonded to (joined with) the semiconductor chips 4PH and 4PL, die pad 7D2, and lead wiring 7LB.

In this case, the cleaning process 112 in FIG. 77 can be eliminated. For this reason, a time required for the manufacture of the semiconductor device 2 can be shortened more than in the twelfth embodiment. The reliability and yield of the semiconductor device 2 can be enhanced. Further, the cost of the semiconductor device 2 can be reduced.

The order and details of the other processes are the same as in the twelfth embodiment.

Fourteenth Embodiment

With respect to the fourteenth embodiment, description will be given to an example of another manufacturing method for the semiconductor device 2 in accordance with the manufacturing flowchart in FIG. 77 (or FIG. 84) with reference to FIG. 85 to FIG. 94.

In the fourteenth embodiment, the semiconductor chips 4PH, 4PL, and 4D are mounted over the die pads 7D1 to 7D3 in each unit region LU of a lead frame 7 through the above-mentioned solder paste or silver paste through Process 100 through Process 107 as in the twelfth and thirteenth embodiments, and then the following operation is performed in the metal plate bonding process 110.

Figure 85:
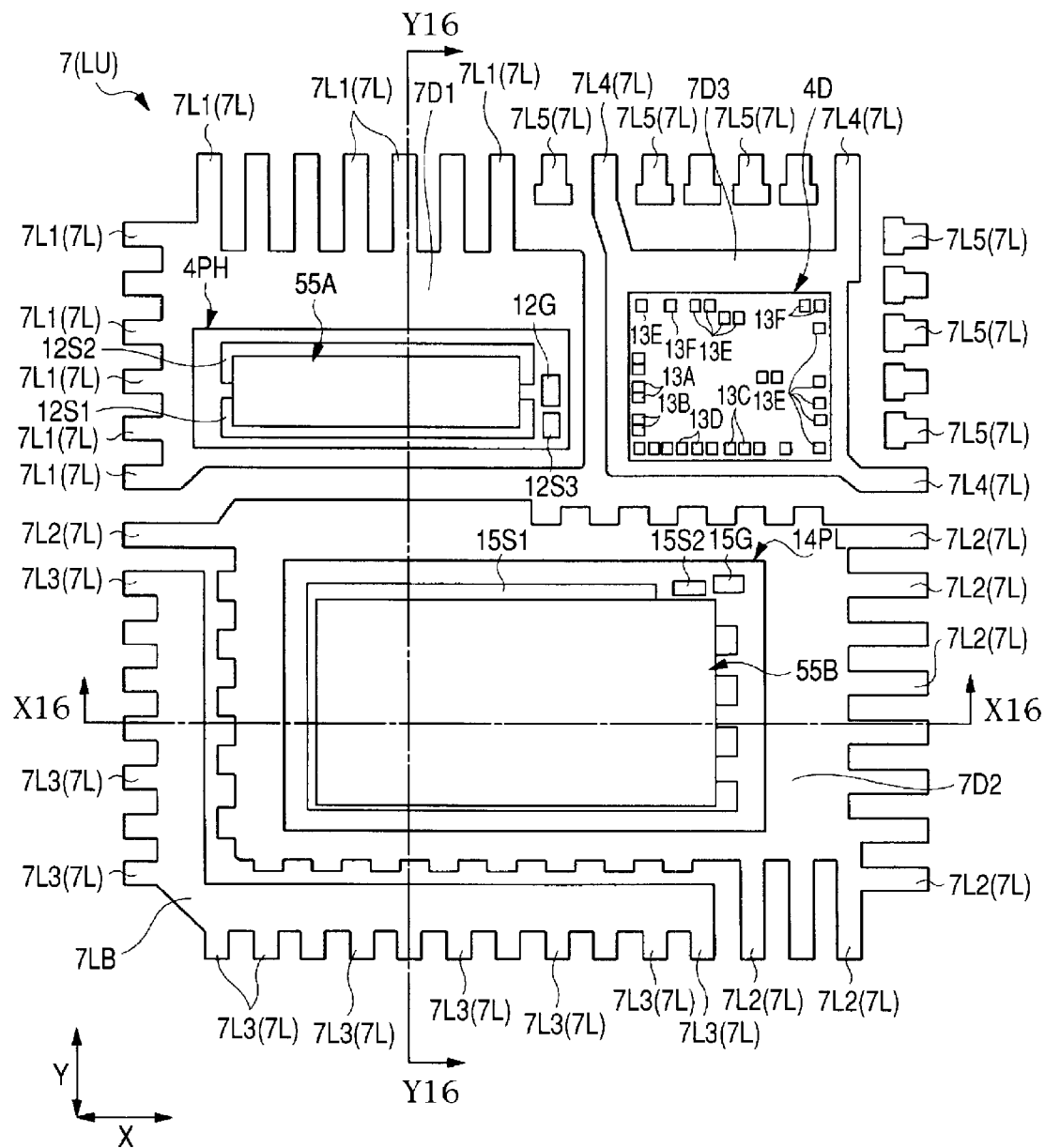
FIG. 85 is an enlarged plan view of one unit region in a lead frame in a manufacturing process for a semiconductor device of further another embodiment of the invention.
Figure 86:
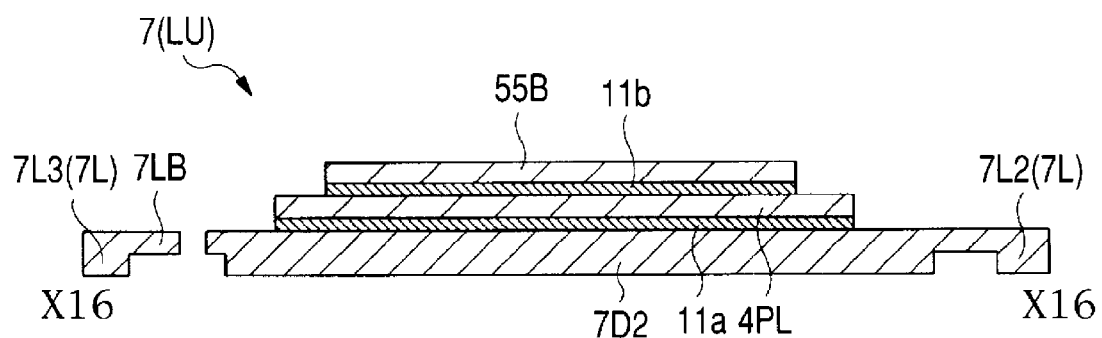
FIG. 86 is a sectional view taken along line X16-X16 of FIG. 85.
Figure 87:
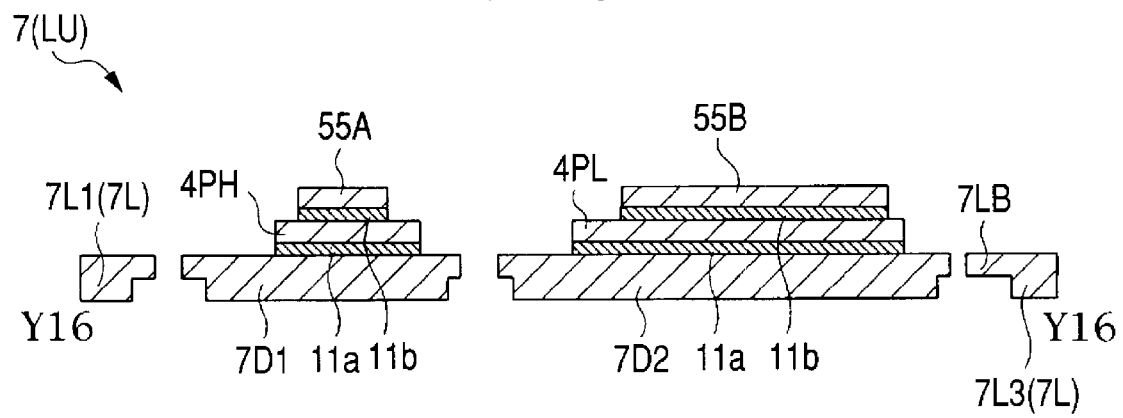
FIG. 87 is a sectional view taken along line Y16-Y16 of FIG. 85.

First, metal plates 55A and 55B are mounted over the main surfaces of the semiconductor chips 4PH and 4PL mounted over the die pads 7D1 and 7D2 of the lead frame 7 through the above-mentioned bonding layer 11b composed of solder paste, silver paste, or the like as illustrated in FIG. 85 to FIG. 87.

FIG. 85 is an enlarged plan view of one unit region of a lead frame 7 in the manufacturing process for the semiconductor device in the fourteenth embodiment; FIG. 86 is a sectional view taken along line X16-X16 of FIG. 85; and FIG. 87 is a sectional view taken along line Y16-Y16 of FIG. 85.

The metal plates 55A and 55B are formed of a metal, such as copper (Cu) or aluminum (Al), high in electrical conductivity and thermal conductivity. The planar shapes of the metal plates 55A and 55B are both, for example, simple oblong shape. The metal plates 55A and 55B are identical with each other in thickness, but are different in planar size. The planar area (size in the direction of length and the direction of short sides) of the metal plate 55B over the semiconductor chip 4PL is larger than the planar area (size in the direction of length and the direction of short sides) of the metal plate 55A over the semiconductor chip 4PH.

The metal plates 55A and 55B are mounted over the main surfaces of the semiconductor chips 4PH and 4PL so that the direction of their length agrees with the direction of the length of the semiconductor chips 4PH and 4PL. The back surface of the metal plate 55A is bonded to the pads 12S1 and 12S2 for source electrode on the main surface of the semiconductor chip 4PH through the bonding layer 11b. The back surface of the metal plate 55B is bonded to the pad 15S1 for source electrode on the main surface of the semiconductor chip 4PL through the bonding layer 11b.

The metal plate 55A is so formed that its planar size (planar area) is smaller than the planar size (planar area) of the semiconductor chip 4PH or the total area of the regions of disposition of the pads 12S1 and 12S2 for source electrode. The metal plate 55A is mounted so that the periphery of the metal plate 55A does not protrude outward from the periphery of the semiconductor chip 4PH and it fits into the main surface of the semiconductor chip 4PH.

The metal plate 55B is also so formed that its planar size (planar area) is smaller than the planar size (planar area) of the semiconductor chip 4PL or the planar area of the region of disposition of the pad 15S1 for source electrode. The metal plate 55B is mounted so that the periphery of the metal plate 55B does not protrude outward from the periphery of the semiconductor chip 4PL and it fits into the main surface of the semiconductor chip 4PL.

This is a construction with the following problem mentioned above taken into account: electrical continuity between the main surface (source S) and back surface (drain D) of the semiconductor chip 4PH or 4PL is caused by the material of the bonding layer 11b. More specific description will be given. When the metal plate 55A or 55B does not protrude outward from the periphery of the semiconductor chip 4PH or 4PL, the material of the bonding layer 11b is less prone to leak toward a side face of the semiconductor chip 4PH or 4PL. Therefore, faulty electrical continuity between the main surface (source S) and back surface (drain D) of the semiconductor chip 4PH or 4PL caused by the material of the bonding layer 11b can be reduced.

In a process for mounting these metal plates 55A and 55B, the metal plates 55A and 55B may be separately vacuumed and mounted over the main surfaces of the semiconductor chips 4PH and 4PL. Instead, the following method may be adopted as in the twelfth and thirteenth embodiments: the metal plates 55A and 55B are prepared with the same disposition as when they are mounted and vacuumed in a lump, and they are mounted over the main surfaces of the semiconductor chips 4PH and 4PL in a lump with respect to each unit region LU of the lead frame 7. This makes it possible to simplify the process for mounting the metal plates 55A and 55B and shorten a time required for the process as compared with cases where the metal plates 55A and 55B are separately mounted.

In this stage, the bonding layer 11a between the semiconductor chip 4PH and the die pad 7D1 and between the semiconductor chip 4PL and the die pad 7D2 is formed of the above-mentioned solder paste or silver paste.

Figure 88:
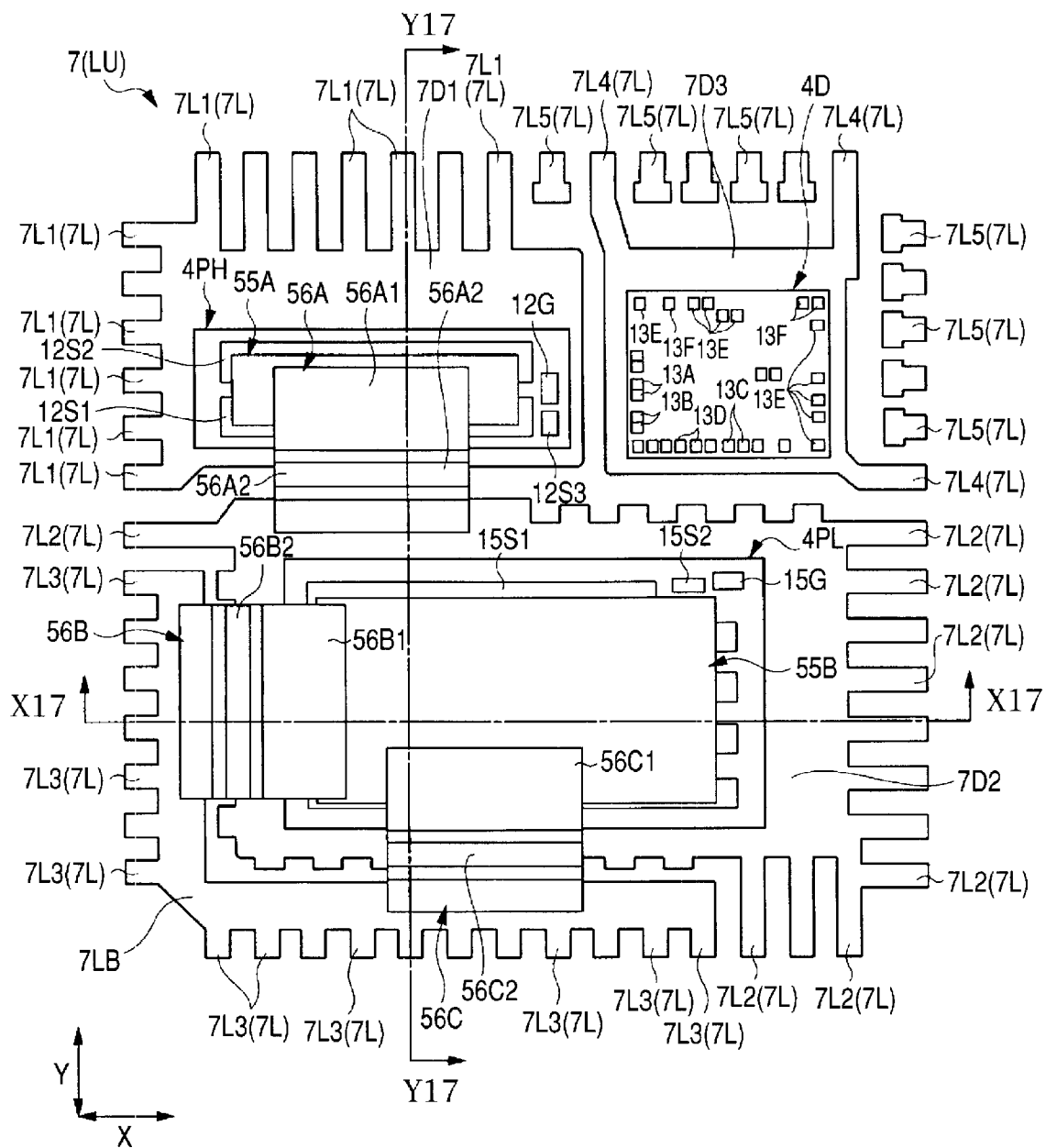
FIG. 88 is an enlarged plan view of one unit region in a lead frame in the manufacturing process for a semiconductor device, following FIG. 85.
Figure 89:
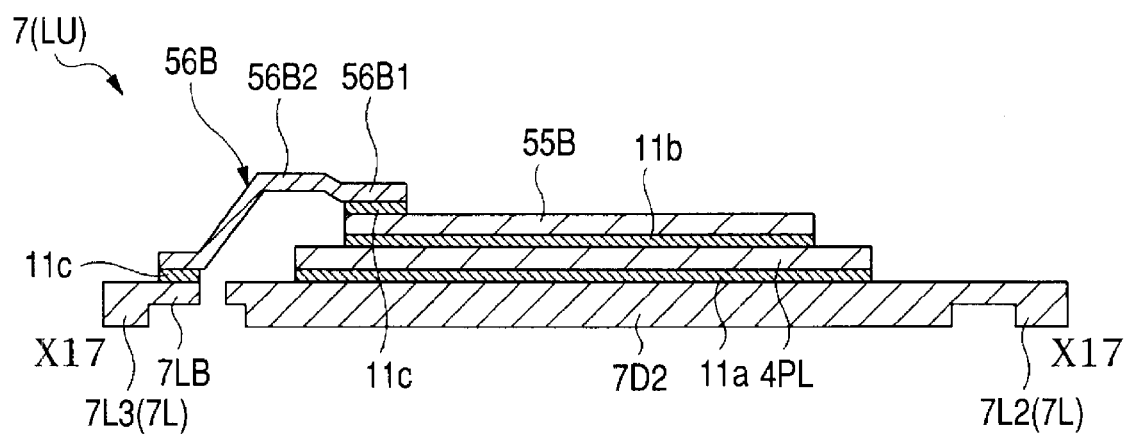
FIG. 89 is a sectional view taken along line X17-X17 of FIG. 88.
Figure 90:
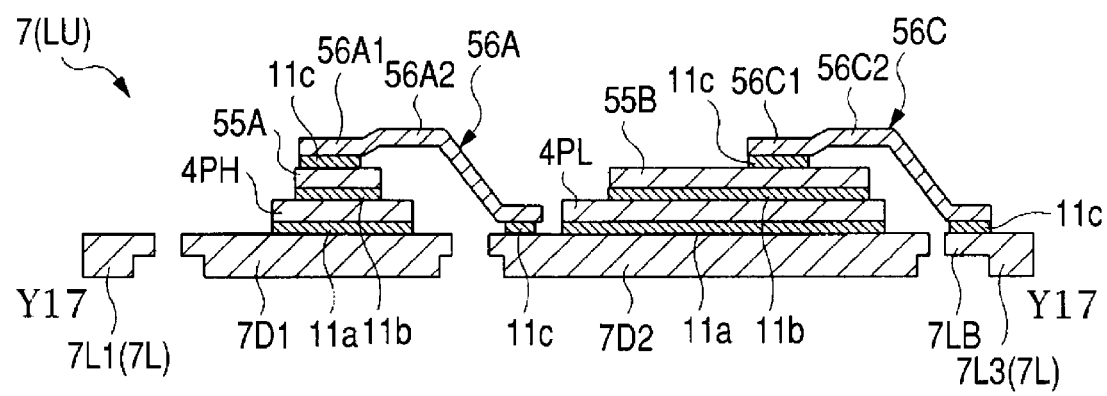
FIG. 90 is a sectional view taken along line Y17-Y17 of FIG. 88.

Subsequently, metal plates 56A, 56B, and 56C are mounted on the metal plates 55A and 55B over the main surfaces of the semiconductor chips 4PH and 4PL in each unit region LU of the lead frame 7 through the above-mentioned bonding layer 11c composed of solder paste, silver paste, or the like as illustrated in FIG. 88 to FIG. 90.

FIG. 88 is an enlarged plan view of one unit region of a lead frame 7 in the manufacturing process for the semiconductor device in the fourteenth embodiment; FIG. 89 is a sectional view taken along line X17-X17 of FIG. 88; and FIG. 90 is a sectional view taken along line Y17-Y17 of FIG. 88.

The metal plate 56A is a member that electrically connects the metal plate 55A and the die pad 7D2. The back surface of an end of the metal plate 56A is bonded to the metal plate 55A through the bonding layer 11c, and the back surface of the other end of the metal plate 56A is bonded to the die pad 7D2 through the bonding layer 11c.

The metal plates 56B and 56C are members that electrically connect the metal plate 55B and the lead wiring 7LB. The back surfaces of one ends of the metal plates 56B and 56C are bonded to the metal plate 55B through the bonding layer 11c, and the back surfaces of the other ends of the metal plates 56B and 56C are bonded to the lead wiring 7LB through the bonding layer 11c.

The two metal plates 56B and 56C on the metal plate 55B side are so disposed that they intersect each other. That is, the metal plate 56B is so disposed that it is extended from a short side of the semiconductor chip 4PL along the direction of the length of the semiconductor chip 4PL, and the metal plate 56C is so disposed that it is extended from a long side of the semiconductor chip 4PL along the direction of the short sides of the semiconductor chip 4PL.

However, the three metal plates 56A to 56C are completely identical in construction. That is, the material of the metal plates 56A to 56C is the same as the material of the above-mentioned metal plates 55A and 55B. The metal plates 56A to 56C are planarly and three-dimensionally identical with one another in outer shape and dimensions (size in the direction of length and in the direction of short sides, thickness).

In the first to thirteenth embodiments, the metal plates 8A and 8B different in outer shape and dimensions must be separately prepared in accordance with the size of the semiconductor chips 4PH and 4PL. In the fourteenth embodiment, the metal plates 56A to 56C can be used in common regardless of the size of the semiconductor chips 4PH and 4PL. This makes it possible to simplify the manufacturing process for the semiconductor device 2 having such a construction that the semiconductor chip 4PH and the die pad 7D2 are connected to each other through a metal plate and the semiconductor chip 4PL and the lead wiring 7LB are connected to each other through a metal plate.

In the fourteenth embodiment, the metal plates 8A and 8B are divided into the metal plates 55A and 55B that are brought into direct contact with the semiconductor chips 4PH and 4PL and the metal plates 56A to 56C that are brought into direct contact with the die pad 7D2 and leads 7L. As a result, the positioning accuracy may be relaxed as compared with the integral metal plates 8A and 8B.

The metal plates 56A, 56B, and 56C integrally include first portions 56A1, 56B1, and 56C1 and second portions 56A2, 56B2, and 56C2.

The first portions 56A1, 56B1, and 56C1 are oblong portions joined with the metal plates 8A and 8B through the conductive bonding layer 11b. On cross section, the first portions 56A1, 56B1, and 56C1 are formed flat so that they are extended along the main surfaces of the semiconductor chips 4PH and 4PL as illustrated in FIG. 89 and FIG. 90.

The second portions 56A2, 56B2, and 56C2 are portions that are extended from the first portions 56A1, 56B1, and 56C1 in respective directions astride sides of the semiconductor chips 4PH and 4PL and partly overlap the die pad 7D2 or the lead wiring 7LB. On cross section, the height of the second portions 56A2, 56B2, and 56C2 are higher than the height of the first portions 56A1, 56B1, and 56C1 between the semiconductor chip PL and the lead wiring 7LB so that they are farther away from the main surface of the semiconductor chip 4PL as illustrated in FIG. 89 and FIG. 90. Thus, the back surfaces of the metal plates 56A2, 56B2, and 56C2 can be set apart from the main surfaces of the semiconductor chips 4PH and 4PL. For this reason, it is possible to make the material of the bonding layer 11c on the back surfaces of the metal plates 56A, 56B, and 56C less prone to leak toward a side face of the semiconductor chips 4PH and 4PL. Therefore, faulty electrical continuity between the main surface (source S) and back surface (drain D) of the semiconductor chip 4PH or 4PL caused by the material of the bonding layer 11c can be reduced.

Hanging portions that support the metal plates 56A to 56C on a frame may be provided on side faces of the uppermost parts of the second portions 56A2, 56B2, and 56C2. Thus, even if chippings are left on a cut surface of a hanging portion, it is possible to reduce or prevent damage to the pads 12S1 and 12S2 and the occurrence of tilting of the metal plates 56A to 56C relative to the die pad 7D2 and the lead wiring 7LB caused by the chippings. This is because the positions of the hanging portions can be made farther away from the pads 12S1 and 12S2, die pad 7D2, or lead wiring 7LB.

Height cited here is defined as the distance from the back surfaces of the die pads 7D1 to 7D3 to a position away from the back surfaces in the direction of the thickness of the package PA. (The direction of the thickness of the package PA is equivalent to the direction perpendicularly intersecting the main surfaces of the semiconductor chips 4PH and 4PL.)

In a process for mounting these metal plates 56A to 56C, the metal plates 56A to 56C may be separately vacuumed and mounted over the metal plates 55A and 55B. Instead, the following method may be adopted as in the twelfth and thirteenth embodiments: the metal plates 56A to 56C are prepared with the same disposition as when they are mounted and vacuumed in a lump, and they are mounted over the metal plates 55A and 55B in a lump with respect to each unit region LU of the lead frame 7. This makes it possible to simplify the process for mounting the metal plates 56A to 55C and shorten a time required for the process as compared with cases where the metal plates 56A to 56C are separately mounted.

In cases where solder paste is used as the bonding layers 11a, 11b, and 11c, the reflow process 111A described in relation to the twelfth embodiment is subsequently carried out, and then the cleaning process 112 is carried out. In cases where silver paste is used as the bonding layers 11a, 11b, and 11c, the curing baking process 111B described in relation to the thirteenth embodiment is carried out.

In this example, the following operation is performed by the reflow process 111A or curing baking process 111B as in the twelfth and thirteenth embodiments: the semiconductor chips 4PH, 4PL, and 4D are bonded to (joined with) the die pads 7D1 to 7D3; the metal plates 55A and 55B are bonded to (joined with) the semiconductor chips 4PH and 4PL; and the metal plates 56A to 56C are bonded to (joined with) the metal plates 55A and 55B, die pad 7D2, and lead wiring 7LB. Thus, a time required for the manufacture of the semiconductor device 2 can be shortened. Further, since heat treatment and the like can be reduced, the reliability and yield of the semiconductor device 2 can be enhanced.

Subsequently, a wire WA is prepared (Process 113), and the pads 13A to 13F on the semiconductor chip 4D and leads 7L of the lead frame 7 are connected with each other through the wire WA in each unit region LU of the lead frame 7 as in the twelfth and thirteenth embodiments (wire bonding process 114).

Figure 91:
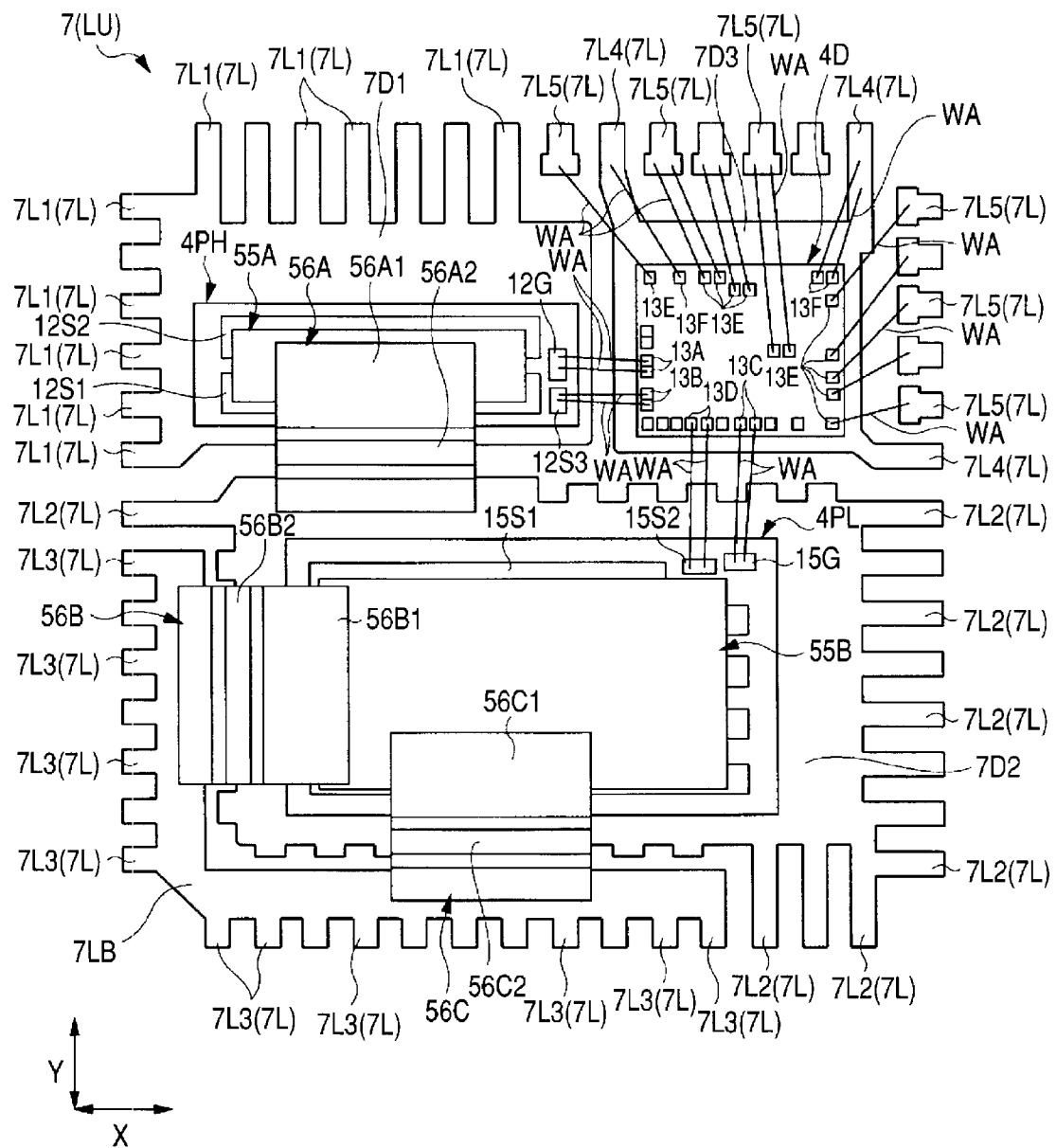
FIG. 91 is an enlarged plan view of a unit region in a lead frame that underwent the wire bonding process for a semiconductor device, following FIG. 88.

FIG. 91 is an enlarged plan view of a unit region LU of a lead frame 7 after wires WA are connected in the fourteenth embodiment. Also, in this case, wires WA are connected after the process 111A or 111B for connecting the metal plates 55A, 55B, and 56A to 56C (after the cleaning process 112). Thus, deformation failure in wires WA caused by contact with the metal plates 55A, 55B, and 56A to 56C can be prevented. When the above-mentioned cleaning is carried out after the metal plates 55A, 55B, and 56A to 56C are connected, wires WA have not been formed. Therefore, stress is not applied to wires WA during the cleaning process 112. For this reason, the reliability and yield of the semiconductor device 2 can be favorably ensured.

Subsequently, resin for package PA formation is prepared as in the twelfth and thirteenth embodiments (Process 115), and then using this resin, the semiconductor chips 4D, 4PH, and 4PL and the metal plates 55A, 55B, and 56A to 56C in multiple unit regions LU of the lead frame 7 are sealed in a lump by transfer molding (molding process 116).

Subsequently, the curing baking process 117, plating process 118, marking process 119, and frame cutting process 120 are carried out, as in the twelfth and thirteenth embodiments, to manufacture the semiconductor device 2.

Figure 92:
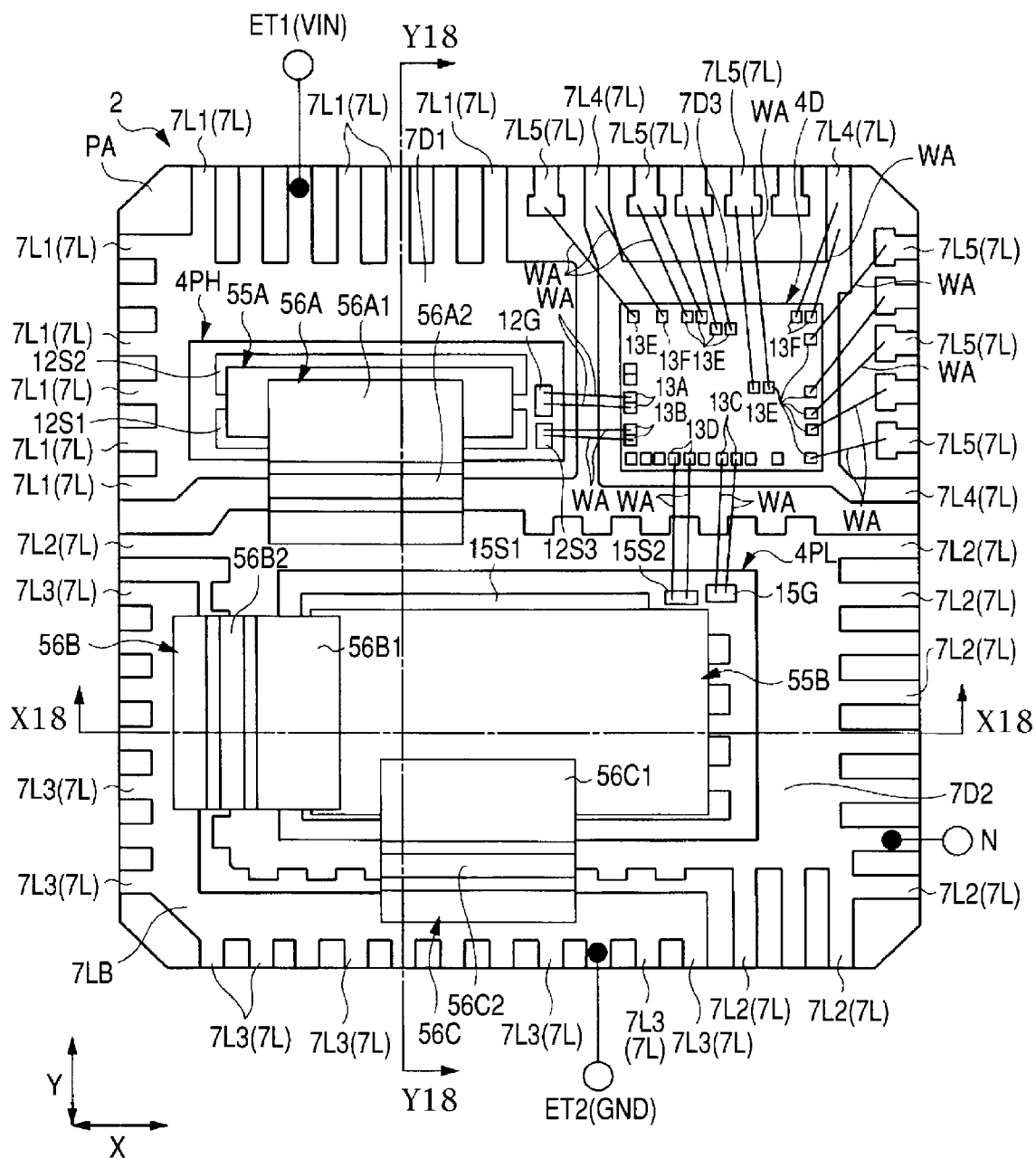
FIG. 92 is an overall plan view showing the interior of the package of a semiconductor device manufactured by the manufacturing method for a semiconductor device to be described with reference to FIG. 85 to FIG. 91 in a see-through manner.
Figure 93:
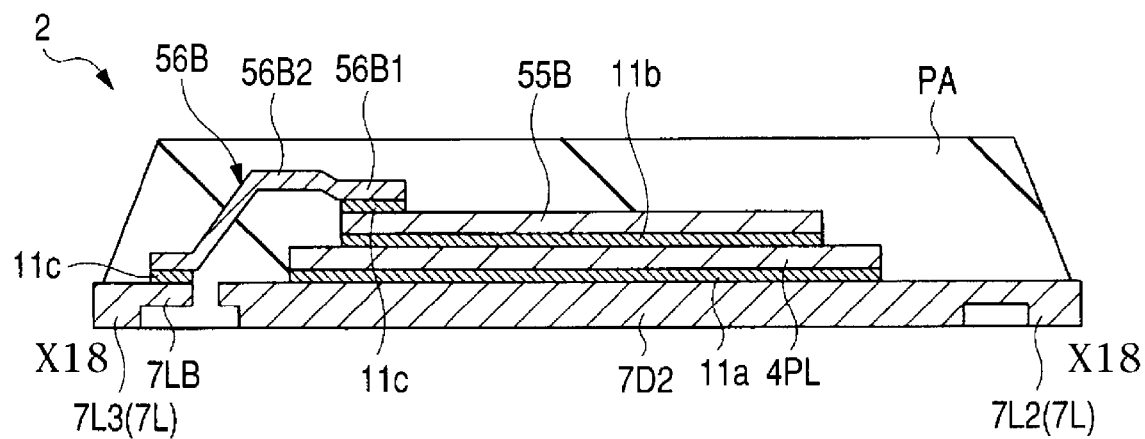
FIG. 93 is a sectional view taken along line X18-X18 of FIG. 92.
Figure 94:
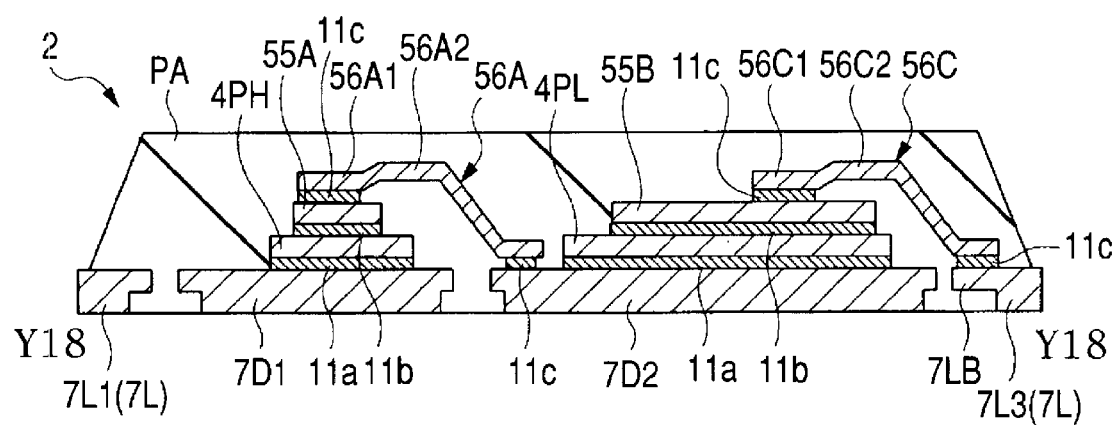
FIG. 94 is a sectional view taken along line Y18-Y18 of FIG. 92.

FIG. 92 is an overall plan view illustrating the interior of the package PA of a semiconductor device 2 in the fourteenth embodiment in a see-through manner; FIG. 93 is a sectional view taken along line X18-X18 of FIG. 92; and FIG. 94 is a sectional view taken along line Y18-Y18 of FIG. 92.

The pads 12S1 and 12S2 for source electrode on the main surface of the semiconductor chip 4PH with the power MOS QH1 for high side formed therein are electrically connected to the die pad 7D2 through the metal plates 55A and 56A.

The pad 15S1 for source electrode on the main surface of the semiconductor chip 4PL with the power MOS QL1 for low side formed therein is electrically connected to the lead wiring 7LB through the metal plates 55B, 56B, and 56C.

The thickness of the metal plates 55A and 55B is thicker than the thickness of the metal plates 56A to 56C. This is because the metal plates 55A and 55B are provided with a function of reducing the aluminum spreading resistance in the pads 12S1, 12S2, and 15S1 for source electrode on the semiconductor chips 4PH and 4PL.

The metal plates 55A and 55B also have a function of setting the metal plates 56A to 56C apart from the main surfaces of the semiconductor chips 4PH and 4PL by a distance equivalent to the thickness of the metal plates 55A and 55B. This makes it possible to locate the back surfaces of the metal plates 56A, 56B, and 56C away from the main surfaces and side faces of the semiconductor chips 4PH and 4PL. Therefore, it is possible to make the material of the bonding layer 11c on the back surfaces of the metal plates 56A, 56B, and 56C less prone to leak toward a side face of the semiconductor chips 4PH and 4PL. For this reason, faulty electrical continuity between the main surface (source S) and back surface (drain D) of the semiconductor chip 4PH or 4PL caused by the material of the bonding layer 11c can be reduced.

As for the other respects, this embodiment is identical with the eleventh embodiment. Also, in the fourteenth embodiment, the construction described in relation to the first to eleventh embodiments may be adopted.

For example, the disposition of the gate finger portions 19G3 in the semiconductor chip 4PL may be in vertically long shape (shape long in the direction of the short sides of the semiconductor chip 4PL) as described in relation to the first embodiment.

The metal plates 55A, 55B, and 56A to 56C may be provided with a hole that penetrates them from their main surface to their back surface from the viewpoint of stress relaxation. In this case, the shape of the hole may be any of those described in relation to the second to sixth embodiments and the like.

The above-mentioned indentation 45 may be formed on the periphery of the metal plates 55A and 55B or on the periphery of the first portions 56A1, 56B1, and 56C1 of the metal plates 56A to 56C as described in relation to the second embodiment and the like from the viewpoint of stress relaxation.

The above-mentioned indentation 50 may be formed on the periphery of the semiconductor chips 4PL and 4PH as described in relation to the seventh embodiment from the viewpoint of stress relaxation.

The second portions 56A2, 56B2, and 56C2 of the metal plates 56A to 56C may be provided with the above-mentioned slits 46 to divide them into multiple sections as described in relation to the second and eighth embodiments and the like from the viewpoint of stress relaxation.

The above-mentioned protrusion 53 may be provided on the back surfaces (surfaces opposed to the main surfaces of the semiconductor chips 4PH and 4PL) of the metal plates 55A and 55B and the back surfaces (surfaces opposed to the metal plates 55A and 55B) of the metal plates 56A to 56C as described in relation to the ninth embodiment.

A schottky barrier diode SBD may be provided in the semiconductor chip 4PL as described in relation to the tenth embodiment.

Fifteenth Embodiment

Figure 95:
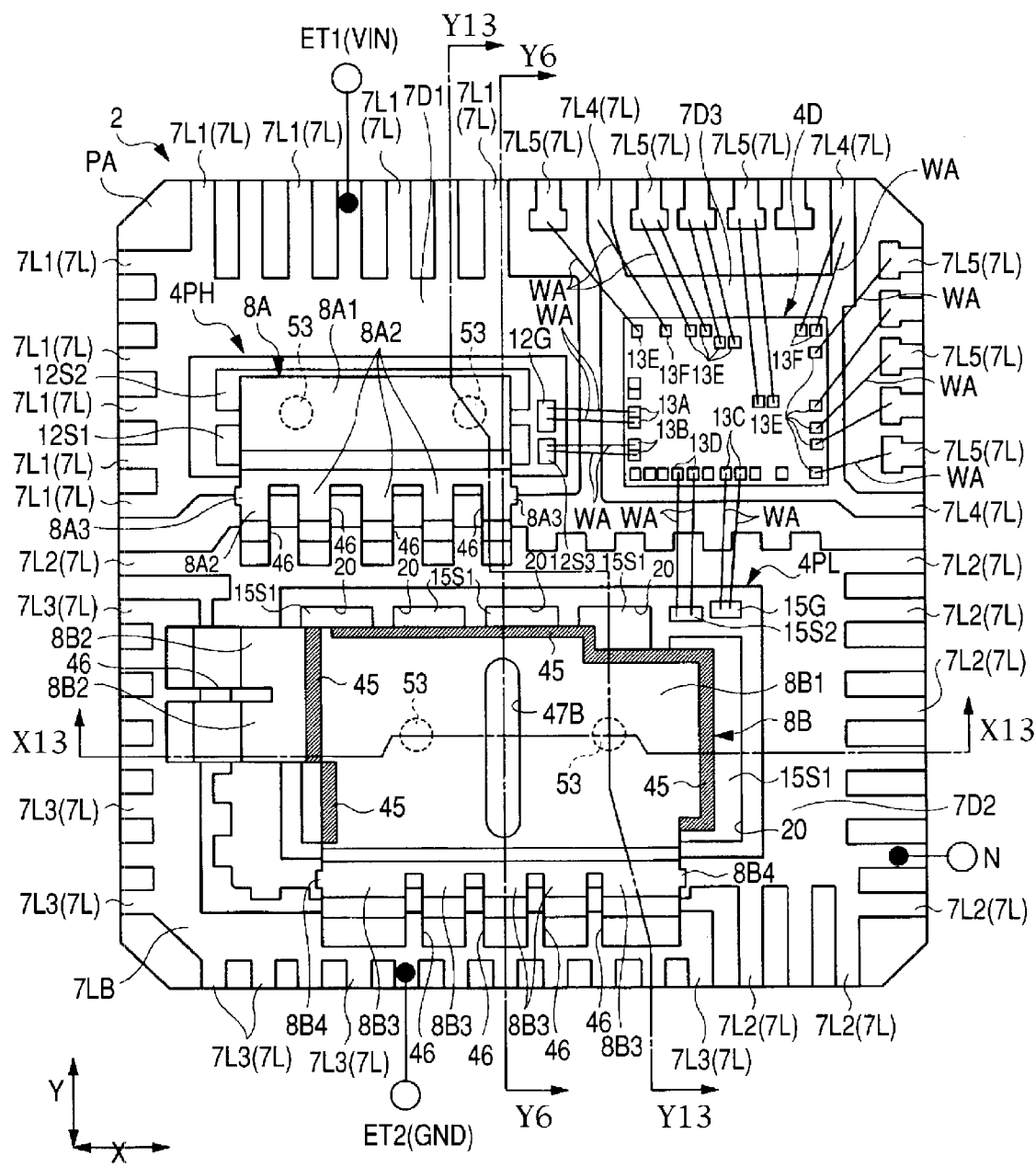
FIG. 95 is an overall plan view showing the interior of the package in another example of the semiconductor device in FIG. 64 in a see-through manner.
Figure 96:
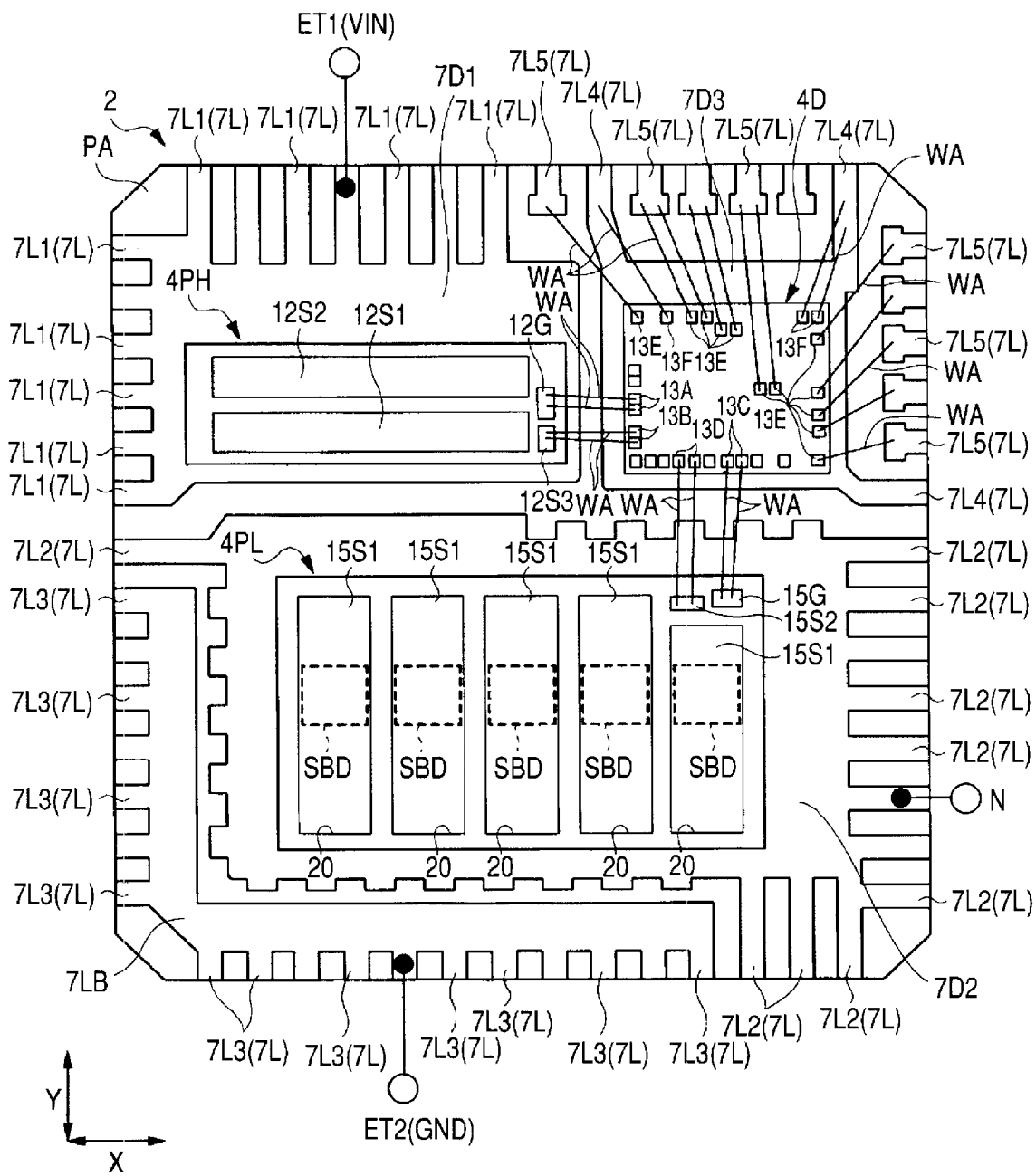
FIG. 96 is an overall plan view showing the interior of the package in FIG. 95 with metal plates removed in a see-through manner.
Figure 97:
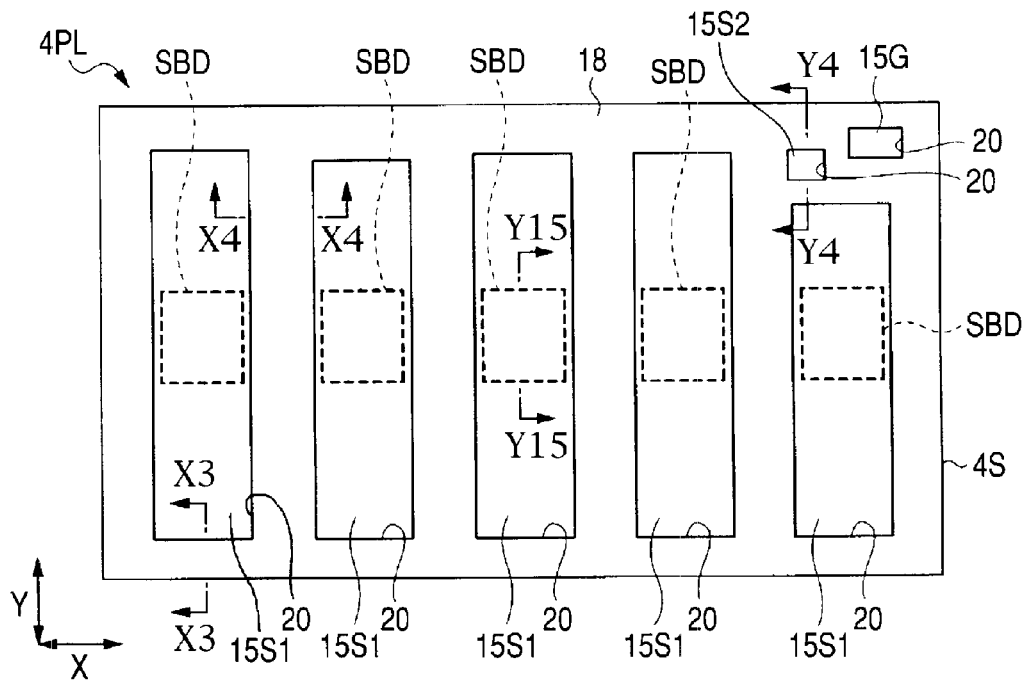
FIG. 97 is an overall plan view showing the uppermost layer of the semiconductor chip where a power transistor for low-side switch is formed, in the semiconductor device in FIG. 95.
Figure 98:
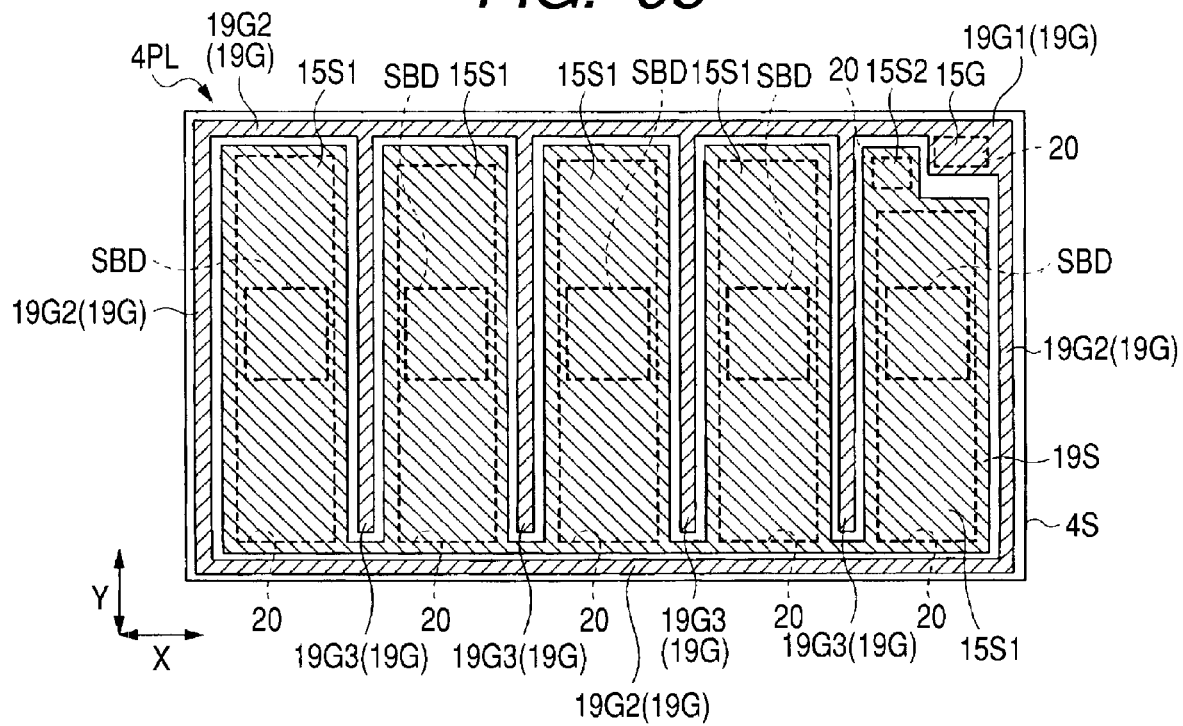
FIG. 98 is an overall plan view showing the uppermost wiring layer of the semiconductor chip in FIG. 97 where a power transistor for low-side switch is formed.

FIG. 95 is an overall plan view illustrating the interior of the package PA in another example of the semiconductor device 2 in FIG. 64 in a see-through manner; FIG. 96 is an overall plan view illustrating the interior of the package PA in FIG. 95 with the metal plates 8A and 8B removed in a see-through manner; FIG. 97 is an overall plan view illustrating the uppermost layer of the semiconductor chip 4PL in the semiconductor device 2 in FIG. 95; and FIG. 98 is an overall plan view illustrating the uppermost wiring layer of the semiconductor chip 4PL in FIG. 97.

A sectional view taken along line Y6-Y6 of FIG. 95 is identical with FIG. 38. A sectional view taken along line X13-X13 of FIG. 95 is identical with FIG. 61. A sectional view taken along line Y13-Y13 of FIG. 95 is identical with FIG. 62.

A sectional view taken along line X4-X4 of FIG. 97 is identical with FIG. 17. A sectional view taken along line Y3-Y3 of FIG. 97 is identical with FIG. 16. A sectional view taken along line Y4-Y4 of FIG. 97 is identical with FIG. 19 and FIG. 20. A sectional view taken along line Y15-Y15 of FIG. 97 is identical with FIG. 70. The gate electrode layer of the semiconductor chip 4PL in FIG. 97 is identical with that in FIG. 69, and the description thereof will be omitted.

The outer shape of the metal plate 8A is the same as described in relation to the eighth embodiment with reference to FIG. 59. On the back surface (surface opposed to the main surface of the semiconductor chip 4PH) of the metal plate 8A, there is formed the same protrusion 53 as described in relation to the ninth embodiment with reference to FIG. 60 to FIG. 63.

The metal plate 8B is the same as described in relation to the ninth embodiment with reference to FIG. 60 to FIG. 62 and the like.

A difference between the fifteenth embodiment and other embodiments is that the pad 15S1 in the uppermost layer of the semiconductor chip 4PL with the power MOS QL1 for low side formed therein is divided into multiple sections (five sections in this example) as illustrated in FIG. 96.

Each pad 15S1 is formed in oblong shape so that its length in the direction of the short sides of the semiconductor chip 4PL is longer than its length in the direction of the length of the semiconductor chip 4PL. The pads 15S1 are disposed in line along the direction of the length of the semiconductor chip 4PL. Over the surface of each pad 15S1, there is formed the metal layer 21 as in the foregoing.

However, the individual pads 15S1 are separated from one another in the uppermost layer by the protective film 18, but they are integrally connected with one another by the source wiring 19S in the uppermost wiring layer as illustrated in FIG. 98 as in the first to tenth embodiments.

That is, also, in the fifteenth embodiment, the disposition itself of the gate finger portions 19G3 is the same as in the first to tenth embodiments, and it does not separate the source wiring 19S into multiple sections. One ends of the gate finger portions 19G3 are integrally connected to the gate finger portion 19G2 on one long side (long side on the side where the pad 15G is disposed) of the semiconductor chip 4PL. However, the other ends (tips) of the gate finger portions 19G3 are not connected to the gate finger portion 19G2 on the other long side of the semiconductor chip 4PL, and they are terminated in positions at a distance from the gate finger portion 19G2. For this reason, the source wiring 19S is formed in comb-like planar shape as in the first to tenth embodiments.

With the construction in which the metal plate 8B is used, however, the aluminum spreading resistance of the source wiring 19S can be reduced as mentioned above. Further, it is unnecessary to dispose a pad for wire connection in proximity to the periphery of the semiconductor chip 4PL.

In the fifteenth embodiment, consequently, the pad 15S1 for source of the semiconductor chip 4PL is divided into multiple sections, and the tip of each gate finger portion 19G3 is made close to the gate finger portion 19G2 present on the line extended from the tip as much as possible.

That is, in the fifteenth embodiment, the position where each gate finger portion 19G3 in the semiconductor chip 4PL on the low side is located farther away than in the first to tenth embodiments. Therefore, the length of each gate finger portion 19G3 can be made longer than in the first to tenth embodiments.

For this reason, the gate resistance of the power MOS QL1 for low side in the semiconductor chip 4PL can be reduced, and thus the switching speed can be enhanced. Therefore, it is possible to accommodate to increase in the current and frequency of the non-isolated DC-DC converter 1.

Up to this point, concrete description has been given to the invention made by the present inventors based on embodiments. However, the invention is not limited to the above-mentioned embodiments, and can be variously modified without departing from its scope, needless to add.

Some examples will be given. The description of the first to fifteenth embodiments has been given to cases where the trench gate power MOS structure is adopted. The invention is not limited to this, and a planar power MOS may be used. In this case, a gate electrode is disposed over the main surface of a substrate through a gate insulating film. A channel is formed in a portion of the main surface of the substrate to which the gate electrode is opposed. That is, an operating current has a portion that flows along the main surface (surface perpendicular to the direction of the thickness of the substrate) of the substrate.

The description of the first to fifteenth embodiments has been given to cases where one semiconductor device 2 is connected to one load LD. The invention is not limited to this construction, and there are, for example, cases where multiple semiconductor devices 2 are connected in parallel with one load LD. In such a circuit system, the input power supply potential Vin, reference potential GND, and control circuit 3 are shared among the multiple semiconductor devices 2. In cases where the power MOSs QH1 and QL1 and the driver circuits DR1 and DR2 are separately packaged in such a circuit system, the downsizing of the entire system is hindered. With the constructions described in relation to the above embodiments, meanwhile, the power MOSs QH1 and QL1 and the driver circuits DR1 and DR2 are housed in one and the same package PA, and the entire system can be reduced in size.

The description of the eleventh embodiment and the like has been given to cases where the pad 15S1 on the main surface of the semiconductor chip 4PL on the low side is formed in comb shape. The invention is not limited to this construction, and the pad 15S1 in the uppermost layer may be divided into multiple sections as in the fifteenth embodiment (for the same reason as in the fifteenth embodiment). In this case, each of the multiple pads 15S1 is formed in oblong shape so that it is long along the direction of the length of the semiconductor chip 4PL, and the pads 15S1 are disposed in line along the direction of the short sides of the semiconductor chip 4PL so that their long sides are parallel with one another.

Also, in this case, however, the individual pads 15S1 are separated by the protective film 18 in the uppermost layer, but they are integrally connected with one another by the source wiring 19S in the uppermost wiring layer as in the fifteenth embodiment. With this construction, the length of each gate finger portion 19G3 in the semiconductor chip 4PL on the low side can be made longer than in the eleventh embodiment. For this reason, the gate resistance of the power MOS QL1 for low side in the semiconductor chip 4PL can be further reduced, and thus the switching speed can be further enhanced. Therefore, it is possible to accommodate to increase in the current and frequency of the non-isolated DC-DC converter 1.

The above description has been given mainly to cases where the invention made by the present inventors is applied to the power supply circuit of electronic equipment, such as desktop personal computer, notebook personal computer, and game machine, which is a field of utilization underlying the invention. However, the invention is not limited to this, and is applicable to various other fields of utilization. For example, the invention can be applied to a DC-DC converter used in network power supply systems.

The invention is applicable to the manufacturing industry for semiconductor devices.

What is claimed is:

1. A semiconductor device including a DC-DC converter, comprising:
    a first die pad having a top surface and a bottom surface opposite each other, and a first lead used for inputting to the DC-DC converter;
    a second die pad having a top surface and a bottom surface opposite each other, and a second lead used for outputting of the DC-DC converter;
    a third die pad having a top surface and a bottom surface opposite each other, and a third lead;
    fourth leads used for supplying ground potential to the DC-DC converter;
    a first semiconductor chip disposed over the top surface of the first die pad,
        the first semiconductor chip including a high side MOSFET of the DC-DC converter,
        the first semiconductor chip having a first gate electrode pad, a first source electrode pad, and a first drain electrode,
        the first drain electrode being coupled to the first die pad;
    a second semiconductor chip disposed over the top surface of the second die pad,
        the second semiconductor chip including a low side MOSFET of the DC-DC converter,
        the second semiconductor chip having a second gate electrode pad, a second source electrode pad and a second drain electrode;
    a third semiconductor chip disposed over the top surface of the third die pad,
        the third semiconductor chip including a first driver circuit for driving the high side MOSFET and a second driver circuit for driving the low side MOSFET;
    a resin body covering the first, second, and third semiconductor chips,
        the resin body having a pair of first side surfaces opposite each other, a pair of second side surfaces opposite each other, and a top surface and a bottom surface opposite each other,
        the top and bottom surfaces intersecting the first and second pairs of side surfaces,
        the bottom surfaces of the first, second and third die pads being exposed from the bottom surface of the resin body,
    a first metal plate coupled to the first source electrode pad of the first semiconductor chip and the second die pad; and
    a second metal plate having a top surface and a bottom surface opposite each other and coupled to the second source electrode pad of the second semiconductor chip and the fourth leads,
        the bottom surface of the second metal plate facing toward the second semiconductor chip,
    wherein the second metal plate has an opening which penetrates the second metal plate from the top surface to the bottom surface thereof.

2. The semiconductor device according to claim 1, wherein the second metal plate has another opening.

3. The semiconductor device according to claim 1,
    wherein the second semiconductor chip has a rectangular shape in plan view, with a pair of long sides and a pair of short sides,
    wherein one of the fourth leads is exposed from one of the pair of the first side surfaces of the resin body, and another one of the fourth leads is exposed from one of the pair of the second side surfaces of the resin body,
    wherein the second metal plate is comprised of a first portion, a second portion and a third portion,
    wherein the first portion of the second metal plate is disposed over the second source electrode pad of the second semiconductor chip,
    wherein the second portion of the second metal plate is disposed so as to overlap one of the short sides of the second semiconductor chip in plan view and electrically and mechanically coupled to said one of the fourth leads, and
    wherein the third portion of the second metal plate is disposed so as to overlap one of the long sides of the second semiconductor chip in plan view and electrically and mechanically couple to said another one of the fourth leads.

4. The semiconductor device according to claim 1,
    wherein the second semiconductor chip has four corners, and
    wherein the four corners are exposed from the second metal plate.

5. The semiconductor device according to claim 1,
    wherein the third semiconductor chip has a first pad and a second pad,
    wherein the first pad of the third semiconductor chip and the first gate electrode pad of the first semiconductor chip are electrically connected via a first bonding wire, and
    wherein the second pad of the third semiconductor chip and the second gate electrode pad of the second semiconductor chip are electrically connected via a second bonding wire.

6. The semiconductor device according to claim 5,
    wherein widths of the first and second metal plates is larger than diameters of the first and second bonding wires.

7. The semiconductor device according to claim 1,
    wherein the first semiconductor chip has a rectangular shape in plan view, with a pair of long sides and a pair of short sides, and
    wherein the first metal plate is overlapped with one of the long sides of the first semiconductor chip.

8. The semiconductor device according to claim 1, wherein the first and second metal plates include copper.

* * * * *